United States Patent
Soutome et al.

(10) Patent No.: US 9,274,189 B2
(45) Date of Patent: Mar. 1, 2016

(54) HIGH-FREQUENCY COIL UNIT AND MAGNETIC RESONANCE IMAGING DEVICE

(75) Inventors: Yoshihisa Soutome, Tokyo (JP); Hideta Habara, Musashino (JP); Yoshitaka Bito, Kokubunji (JP); Hiroyuki Takeuchi, Kashiwa (JP); Tetsuhiko Takahashi, Tokyo (JP); Hisaaki Ochi, Kodaira (JP)

(73) Assignee: HITACHI MEDICAL CORPORATION, Tokyo (JP)

( * ) Notice: Subject to any disclaimer, the term of this patent is extended or adjusted under 35 U.S.C. 154(b) by 793 days.

(21) Appl. No.: 13/512,090

(22) PCT Filed: Nov. 29, 2010

(86) PCT No.: PCT/JP2010/071256
§ 371 (c)(1),
(2), (4) Date: May 25, 2012

(87) PCT Pub. No.: WO2011/065532
PCT Pub. Date: Jun. 3, 2011

(65) Prior Publication Data
US 2012/0262173 A1      Oct. 18, 2012

(30) Foreign Application Priority Data

Nov. 30, 2009   (JP) ................................ 2009-271861

(51) Int. Cl.
*G01R 33/34*    (2006.01)
*G01R 33/48*    (2006.01)
(Continued)

(52) U.S. Cl.
CPC ...... *G01R 33/34046* (2013.01); *G01R 33/3453* (2013.01); *G01R 33/34076* (2013.01); *G01R 33/3678* (2013.01); *G01R 33/34053* (2013.01); *G01R 33/3657* (2013.01)

(58) Field of Classification Search
CPC .................. G01R 33/3657; G01R 33/34053; G01R 33/34076; G01R 33/3678; G01R 33/3453; G01R 33/34046; G01R 33/34007; G01R 33/34061; G01R 33/341; G01R 33/34; G01R 33/365; G01R 33/422
USPC .................................. 324/307, 309, 318, 322
See application file for complete search history.

(56) References Cited

U.S. PATENT DOCUMENTS 4,916,418 A  *  4/1990   Rath ................... G01R 33/3635
                                                              324/318
5,543,711 A      8/1996   Srinivasan et al.
(Continued)

FOREIGN PATENT DOCUMENTS

JP          03-131235 A         6/1991
JP          06-242202 A         9/1994
(Continued)

OTHER PUBLICATIONS

English translation of JP 3095402 B2.*
(Continued)

*Primary Examiner* — Melissa Koval
*Assistant Examiner* — Rishi Patel
(74) *Attorney, Agent, or Firm* — Mattingly & Malur, PC

(57) ABSTRACT

There is provided a technique for securing a large examination space in a tunnel type MRI device without inviting increase of manufacturing cost and without significantly reducing irradiation efficiency or uniformity of the irradiation intensity distribution in an imaging region. Between rungs of a partially cylindrical RF coil, which coil corresponds to a cylindrical RF coil of which part is removed, there are disposed half-loops generating magnetic fields, which are synthesized with magnetic fields generated by loops constituted by adjacent rungs of the partially cylindrical RF coil and rings connecting the rungs to generate a circularly polarized or elliptically polarized magnetic field. Further, high-frequency signals of the same reference frequency having a desired amplitude ratio and phase difference are supplied to the partially cylindrical RF coils and half-loops.

4 Claims, 32 Drawing Sheets

(51) Int. Cl.
*G01R 33/345* (2006.01)
*G01R 33/36* (2006.01)

(56) References Cited

U.S. PATENT DOCUMENTS

| | | | |
|---|---|---|---|
| 5,951,474 A | 9/1999 | Matsunaga et al. | |
| 7,088,100 B2* | 8/2006 | Boskamp et al. | 324/318 |
| 7,508,212 B2* | 3/2009 | Fain et al. | 324/318 |
| 7,714,581 B2* | 5/2010 | Erickson et al. | 324/322 |
| 2003/0016109 A1 | 1/2003 | Schulz et al. | |
| 2003/0184298 A1* | 10/2003 | Heid | G01R 33/34046 324/318 |
| 2006/0012369 A1* | 1/2006 | Neufeld | G01R 33/343 324/318 |
| 2006/0267586 A1 | 11/2006 | Okamoto et al. | |
| 2007/0285096 A1 | 12/2007 | Soutome et al. | |
| 2008/0157772 A1 | 7/2008 | Okamoto et al. | |
| 2010/0244838 A1 | 9/2010 | Okamoto et al. | |
| 2011/0175616 A1* | 7/2011 | Ochi | G01R 33/34076 324/318 |

FOREIGN PATENT DOCUMENTS

| | | |
|---|---|---|
| JP | 09-289981 A | 11/1997 |
| JP | 3095402 B2 * | 10/2000 |
| JP | 2002-369808 A | 12/2002 |
| JP | 2006-141444 A | 6/2006 |
| JP | 2007-325826 A | 12/2007 |

OTHER PUBLICATIONS

Vaughan et al.; "High Frequency Volume Coils for Clinical NMR Imaging and Spectroscopy", Magnetic Resonance in Medicine, 1994; pp. 206-218; vol. 32.

Chen et al.; "Quadrature Detection Coils—A Further √2 Improvement in Sensitivity"; Journal of Magnetic Resonance; 1983; pp. 308-327; vol. 54.

Glover et al.; "Comparison of Linear and Circular Polarization for Magnetic Resonance Imaging"; Journal of Magnetic Resonance; 1985; pp. 255-270; vol. 64.

Jin et al.; "Analysis of Open Coils Including Shielding Effects for MRI Applications"; Book of Abstracts SMRM 12th Annual Meeting and Exhibition; 1993; p. 1354.

* cited by examiner

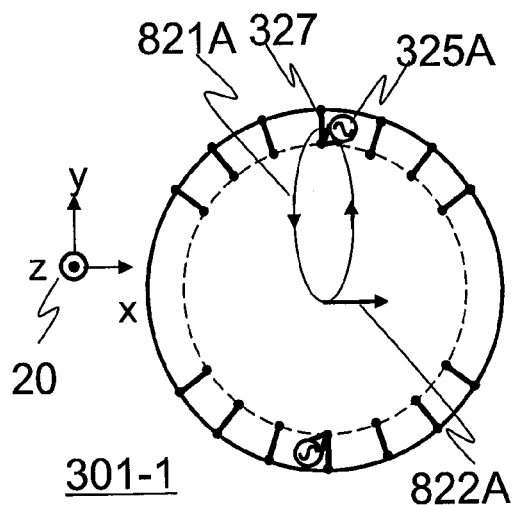
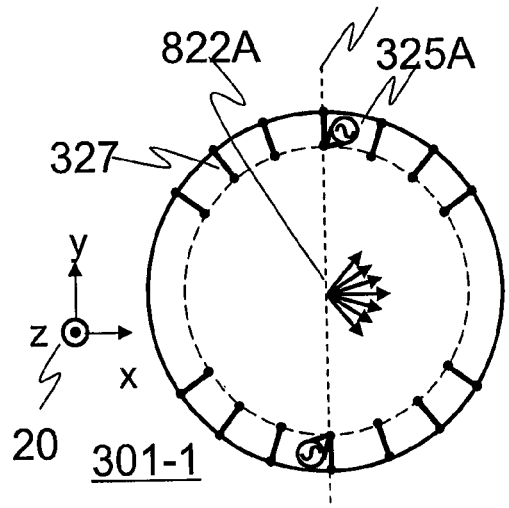
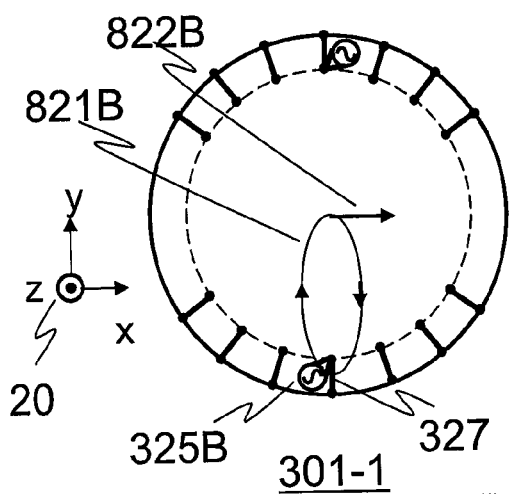
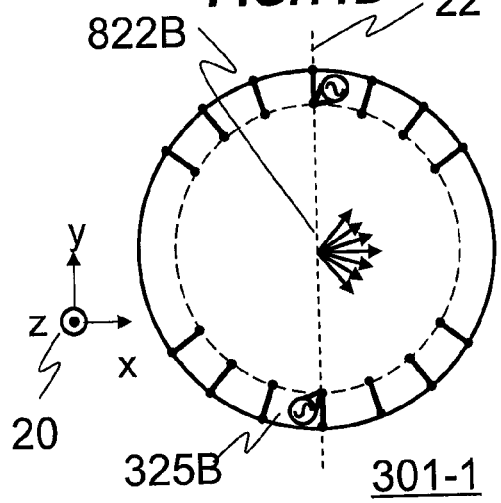
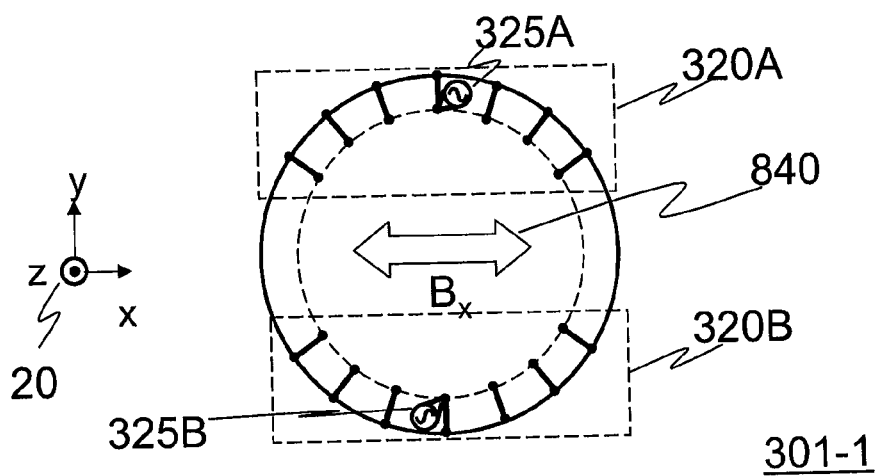

FIG.14A
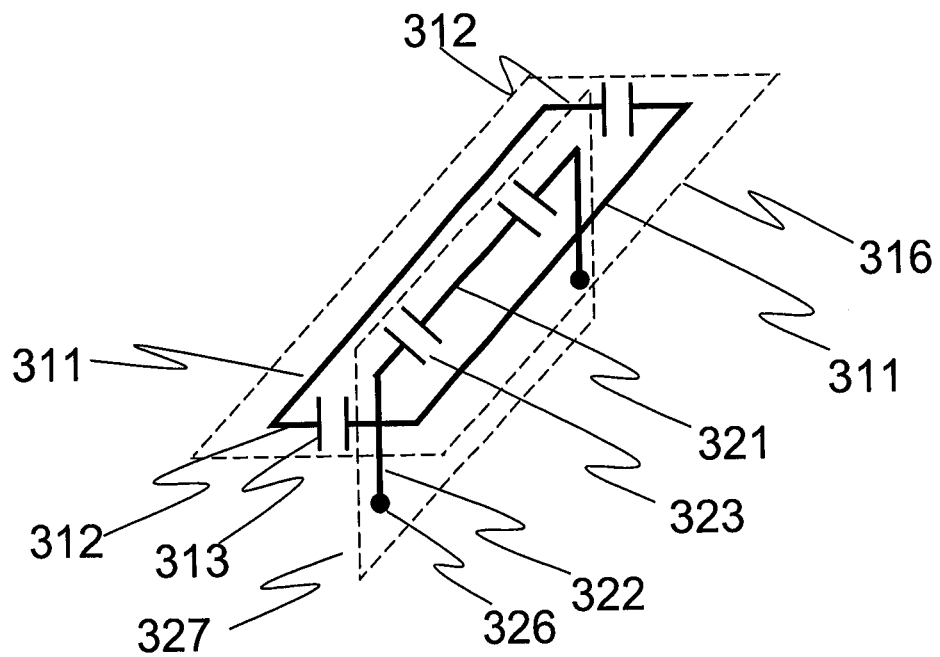
FIG.14B
FIG.14C
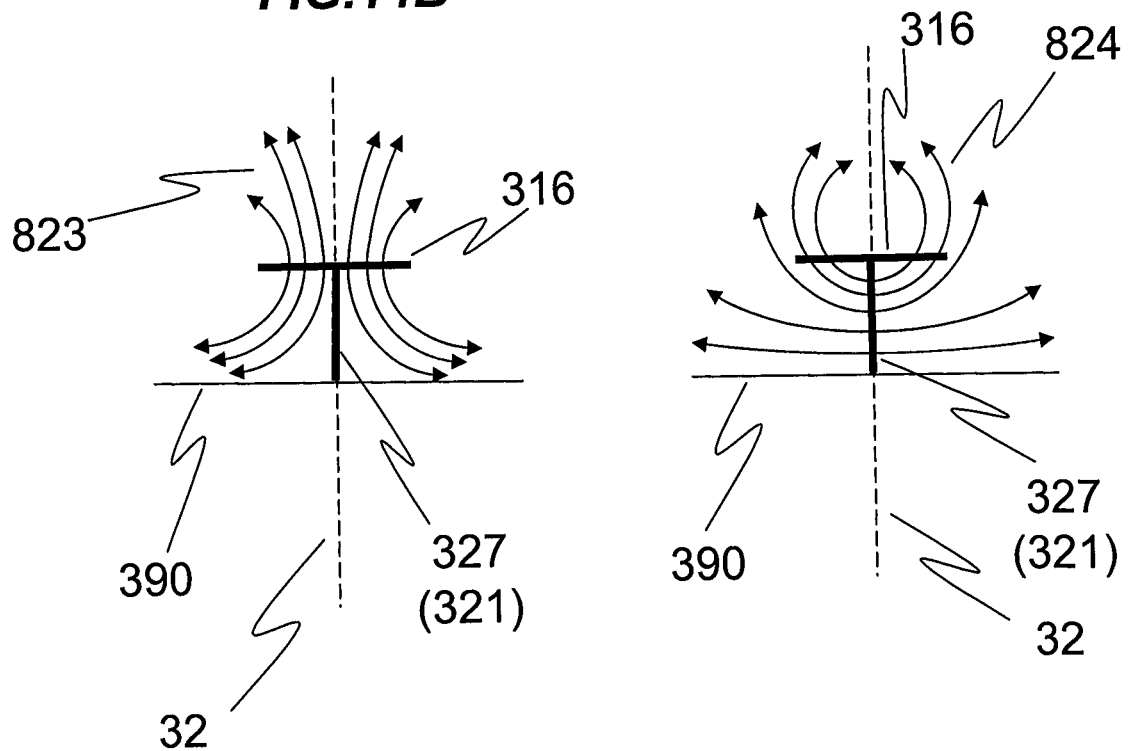

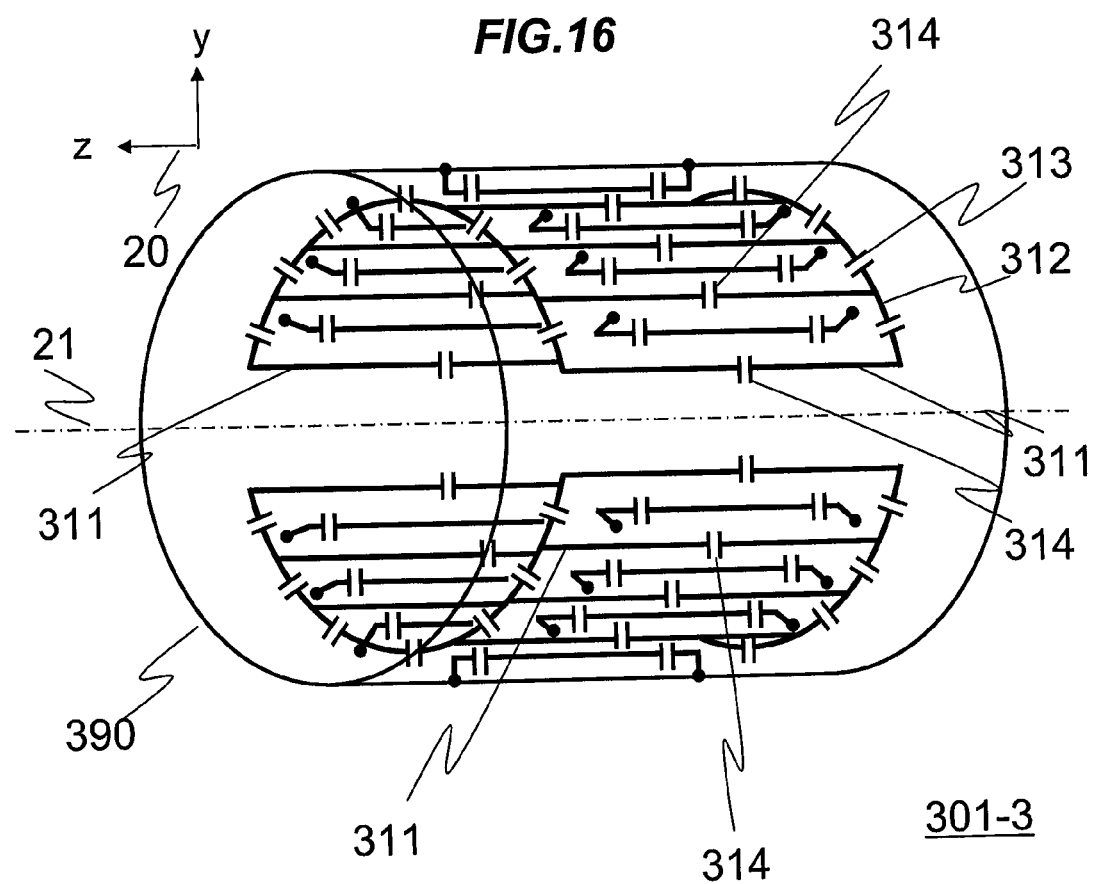

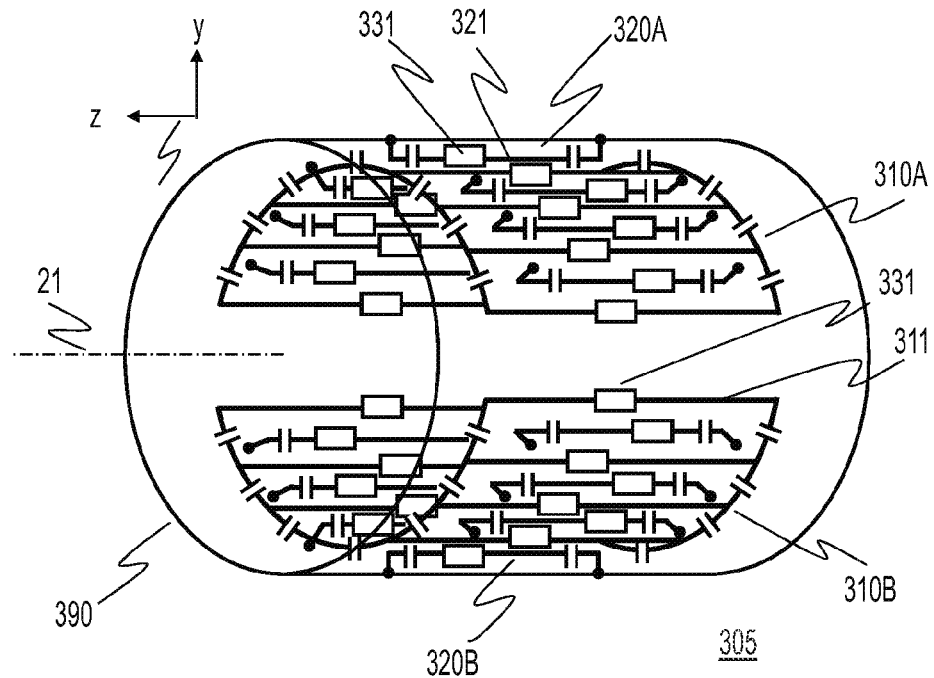
FIG. 23A
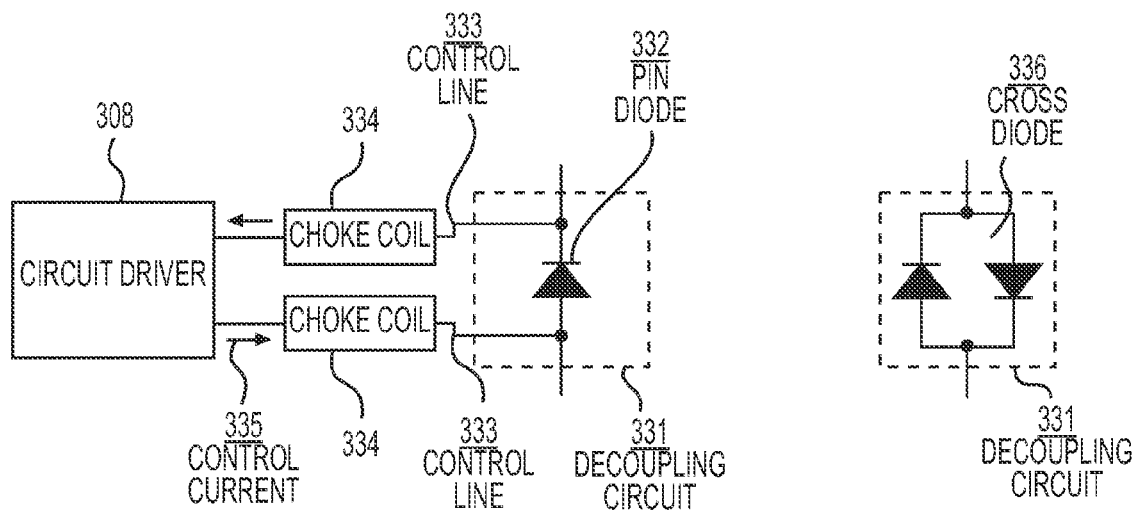
FIG. 23B
FIG. 23C

HIGH-FREQUENCY COIL UNIT AND MAGNETIC RESONANCE IMAGING DEVICE

TECHNICAL FIELD

The present invention relates to a magnetic resonance imaging (MRI) device and a high-frequency coil for irradiating electromagnetic waves and detecting magnetic resonance signals.

BACKGROUND ART

An MRI device is a medical diagnostic imaging apparatus, which induces magnetic resonance in nuclear spins in an arbitrary section of a test subject, and provides a tomogram for the section from generated magnetic resonance signals. When a high-frequency magnetic field is irradiated on a test subject rested in a static magnetic field with a high-frequency coil (RF coil) with applying a gradient magnetic field, nuclear spins of atomic nuclei in the test subject, for example, hydrogen nuclei, are excited, and when the excited nuclear spins return to the equilibrated state, circularly polarized magnetic fields are generated as magnetic resonance signals. These signals are detected with an RF coil and subjected to signal processing to visualize hydrogen nucleus distribution in the living body.

As such an RF coil, there are transmit coil only for irradiating high-frequency magnetic fields, a receive coil only for receiving magnetic resonance signals, and a transceive coil that serves as both the coils. In order to efficiently obtain high quality images, various coils have been developed for each type of coil. For example, when nuclear spins are excited in a test subject, uniform irradiation intensity distribution is required. As for the degree of the uniformity, it is desirable that irradiation intensity in a region to be imaged is 70% or more of the maximum intensity in the irradiation intensity distribution of the region. This is because, if non-uniformity of irradiation intensity is significant, excited states of nuclear spins differ depending on sites in the test subject, and therefore non-uniformity of contrast and artifacts are induced in the obtained image. As RF coils showing such uniform irradiation intensity distribution, there are known cylindrical RF coils such as birdcage coils (refer to, for example, Patent document 1) and TEM coils (refer to, for example, Non-patent document 1).

Moreover, it is also necessary to improve irradiation efficiency. As a technique for improving the irradiation efficiency, there is the QD (Quadrature Detection) method (refer to, for example, Patent document 2, Non-patent documents 2 and 3). The QD method is a method of irradiating high-frequency magnetic fields by using two RF coils that irradiate high-frequency magnetic fields of which directions are perpendicular to each other so that phase difference of time phases of the high-frequency magnetic fields irradiated by the RF coils is 90 degrees. Since circularly polarized magnetic fields for exciting nuclear spins of hydrogen atoms can be highly efficiently irradiated by using the QD method, the irradiation intensity is theoretically improved √2 times compared with irradiation with one RF coil. Moreover, electric power is halved in terms of irradiation electric power, and therefore irradiation efficiency is improved twice. In the case of a birdcage coil or TEM coil (henceforth called cylindrical RF coil), by disposing two electric feeding ports used for irradiation at such positions that they intersect orthogonally to each other, high-frequency magnetic fields can be irradiated with one coil according to the QD method.

A cylindrical RF coil is generally used for a cylindrical (tunnel type) MRI device. Since such a tunnel type MRI device has a tunnel having a small diameter and a long length, it imposes much stress on a fat person or claustrophobic person. In order to eliminate this problem, there is desired an MRI device having a large examination space, i.e., a short tunnel of a large diameter, and thus giving superior spaciousness. Moreover, in recent years, detailed examination or treatment may be performed by disposing a contrast medium injector or a nonmagnetic treatment apparatus in the inside of an MRI device. Therefore, also in order to secure an installing space for installing various instruments near a test subject, there is desired an MRI device having a large examination space.

The tunnel type MRI device has a structure that a static magnetic field magnet, a gradient magnetic field coil, an RF shield, and an RF coil are successively disposed from the outside to the inside of the tunnel. The space inside the RF coil is the examination space in which a test subject is placed. Therefore, in order to make the examination space into which the test subject is entered larger, the internal diameter of the static magnetic field magnet located at the outermost position can be made larger. However, increase of the size of the static magnetic field magnet invites significant increase of the manufacturing cost.

There is generally required a space of 10 to 40 mm between the RF shield and the RF coil. For example, it may also be contemplated to make the examination space larger by making this distance smaller. However, if the RF shield and the RF coil are closely disposed, high-frequency eddy currents that cancel the magnetic fields to degrade the magnetic field generating efficiency are increased, and the high-frequency magnetic field distribution is suddenly changed near the RF coil to make non-uniformity of the irradiation intensity distribution of the high-frequency magnetic field in the imaging region more significant.

It is also contemplated to remove a part of coil conductors of the RF coil to enlarge the examination space. As an example of such a scheme, there is a semicylindrical birdcage coil, which corresponds to a cylindrical RF coil a part of which is removed (refer to, for example, Non-patent document 4).

PRIOR ART REFERENCES

Patent documents

Patent document 1: U.S. Pat. No. 4,916,418
Patent document 2: Japanese Patent No. 3095402

Non-Patent Documents

Non-patent document 1: Vaughan, J. T., et al., "High frequency volume coils for clinical nuclear magnetic resonance imaging and spectroscopy", Magnetic Resonance in Medicine, Vol. 32, pp. 206-218 (1994)
Non-patent document 2: Chen, C. N., et al., "Quadrature Detection Coils—A Further √2 Improvement in Sensitivity", Journal of Magnetic Resonance, Vol. 54, pp. 308-327 (1983)
Non-patent document 3: Glover, G. H., et al., "Comparison of Linear and Circular Polarization for Magnetic Resonance Imaging", Journal of Magnetic Resonance, Vol. 64, pp. 255-270 (1985)

Non-patent document 4: Jin, J. M., et al., "Analysis of open coils including shielding effects for MRI applications", Book of Abstracts SMRM 12th Annual Meeting and Exhibition, pp. 1354 (1993)

SUMMARY OF THE INVENTION

Problem to be Solved by the Invention

However, if a part of a cylindrical RF coil is removed, irradiation of high-frequency magnetic fields can no longer be performed by the QD method, and therefore the irradiation efficiency is halved.

The present invention was accomplished in view of the aforementioned circumstances, and an object of the present invention is to provide a technique for securing a large examination space in a tunnel type MRI device without inviting increase of manufacturing cost and without significantly reducing irradiation efficiency and uniformity of the irradiation intensity distribution in an imaging region.

Means to Solve the Problem

According to the present invention, between rungs of a partially cylindrical RF coil, which corresponds to a cylindrical RF coil a part of which is removed, there are disposed half-loops for generating a magnetic field, which is for synthesis with a magnetic field generated by loops formed by adjacent rungs of the partially cylindrical RF coil and rings connecting them to generate a circularly polarized or elliptically polarized magnetic field. Further, high-frequency signals of the same reference frequency as well as desired amplitude ratios and phase differences are supplied to the partially cylindrical RF coil and the half-loops.

Specifically, the present invention provides a high-frequency coil unit comprising a shield having a cylindrical shape, a first partial coil and a second partial coil facing each other and disposed in the inside of the shield with a predetermined interval for the circumferential direction, and a high-frequency signal control unit for controlling high-frequency signals inputted into the first partial coil and the second partial coil, wherein the first partial coil and the second partial coil each have a first high-frequency coil and a second high-frequency coil, the first high-frequency coil and the second high-frequency coil have shapes for generating linearly polarized high-frequency magnetic fields of which directions are perpendicular to each other, and the high-frequency signal control unit supplies the high-frequency signals to the first high-frequency coil and the second high-frequency coil so that a circularly polarized or elliptically polarized high-frequency magnetic field is irradiated in the inside of the shield.

The present invention also provides a magnetic resonance imaging device comprising a static magnetic field generating unit for generating a static magnetic field, a gradient magnetic field applying unit for applying a gradient magnetic field, a high-frequency signal generating unit for generating high-frequency signals, a transmit coil for irradiating the high-frequency signals inputted from the high-frequency signal generating unit on a test subject as a high-frequency magnetic field, a receive coil for detecting magnetic resonance signals generated from the test subject and outputting them as detected signals, a signal processing unit for performing signal processing of the detected signals, and a control unit for controlling operations of the gradient magnetic field applying unit, the high-frequency signal generating unit and the signal processing unit, wherein a high-frequency coil unit comprising a shield having a cylindrical shape, a first partial coil and a second partial coil facing each other and disposed in the inside of the shield with a predetermined interval for the circumferential direction, and a high-frequency signal control unit for controlling high-frequency signals inputted into the first partial coil and the second partial coil, in which the first partial coil and the second partial coil each have a first high-frequency coil and a second high-frequency coil, the first high-frequency coil and the second high-frequency coil have shapes for generating linearly polarized high-frequency magnetic fields of which directions are perpendicular to each other, and the high-frequency signal control unit supplies the high-frequency signals to the first high-frequency coil and the second high-frequency coil so that a circularly polarized or elliptically polarized high-frequency magnetic field is irradiated in the inside of the shield is used as the transmit coil.

Effect of the Invention

According to the present invention, a large examination space can be secured in a tunnel type MRI device without inviting increase of manufacturing cost and without significantly reducing irradiation efficiency and uniformity of the irradiation intensity distribution in an imaging region.

BRIEF DESCRIPTION OF THE DRAWINGS

FIG. 11A is an explanatory view for explaining principle of generation of a magnetic field by a second RF coil according to the first embodiment.

FIG. 11B is an explanatory view for explaining principle of generation of a magnetic field by a second RF coil according to the first embodiment.

FIG. 11C is an explanatory view for explaining principle of generation of a magnetic field by a second RF coil according to the first embodiment.

FIG. 11D is an explanatory view for explaining principle of generation of a magnetic field by a second RF coil according to the first embodiment.

FIG. 11E is an explanatory view for explaining a magnetic field generated by a second RF coil according to the first embodiment.

FIG. 14A is an explanatory view for explaining positional relationship of a loop constituting a first RF coil and a half-loop constituting a second RF coil.

FIG. 14B is an explanatory view for explaining a magnetic field generated when an electric current flows in a first RF coil.

FIG. 14C is an explanatory view for explaining a magnetic field generated when an electric current flows in a second RF coil.

FIG. 16 is an explanatory view for explaining another modification of a transceive coil according to the first embodiment.

FIG. 23A is an explanatory view for explaining a configuration of a transmit coil according to the third embodiment.

FIG. 23B is a drawing for explaining a magnetic decoupling circuit of a transmit coil according to the third embodiment.

FIG. 23C is a drawing for explaining a magnetic decoupling circuit of a transmit coil according to the third embodiment.

MODES FOR CARRYING OUT THE INVENTION

<<First Embodiment>>

The first embodiment of the present invention will be explained below. Hereafter, in all the drawings for explaining embodiments of the present invention, those having the same function are indicated with the same symbols, and repetition of explanation thereof is omitted.

Figure 1:
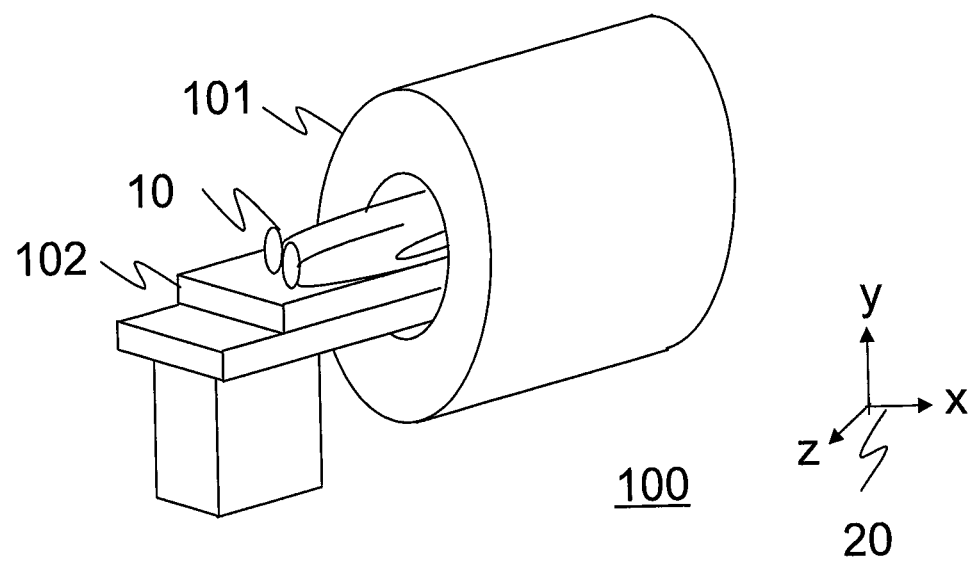
FIG. 1 is an explanatory view for explaining external view of an MRI device according to the first embodiment.

First, the total configuration of an MRI device according to this embodiment will be explained. FIG. 1 shows an external view of an MRI device according to this embodiment, and in the drawing, the direction of the z-axis of a coordinate system 20 is the direction of static magnetic field. The MRI device 100 according to this embodiment is provided with a horizontal magnetic field magnet 101, and a patient table 102. A test subject 10 is inserted into a space for imaging in a bore of the magnet 101 in a state of being laid down on the patient table 102, and subjected to imaging. Hereafter, in this specification, the direction of the static magnetic field is defined as the z-direction, the direction perpendicular to the z-direction in the plane of the patient table 102 is defined as the x-direction, and the direction perpendicular to the plane of the patient table is defined as the y-direction.

Figure 2:
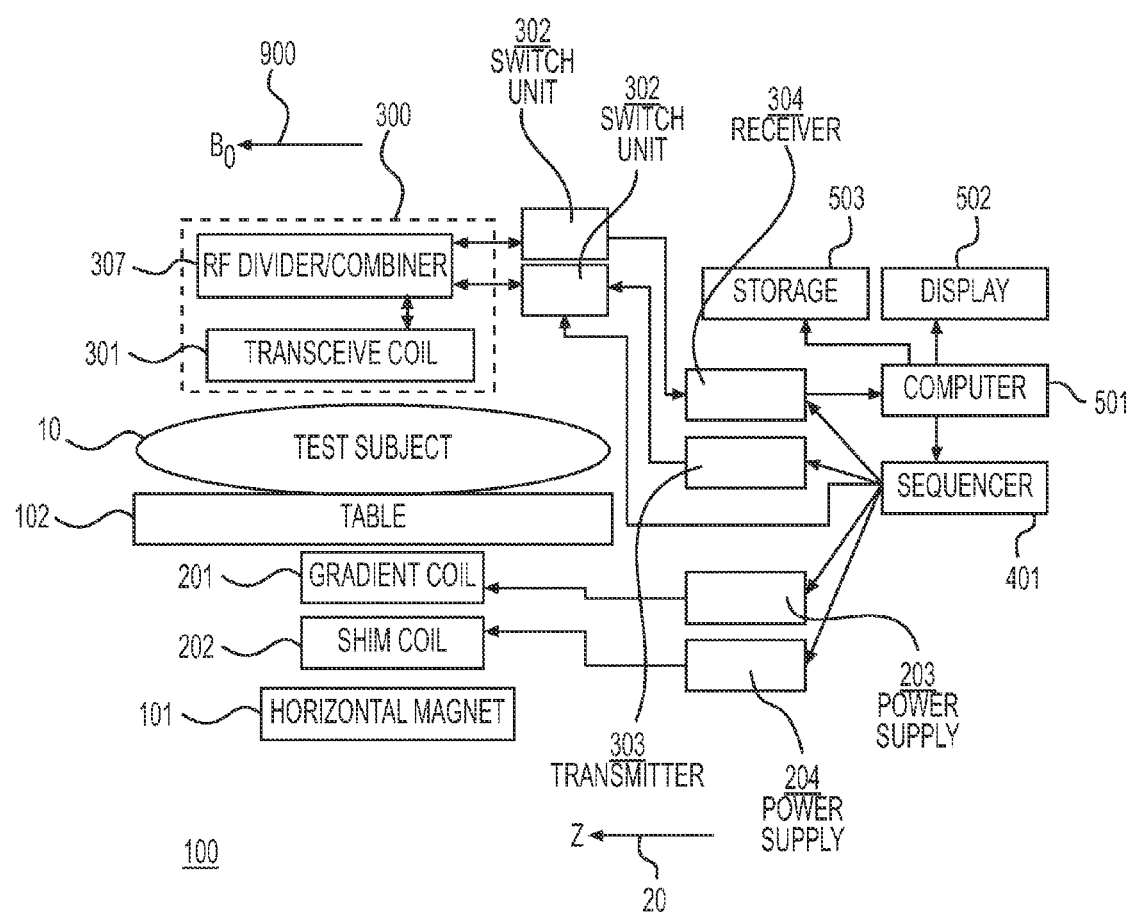
FIG. 2 is a functional block diagram showing a schematic configuration of an MRI device according to the first embodiment.

FIG. 2 is a block diagram showing a schematic configuration of the MRI device 100 according to this embodiment. The same elements as those shown in FIG. 1 are shown with the same symbols. The MRI device 100 according to this embodiment is provided with the horizontal magnetic field magnet 101, a gradient magnetic field coil 201, a shim coil 202 for controlling uniformity of static magnetic field, a power supply for gradient magnetic field 203, a power supply for shim coil 204, a transceive coil 301 for irradiating a high-frequency magnetic field on the test subject 10, detecting magnetic resonance signals generated from the test subject 10, and outputting them as detected signals, a transmit/receive switching unit 302 for switching ON/OFF of high-frequency signals according to the timing of transmission and reception, an RF signal divider/combiner 307, a transmitter 303, a receiver 304, a sequencer 401, and a computer 501.

The gradient magnetic field coil 202 and the shim coil 202 are connected to the power supply for gradient magnetic field 203 and the power supply for shim coil 204, respectively. The transceive coil 301 is connected to two of transmit/receive switching units 302 via the RF signal divider/combiner 307, and the transmit/receive switching units 302 are connected to the transmitter 303 and the receiver 304, respectively. In this embodiment, the part constituted by the transceive coil 301 and the RF signal divider/combiner 307 is called an RF coil unit 300.

The sequencer 401 sends commands to the power supply for gradient magnetic field 203, the power supply for shim coil 204, the transmit/receive switching unit 302, and the transmitter 303, and the power supply for gradient magnetic field 203 and the transmitter 303 output a gradient magnetic field control current and a high-frequency signal for irradiation of a high-frequency magnetic field, respectively. The gradient magnetic field coil 201 applies a gradient magnetic field according to the gradient magnetic field control current. The high-frequency signal for irradiation of a high-frequency magnetic field is applied to the transceive coil 301 via the transmit/receive switching unit 302, and the RF signal divider/combiner 307, and a high-frequency magnetic field is irradiated on the test subject 10.

The magnetic resonance signals generated from the test subject 10 by the irradiated high-frequency magnetic field are detected by the transceive coil 301, and the detected signals pass through the RF signal divider/combiner 307 and the transmit/receive switching unit 302, and subjected to signal amplification and detection in the receiver 304. A magnetic resonance frequency as the basis of the detection in the receiver 304 is set by the sequencer 401. The detected signals are sent to the computer 501 via an analogue to digital converter (not shown in the drawing), and subjected to signal processing such as image reconstruction there. The results are displayed on a display 502 connected to the computer 501.

The detected signals and measurement conditions are saved in a storage device 503 connected to the computer 501, as required. The sequencer 401 controls the components according to commands sent from the computer 501 so that they operate according to timings and intensities programmed beforehand.

In this embodiment, the shape of the transceive coil 301 and the configuration of the RF signal divider/combiner 307 in the RF coil unit 300 are devised to enlarge the examination space into which the test subject 10 is entered, maintain uniformity of the irradiation intensity distribution at least in the test subject 10 in the examination space to be comparable to that obtainable by conventional techniques, and also maintain the irradiation efficiency to be comparable to that obtainable with conventional techniques by performing the irradiation according to the QD method. The details of the RF coil unit 300 used is this embodiment will be explained below.

Figure 3A:
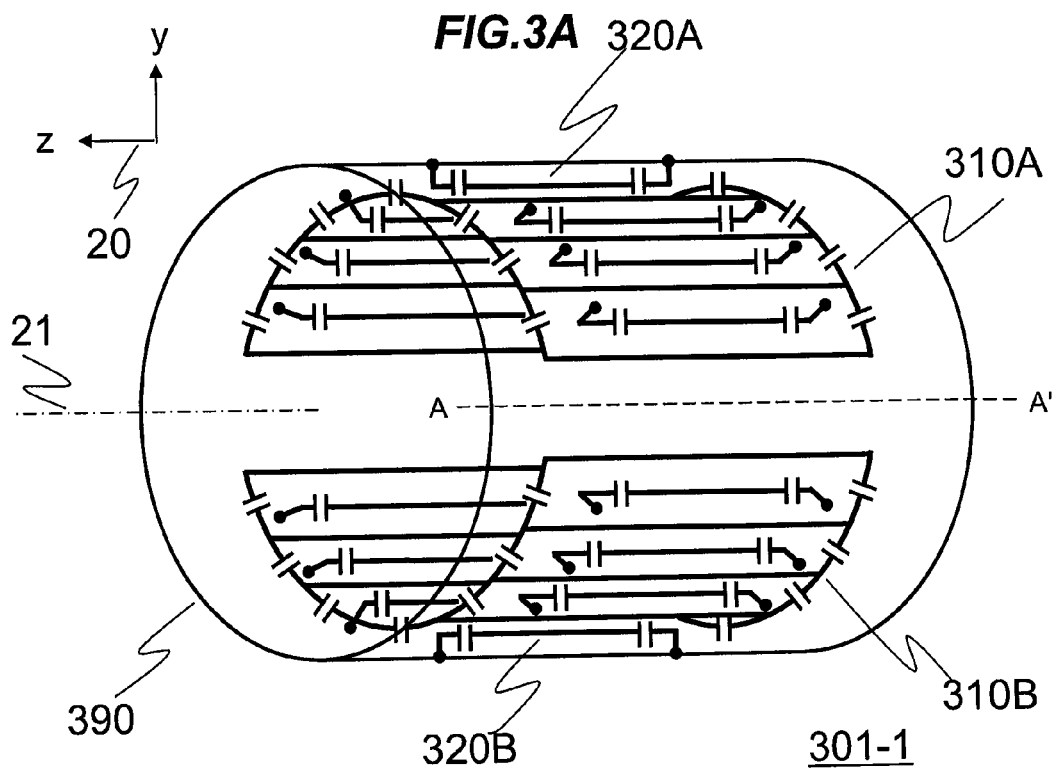
FIG. 3A is an explanatory view for explaining a transceive coil according to the first embodiment.
Figure 3B:
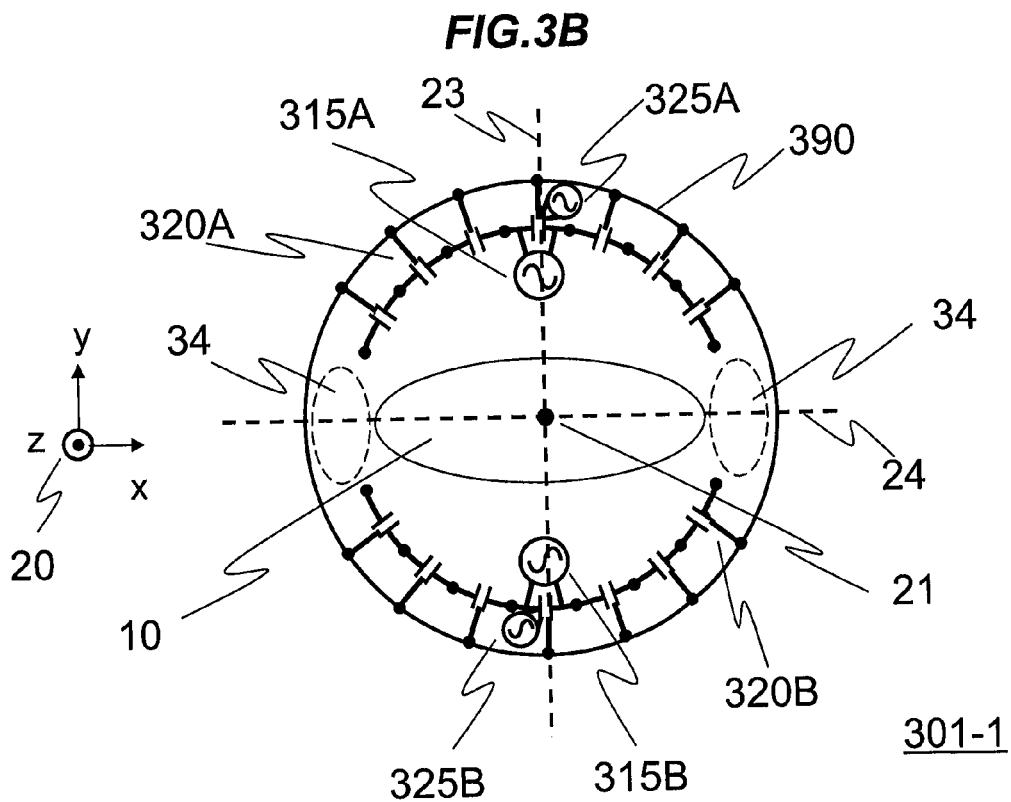
FIG. 3B is an explanatory view for explaining a transceive coil according to the first embodiment.

First, the transceive coil constituting the RF coil unit 300 will be explained. FIGS. 3A and 3B are drawings for explaining the configuration of the transceive coil 301-1 constituting the RF coil unit 300 of this embodiment. FIG. 3A shows the transceive coil 301-1 obliquely seen from the side, and FIG. 3B shows the transceive coil 301-1 seen in the direction of the central axis 21.

The transceive coil 301-1 is provided with an RF shield 390 having a cylindrical shape of such a size that the test subject 10 can be entered into it, and two of first RF coils 310A and 310B and two of second RF coils 320A and 320B in the inside of the RF shield 390. The first RF coils 310A and 310B are provided with a first driving port 315A and a second driving port 315B, respectively, the second RF coils 320A and 320B are provided with a third driving port 325A and a fourth driving port 325B, respectively, and high-frequency signals are outputted and inputted through these. Further, the first to fourth driving ports 315A, 315B, 325A and 325B are connected to the RF signal divider/combiner 307 via a balun 345 (not shown in the drawing) for rejecting common mode noises.

This transceive coil 301-1 is disposed in the MRI device 100 so that the central axis 21 of the RF shield 390 is parallel to the z-axis of the coordinate system 20.

Further, the first RF coil 310A, the first RF coil 310B, the second RF coil 320A, and the second RF coil 320B are each plane-symmetrically disposed with respect to a plane 23, which is a y-z plane of the coordinate system 20 including the central axis 21, in the RF shield 390. Furthermore, the first RF coil 310A and the first RF coil 310B are plane-symmetrically disposed with respect to a plane 24, which is an x-z plane of the coordinate system 20 including the central axis 21, in the RF shield 390. The second RF coil 320A and the second RF coil 320B are similarly plane-symmetrically disposed with respect to the plane 24, which is an x-z plane of the coordinate system 20 including the central axis 21, in the RF shield 390. Furthermore, the first RF coils 310A and 310B, and the second RF coils 320A and 320B are disposed so that spaces 34 are secured at both ends of the test subject 10 for the x-axis direction.

In the following descriptions, the first RF coils 310A and 310B are represented with a numeral 310, and the second RF coils 320A and 320B are represented with a numeral 320, except for the case where it is necessary to specifically distinguish them. The same shall apply to the drawings. The details of the first RF coil 310 and the second RF coil 320 will be explained below.

Figure 4A:
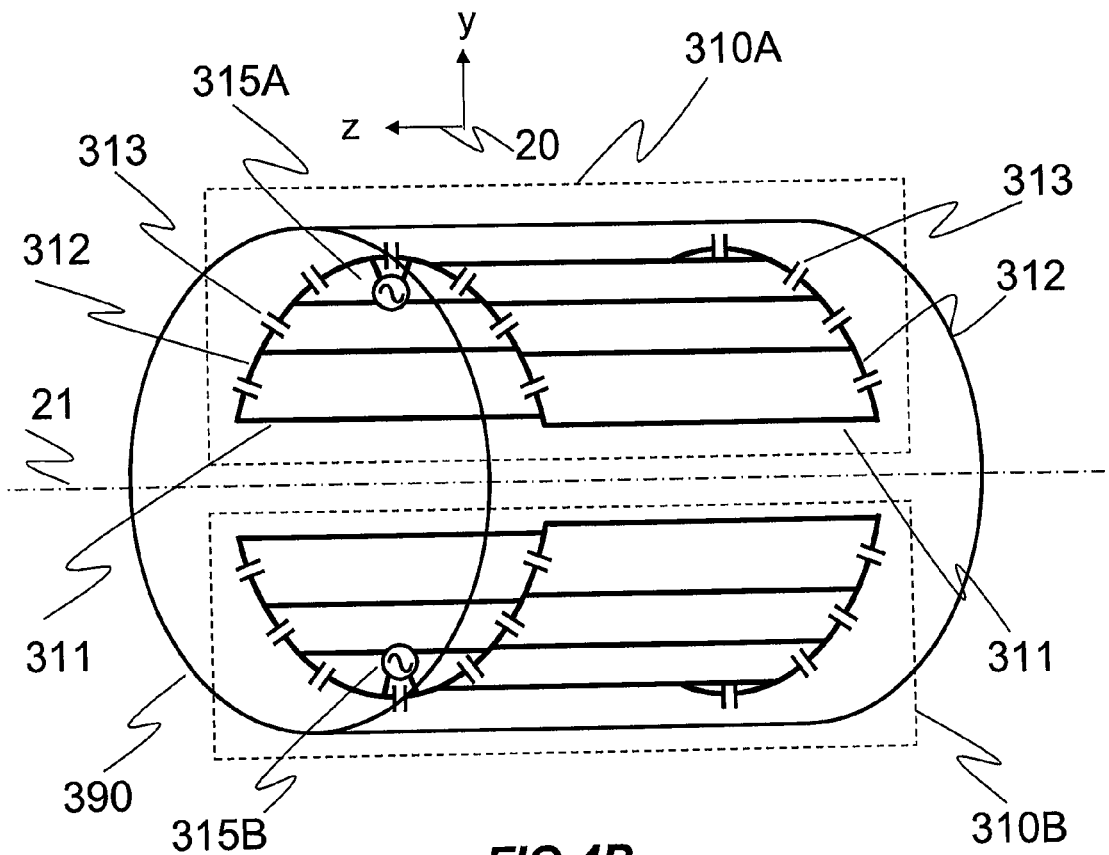
FIG. 4A is an explanatory view for explaining a first RF coil according to the first embodiment.
Figure 4B:
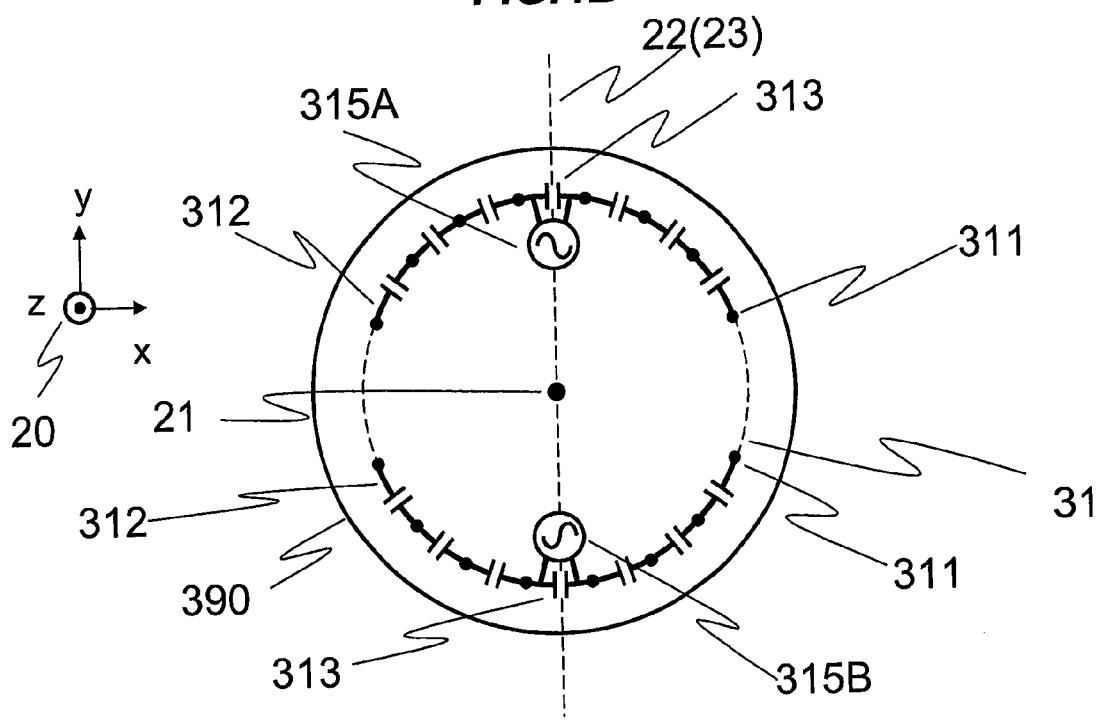
FIG. 4B is an explanatory view for explaining a first RF coil according to the first embodiment.

First, the details of the first RF coil 310 will be explained. FIGS. 4A and 4B are drawings for explaining the first RF coil 310 of the transceive coil 301-1. In order to simplifying the explanation, the second RF coil 320 is not shown in these drawings. FIG. 4A is a drawing of the first RF coil 310 obliquely seen from the side, and FIG. 4B is a drawing of the RF coil 310 seen in the direction of the central axis 21.

The first RF coil 310 is provided with a plurality of first conductors 311 (eight first conductors in FIGS. 4A and 4B) substantially parallel to the central axis 21 of the RF shield 390, two of circular arc-shaped second conductors 312 located in planes substantially perpendicular to the direction of the central axis 21, and a plurality of first capacitors 313. The first conductors 311 are disposed in a cylindrical curved plane 31 locating at a fixed distance from the RF shield 390 at equal intervals, and two of the second conductors 312 are oppositely disposed with respect to the z-axis direction. The ends of the first conductors 311 are connected to the second conductors 312. At least one first capacitor 313 is disposed in each portion of the second conductor 312 between connection points with the first conductors 311.

As shown in FIG. 4B, the center angle of the circular arc formed by the second conductor 312 should be less than 180 degrees. In addition, the shape of the first RF coil 310 should just be plane symmetric with respect to the predetermined plane (plane of symmetry 22). The plane of symmetry 22 is defined as a plane including the central axis 21 and passing the centers of the second conductors 312 for the circular arc direction. According to this embodiment, the plane of symmetry 22 is the same as the plane 23. It is desirable that the first RF coil 310A and the first RF coil 310B are configured and disposed so that they are 180 degrees rotationally symmetric with respect to the central axis 21.

The first driving port 315A and the second driving port 315B are connected to both ends of the first capacitors 313 nearest to the center for the circumferential direction of the curved plane 31, on which they are disposed, respectively.

Although an example of using eight first conductors 311 has been exemplified in the above explanation, the number of the first conductors 311 is not limited to this number.

Figure 5A:
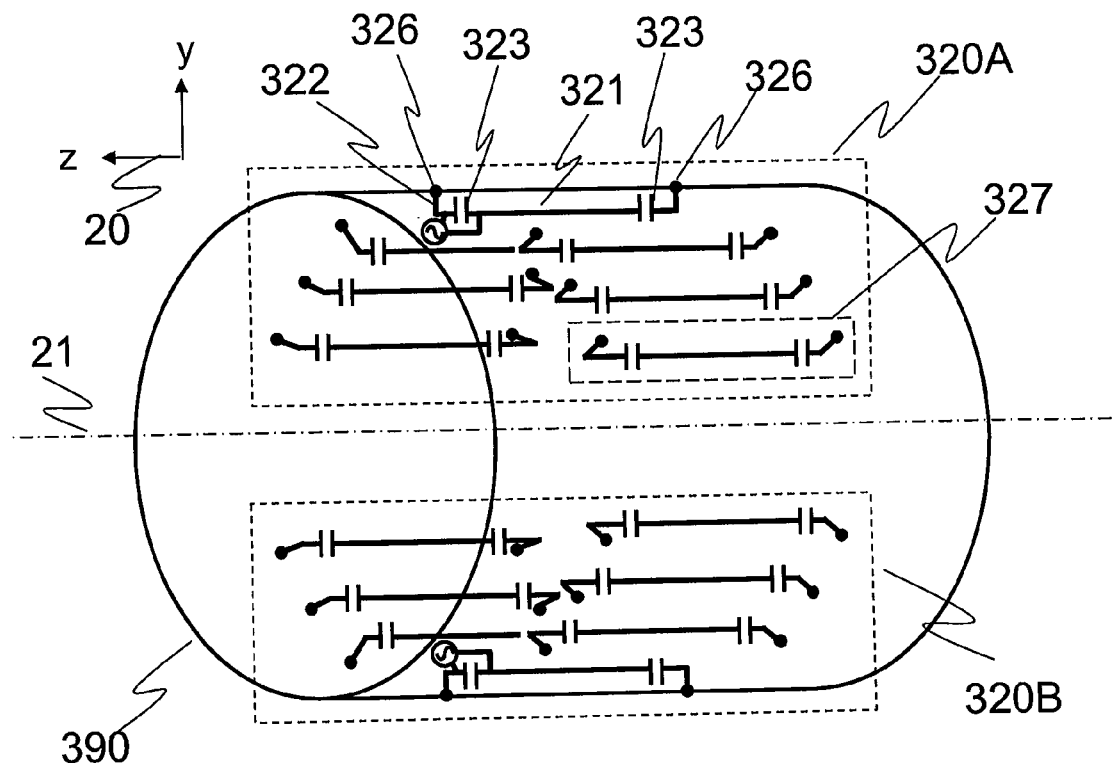
FIG. 5A is an explanatory view for explaining a second RF coil according to the first embodiment.
Figure 5B:
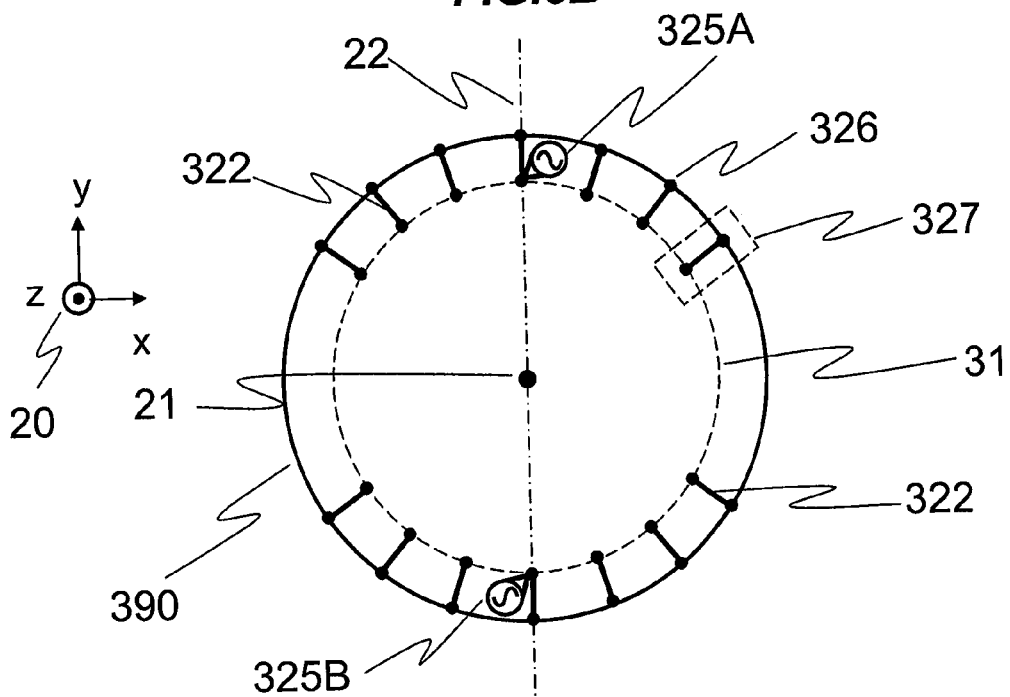
FIG. 5B is an explanatory view for explaining a second RF coil according to the first embodiment.

Next, the details of the second RF coil 320 will be explained. FIGS. 5A and 5B are drawings for explaining the second RF coil 320 of the transceive coil 301-1. In order to simplifying the explanation, the first RF coil 310 is not shown in these drawings. FIG. 5A is a drawing of the second RF coil 320 obliquely seen from the side, and FIG. 5B is a drawing of the second RF coil 320 seen in the direction of the central axis 21.

The second RF coil 320 is provided with a plurality of half-loops 327 each consisting of a third conductor 321 disposed substantially in parallel to the central axis 21 on the cylindrical curved plane 31, fourth conductors 322 connecting the both ends of the third conductor 321 to RF shield 390 at connection points 326, and a second capacitor 323 disposed in the third conductor 321. A plurality of the half-loops 327 (seven half-loops in FIGS. 5A and 5B) are disposed in the curved plane 31 between the adjacent first conductors 311 of the first RF coil 310 at positions of the same distances from the adjacent first conductors 311, so that they are plane symmetric with respect to the plane of symmetry 22 (the same as the plane 23 in this case). It is desirable that two of the second RF coils 320A and 320B are also constituted and disposed so that they are 180 degrees rotationally symmetric with respect to the central axis 21.

The third driving port 325A and the fourth driving port 325B are connected to the second capacitors 323 in the half-loops 327 near the center for the circumferential direction of the curved plane 31, on which they are disposed, respectively. The half-loop 327 to which the driving port is connected is provided with at least two of the second capacitors 323.

In addition, although an example using seven of the third conductors 321 has been mentioned above, the number of the third conductors 321 is not limited to this number. It is sufficient that the third conductors 321 are provided in such a number that the number is smaller by one than the number of the first conductors 311, and the third conductors 321 can be each disposed between two of the first conductors 311 connected with the second conductors 312 with equal intervals from them.

Figure 6A:
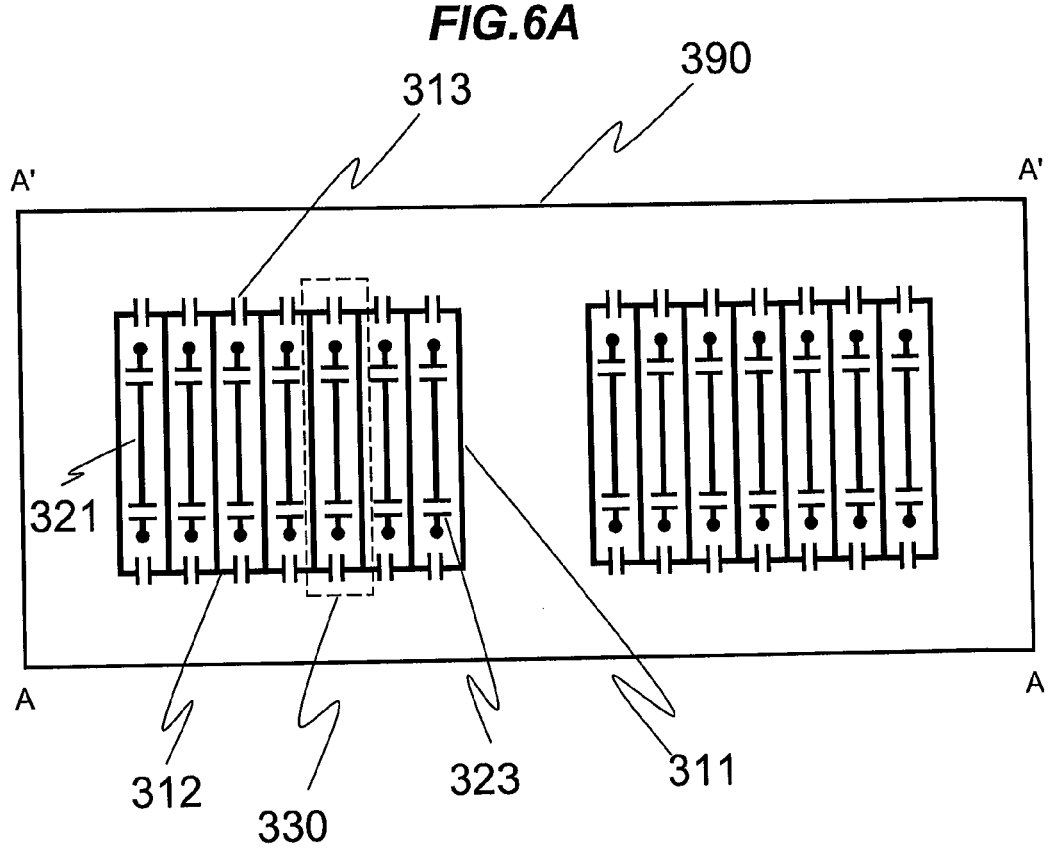
FIG. 6A is a development of a transceive coil according to the first embodiment developed along the circumferential direction.
Figure 6B:
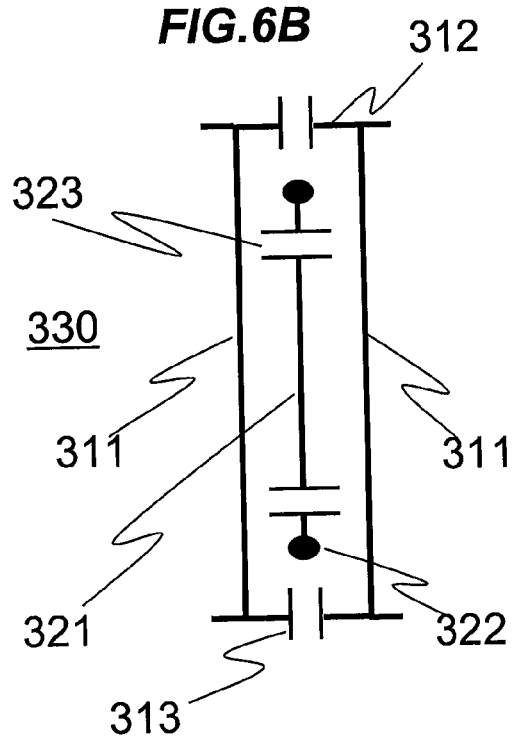
FIG. 6B is an explanatory view for explaining positional relationship of a first RF coil and a second RF coil.
Figure 6C:
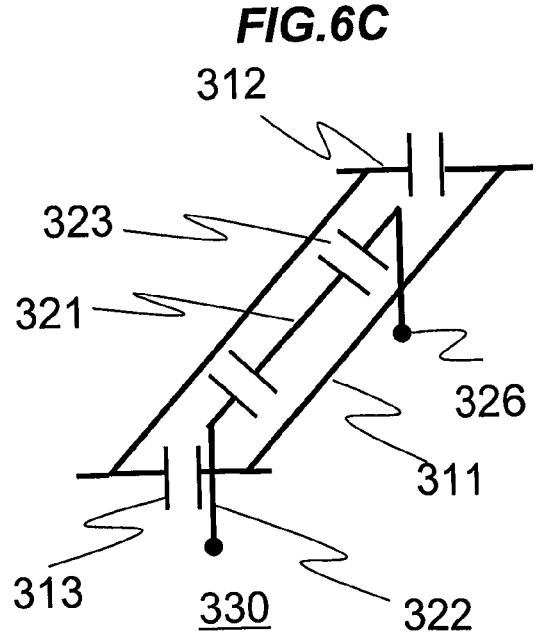
FIG. 6C is an explanatory view for explaining positional relationship of a first RF coil and a second RF coil.

Next, the positional relationship of the first RF coil 310 and the second RF coil 320 will be explained. In order to make it easier to understand the positional relationship of the both, a development of the transceive coil 301-1 is shown in FIG. 6A, in which the RF shield 390 is cut along the line A-A' drawn in FIG. 3A, and the transceive coil 301-1 is developed in a plane. Moreover, for simplifying the drawing, four of the driving ports 315A, 315B, 325A and 325B are not shown in this drawing. FIG. 6A shows the developed state (development) seen from above, and FIG. 6B shows an enlarged view of a part 330 of the first RF coil 310 and the second RF coil 320 in the development. FIG. 6C is a drawing showing the part of FIG. 6B looked down obliquely. As shown in these drawings, the first RF coil 310 and the second RF coil 320 are disposed so that they do not contact with each other, and each third conductor 321 is disposed at a position of equal intervals from two of the adjacent first conductors 311.

The cylindrical conductor of the RF shield 390 shown in FIGS. 3A to 5B, which constitutes the side of the RF shield 390, is shown as being transparent, so that the structures of the first RF coil 310 and the second RF coil 320 can be seen, but the side of the RF shield 390 is actually covered with an opaque electric conductor material. In all the drawings appended to this specification, the side of the RF shield 390 is similarly shown as being transparent.

In the transceive coil 301-1 according to this embodiment having the aforementioned configuration, values of the first capacitors 313 and the second capacitors 323 are adjusted so that the resonance frequencies of the first RF coil 310 and the second RF coil 320 correspond to the frequency of the high-frequency magnetic field to be irradiated.

If the number of the first conductors 311 constituting the first RF coil 310 is represented by N (N is 8 in FIGS. 3A and 3B), the first RF coil 310 is the same as a partially cylindrical birdcage coil having N rungs in the sense of equivalent circuit. In general, a partially cylindrical birdcage coil having N of rungs has (N−1) of resonant modes, as described in Non-patent document 4. Further, when capacitors are disposed in the second conductor 312, uniform magnetic field distribution is generated in the resonant mode of the (N−1)th lowest frequency. Henceforth, this resonant mode is called optimal resonant mode.

Therefore, in this embodiment, among a plurality of the resonance frequencies of the first RF coil 310, the (N−1)th lowest resonance frequency (7th lowest frequency in the case of FIGS. 3A and 3B) is adjusted to the magnetic resonance frequency of the transceive coil 116. Further, the lowest resonance frequency among a plurality of the resonance frequencies of the second RF coil 320 is adjusted to that magnetic resonance frequency.

For example, the transceive coil 301-1 is constituted so that the diameter of the RF shield 390 is 700 mm, the length of the same for the z-axis direction is 1000 mm, the length of the first conductors of the first RF coil 310 is 520 mm, the number of the same is 10, the length of the third conductors of the second RF coil 320 is 500 mm, the number of the half-loops 327 is 9, and the first RF coil 310 is disposed in the cylindrical curved plane 31 having a diameter of 640 mm so that the first RF coil 310 and the second RF coil 320 do not exist in a region of ±75 mm from the central axis 21 for the y-axis direction of the coordinate system 20. In such a transceive coil 301-1, if the resonance frequencies of the first RF coil 310 and the second RF coil 320 are set to be 128 MHz, the values of the first capacitors 313 and the second capacitors 323 are 13.5 pF and 6.4 pF, respectively. As the conductors used for the first RF coil 310 and the second RF coil 320 in this example, rod-shaped conductors having a diameter of 5 mm are used.

Figure 7:
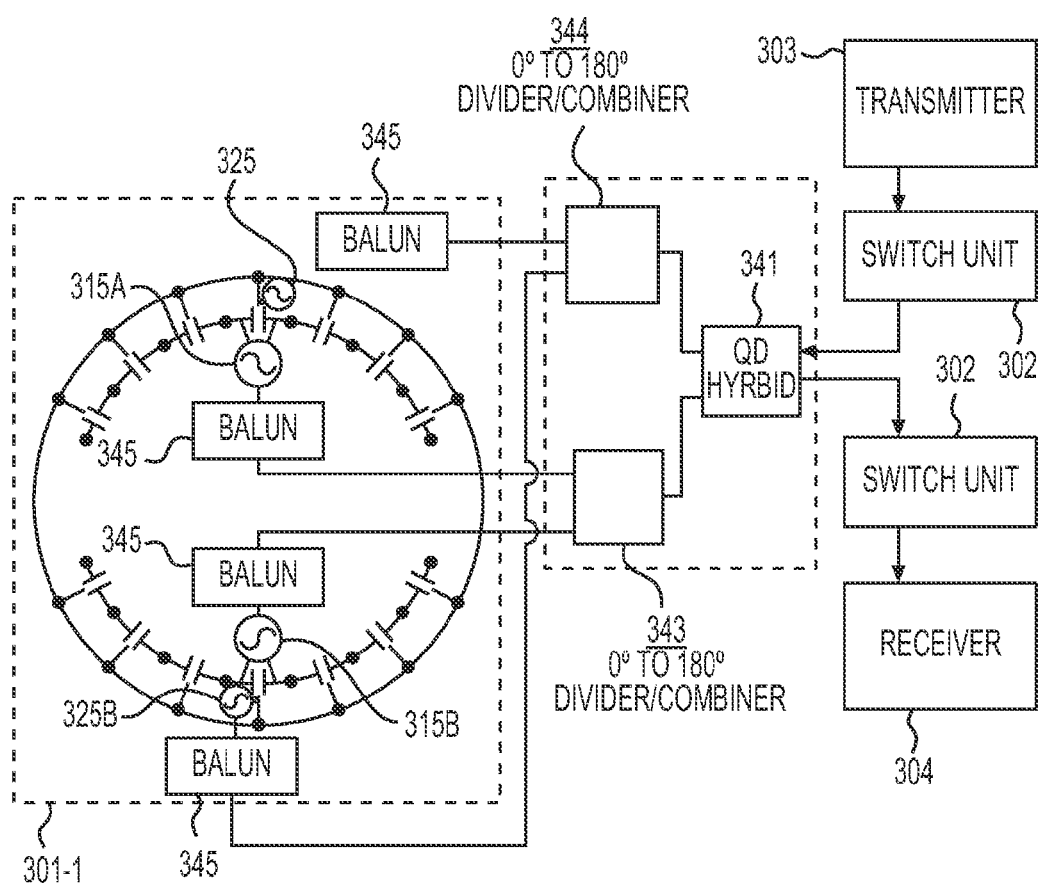
FIG. 7 is an explanatory view for explaining connection scheme of a transceive coil according to the first embodiment, a RF signal divider/combiner, a transmitter, and a receiver.

Next, the details of connection scheme of the transceive coil 301-1, the transmitter 303 and the receiver 304 via the RF signal divider/combiner 307 and the transmit/receive switching units 302 will be explained. FIG. 7 is a drawing for explaining the details of connection scheme of the transceive coil 301-1, the RF signal divider/combiner 307, the transmit/receive switching units 302, the transmitter 303, and the receiver 304.

First, the configuration of the RF signal divider/combiner 307 will be explained. The RF signal divider/combiner 307 is provided with a QD hybrid 341 and a 0°-180° divider/combiner (first 0°-180° divider/combiner 343, second 0°-180° divider/combiner 344). The QD hybrid 341 is a 2-input and 2-output circuit, and divides one input into two signals of which phase difference of signal waveform is 90 degrees and outputs them, and combines two inputs into a signal with shifting phase of one of the inputs by 90 degrees and outputs it. The first 0°-180° divider/combiner 343 and the second 0°-180° divider/combiner 344 each have a function of distributing one high-frequency signal into two high-frequency signals of which phase difference of signal waveform is 180 degrees and a function of shifting phase of one of two high-frequency signals by 180 degrees and then combining the signals.

The transmitter 303 and the receiver 304 are each connected to the QD hybrid 341 via the transmit/receive switching units 302, and two of outputs of the QD hybrid 341 are connected to the inputs of the first 0°-180° divider/combiner 343 and the second 0°-180° divider/combiner 344, respectively. Two of the outputs of the first 0°-180° divider/combiner 343 are connected to the first driving port 315A and the second driving port 315B via baluns 345, respectively, and two of the outputs of the second 0°-180° divider/combiner 344 are connected to the third driving port 325A and the fourth driving port 325B via the baluns 345, respectively.

Next, it will be explained that the transceive coil 301-1, in which the values of the capacitors are adjusted as described above, and which is connected to the transmitter 303 and the receiver 304 via the transmit/receive switching units 302 and the RF signal divider/combiner 307 as described above, irradiates a high-frequency magnetic field on the test subject 10, detects magnetic resonance signals generated from the test subject 10, and outputs them as detected signals. The high-frequency signal is outputted from the transmitter 303 according to directions from the sequencer 401 controlled by the computer 501 according to the program defined beforehand as described above. At the time of the output, the transmit/receive switching unit 302 connected to the transmitter 303 is made to be in the ON state with a direction from the sequencer 401.

As shown in FIG. 7, if a high-frequency signal is inputted from the transmitter 303 via the transmit/receive switching unit 302, the QD hybrid 341 generates high-frequency signals of phases different by 90 degrees and outputs them to the first 0°-180° divider/combiner 343 and the second 0°-180° divider/combiner 344, respectively. The first 0°-180° divider/combiner 343 divides the inputted high-frequency signal into two signals of a phase difference of 180 degrees, and applies them to the first driving port 315A and the second driving port 315B, respectively. The second 0°-180° divider/combiner 344 divides the inputted high-frequency signal into two signals of a phase difference of 180 degrees, and applies them to the third driving port 325A and the fourth driving port 325B, respectively.

Operation of two of the first RF coils 310A and 310B in the case where high-frequency signals of a phase difference of 180 degrees are applied to the first driving port 315A and the second driving port 315B, respectively, will be explained with reference to FIGS. 8A and 8B. For ease of explanation, the second RF coil 320 is not shown in FIGS. 8A and 8B.

As described above, the first RF coil 310 is adjusted so that it resonates in the optimal resonant mode. When the first RF coil 310 resonates in this optimal resonant mode, a RF current 810 flows in the conductors of the first RF coil 310 in the directions indicated with the arrows as shown in FIG. 8A. That is, in the first conductors 311, the RF current 810 flows in the opposite directions on both sides of the first driving port 315A or the second driving port 315B, and the intensity thereof increase in proportion to the distance from the first driving port 315A or the second driving port 315B. Further, in each of the second conductors 312, the RF current 810 flows in one direction, and the intensity thereof decreases from the first driving port 315A or the second driving port 315B towards the both ends of the second conductor 312.

Figure 8A:
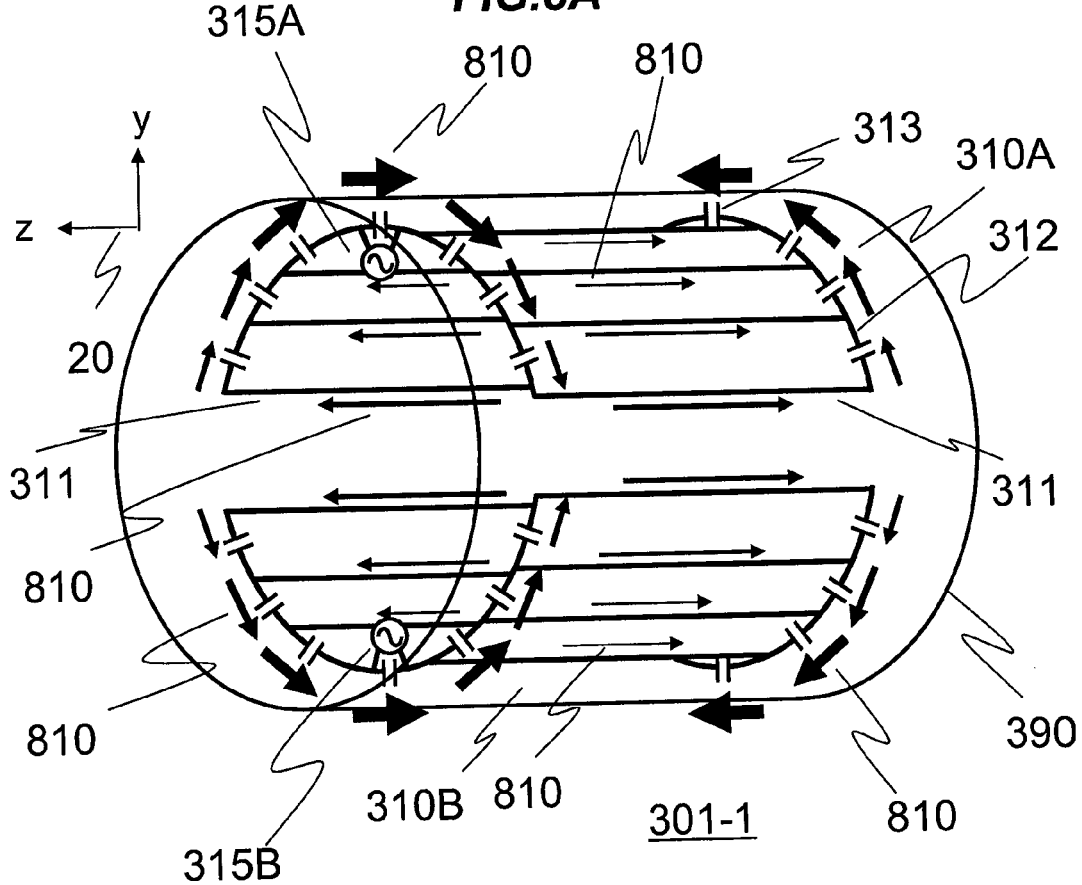
FIG. 8A is an explanatory view for explaining current distribution in a first RF coil according to the first embodiment.

In FIG. 8A, magnitude of the amplitude of the RF current 810 is indicated with the thickness of the arrows, and direction along which the electric current flows is indicated with the direction of the arrows. Further, since the phase difference of the high-frequency signals applied to the first driving port 315A and the second driving port 315B is 180 degrees, directions and intensities of the electric currents flowing in two of the first RF coils 310A and 310B are symmetric with respect to the y-axis direction of the coordinate system 20.

Figure 8B:
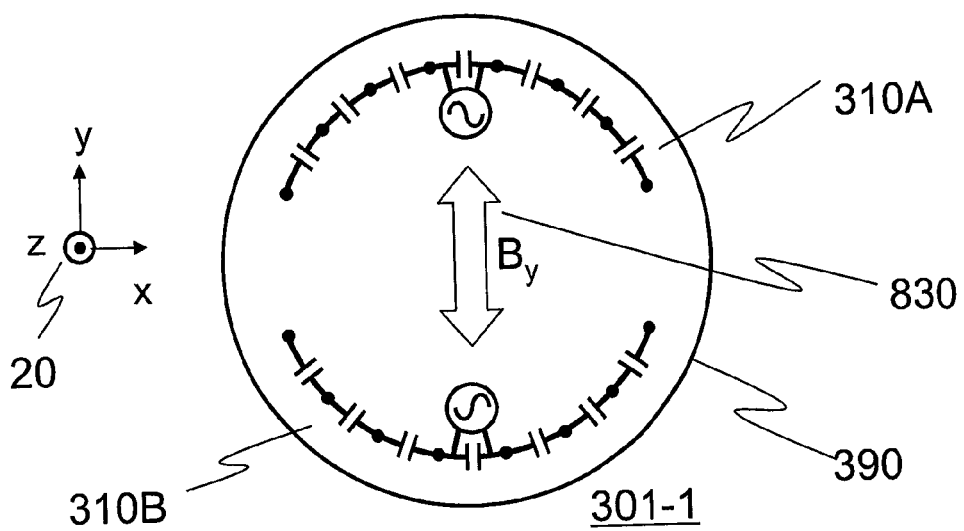
FIG. 8B is an explanatory view for explaining a magnetic field generated by a first RF coil according to the first embodiment.

With this RF current 810, a first high-frequency magnetic field $B_y$ 830 shown in FIG. 8B vibrating in a direction parallel to the y-axis of the coordinate system 20 is generated at the center of the transceive coil 301-1 according to the Biot-Savart law. Although the first RF coil 310 and the second RF coil 320 are closely disposed, magnetic coupling of the both is extremely small due to the positional relationship thereof as described later. Therefore, generation of the first high-frequency magnetic field 830 is not inhibited by variation of the resonance characteristics of the first RF coil 310 and the second RF coil 320 due to magnetic coupling.

Figure 9:
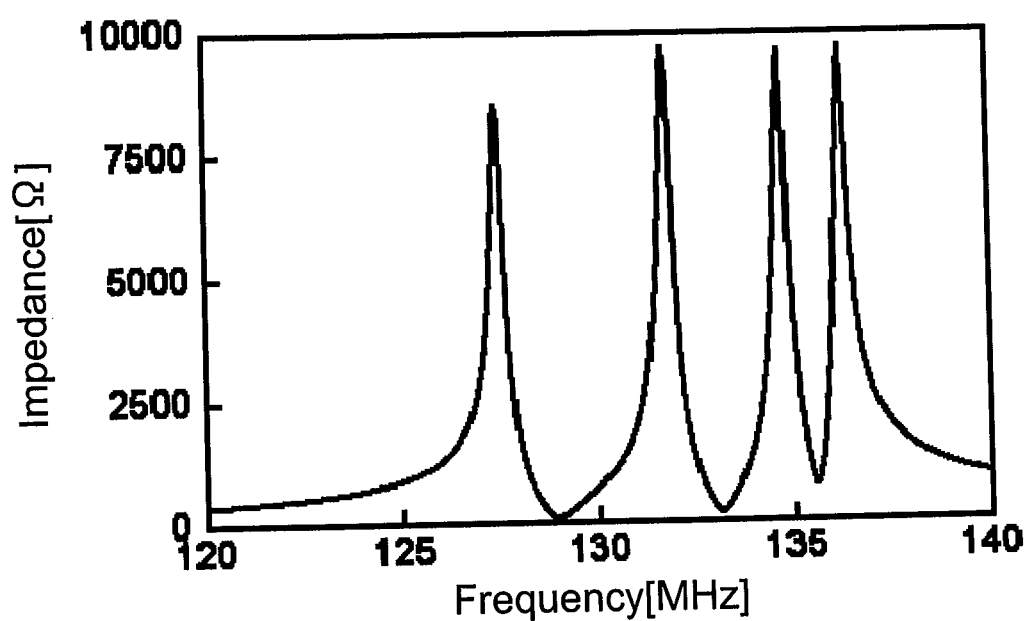
FIG. 9 is a graph showing impedance characteristic of a second RF coil according to the first embodiment.

Operation of two of the second RF coils 320A and 320B in the case where high-frequency signals of which phase difference is 180 degrees are applied to the third driving port 325A and the fourth driving port 325B, respectively, will be explained with reference to FIGS. 5A, 5B, and 9 to 11E. FIG. 9 is a graph showing impedance characteristic of the second RF coil 320, in which the horizontal axis indicates frequency, and the vertical axis indicates impedance. Further, for ease of explanation, the first RF coil 310 is not shown in FIGS. 10, and 11A to 11E.

The number of the resonant modes of the second RF coil 320 depends on the number of the third conductors 321, i.e., the number of the half-loops 327. The impedance shown by N of the half-loops 327 disposed over the RF shield 390 has a frequency characteristic showing Int(N/2) +1 of resonance peaks. Int(x) means integer part of x. For example, when the second RF coil 320 has seven of the half-loops 327 as shown in FIGS. 5A and 5B, this second RF coil 320 has four resonance peaks as shown in FIG. 9.

Figure 10:
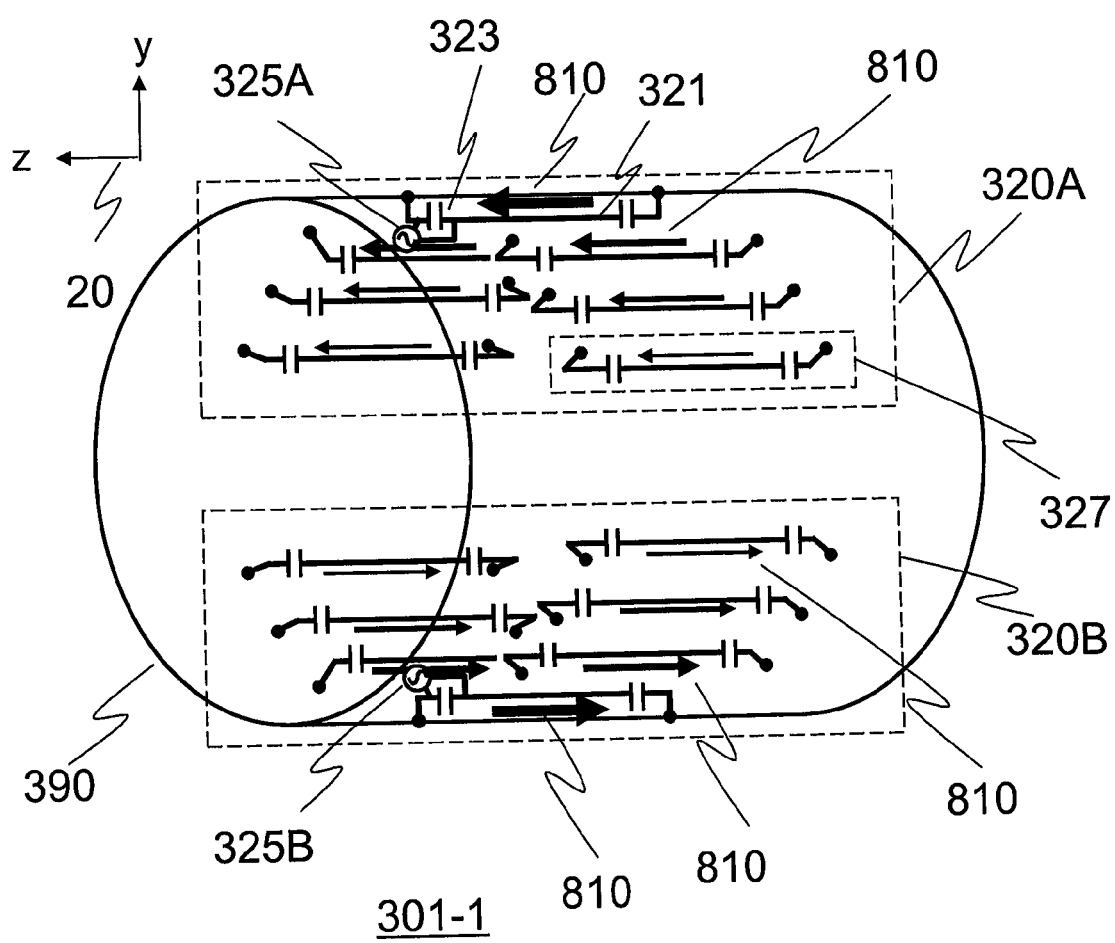
FIG. 10 is an explanatory view for explaining distribution of electric current flowing in a second RF coil according to the first embodiment.

In the resonant mode of the lowest frequency among those of Int(N/2)+1 of the resonance peaks, the RF current 810 flows in the same direction in the half-loops 327 as shown in FIG. 10, and the intensity of the electric current becomes smaller in a more outer half-loop 327. In FIG. 10, magnitude of the amplitude of the RF current 810 is indicated with the thickness of the arrows, and direction along which the electric current flows is indicated with the direction of the arrows. As for the direction and intensity of the electric current flowing in two of the second RF coils 320, since the phase difference of the high-frequency signals applied to the third driving port 325A and the fourth driving port 325B is 180 degrees, directions of the electric currents flowing in the second RF coil 320A and the second RF coil 320B shown in FIG. 10 are opposite to each other.

As shown in FIG. 11A, the RF current 810 flowing in the half-loop 327 in which the third driving port 325A is disposed generates a magnetic flux 821A, and direction of a magnetic field vector 822A at the center of the transceive coil 301-1 is the direction perpendicular to the plane defined by this half-loop 327. In this example, it is parallel to the x-axis of the coordinate system 20. Directions of high-frequency magnetic fields generated by the other half-loops 327 of the second RF coil 320A are similarly directions perpendicular to the planes defined by the half-loops 327. Since the half-loops 327 of the second RF coil 320A are disposed in plane symmetry with respect to the plane of symmetry 22, the high-frequency magnetic field generated by all of the half-loops 327 constituting the second RF coil 320A is represented by a synthesis of magnetic field vectors 822A shown in FIG. 11B, and a high-frequency magnetic field is generated in a direction parallel to the x-axis of the coordinate system 20.

Further, as shown in FIG. 11C, the RF current 810 flowing in the half-loop 327 in which the fourth driving port 325B is disposed generates a magnetic flux 821B, and direction of a magnetic field vector 822B at the center of the transceive coil 301-1 is the direction perpendicular to the plane defined by this half-loop 327. In this example, it is parallel to the x-axis of the coordinate system 20. Directions of high-frequency magnetic fields generated by the other half-loops 327 of the second RF coil 320B are similarly directions perpendicular to the planes defined by the half-loops 327. Therefore, the high-frequency magnetic field generated by all of the half-loops 327 constituting the second RF coil 320B is represented by a synthesis of the magnetic field vectors 822B as shown in FIG. 11D, and a high-frequency magnetic field of the same direction as that of the x-axis of the coordinate system 20 is generated.

Since the flowing direction of the RF current 810 is reversed on a certain cycle, two of the second RF coils 320 generate a second high-frequency magnetic field $B_x$ 840 vibrating in the direction parallel to the x-axis of the coordinate system 20 at the center of the transceive coil 301-1, as shown in FIG. 11E.

Figure 12:
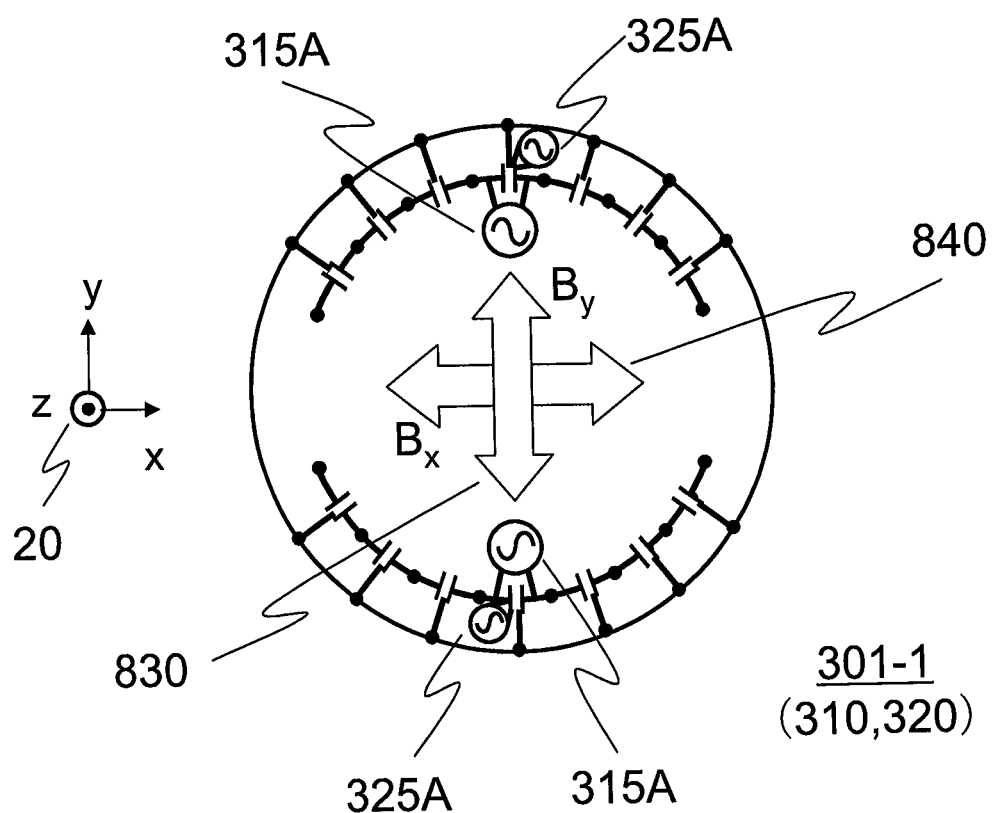
FIG. 12 is an explanatory view for explaining a magnetic field generated by a transceive coil according to the first embodiment.

The directions of the first high-frequency magnetic field $B_y$ 830 generated by two of the first RF coils 310, and the second high-frequency magnetic field $B_x$ 840 generated by two of the second RF coils 320 are perpendicular to each other as shown in FIG. 12. In this example, both the phase difference of the high-frequency signals applied to the first driving port 315A and the third driving port 325A and the phase difference of the high-frequency signals applied to the second driving port 315B and the fourth driving port 325B are 90 degrees. This is because the high-frequency signals sent from the transmitter 303 are divided by the QD hybrid 341 into signals of a phase difference of 90 degrees. Therefore, the phase difference of the first high-frequency magnetic field $B_y$ 830 and the second high-frequency magnetic field $B_x$ 840 is 90 degrees, and the synthesized magnetic field of the first high-frequency magnetic field $B_y$ 830 and the second high-frequency magnetic field $B_x$ 840 is a magnetic field rotating in an x-y plane seen in the direction of the z-axis of the coordinate system 20. Therefore, the transceive coil 301-1 irradiates high-frequency magnetic fields of two directions perpendicular to each other with shifting the phase of one of the high-frequency magnetic fields by 90 degrees as in the QD irradiation method.

As described above, the synthesized magnetic field of the first high-frequency magnetic field $B_y$ 830 and the second high-frequency magnetic field $B_x$ 840 is a magnetic field rotating in an x-y plane as seen in the direction of the z-axis of the coordinate system 20. By applying such a high-frequency magnetic field, a magnetic resonance signal is emitted from the test subject 10 as a magnetic field rotating in the x-y plane as seen in the direction of the z-axis of the coordinate system 20. The transceive coil 301-1 detects the magnetic field rotating in the x-y plane by the QD method, as in the case where a high-frequency magnetic field is irradiated, according to the reciprocity law.

Specifically, a high-frequency signal corresponding to a magnetic resonance signal is generated at each of the first driving port 315A, the second driving port 315B, the third driving port 325A, and the fourth driving port 325B. As shown in FIG. 7, high-frequency signals generated at the first driving port 315A and the second driving port 315B are inputted into the first 0°-180° divider/combiner 343, and they are combined therein with shifting the phase of one of the signals by 180 degrees. Further, high-frequency signals generated at the third driving port 325A and the fourth driving port 325B are inputted into the second 0°-180° divider/combiner 344, and they are combined therein with shifting the phase of one of the signals by 180 degrees.

Two of the signals combined in the first 0°-180° divider/combiner 343 and the second 0°-180° divider/combiner 344 are inputted into the QD hybrid 341, and combined with shifting the phase of one of the signals by 90 degrees, and the combined signal is sent to the receiver 304 via the transmit/receive switching unit 302. At this time, the transmit/receive switching unit 302 connected to the receiver 304 is made to be in the ON state with a direction sent from the sequencer 401.

Thus, the transceive coil 301-1 shown in FIGS. 3A and 3B operates in the same manner as that of a transceive coil based on the QD method.

Degree of the expansion of the examination space in the transceive coil 301-1 of this embodiment explained above and the results of comparison of the performances thereof with those of a conventionally used birdcage coil are shown. As the performances, irradiation intensity and uniformity of irradiation intensity distribution are examined. The irradiation intensity distributions of both the coils were obtained by electromagnetic field simulation.

The specification of the used transceive coil 301-1 was as follows. The diameter of the RF shield 390 was 700 mm, the length of the same was 1000 mm, the length of the first conductors 311 of the first RF coil 310 was 520 mm, the number of the same was 10, the length of the third conductors 321 of the second RF coil 320 was 520 mm, and the number of the half-loops was 9. The first RF coil 310 and the second RF coil 320 were disposed in the cylindrical curved plane 31 having a diameter of 640 mm so that the coils did not exist in a region of ±75 mm from the central axis 21 for the y-axis direction of the coordinate system 20. Further, the value of each capacitor was chosen so that the resonance frequency of the transceive coil 301-1 should become 128 MHz.

The birdcage coil used as the object of the comparison was a 16-rung high pass birdcage coil of a length of 500 mm using an RF shield of the same size and disposed in a cylindrical curved plane of the same size as that of the curved plane 31.

Values of capacitors in this birdcage coil were also adjusted so that the resonance frequency became 128 MHz.

Figure 13A:
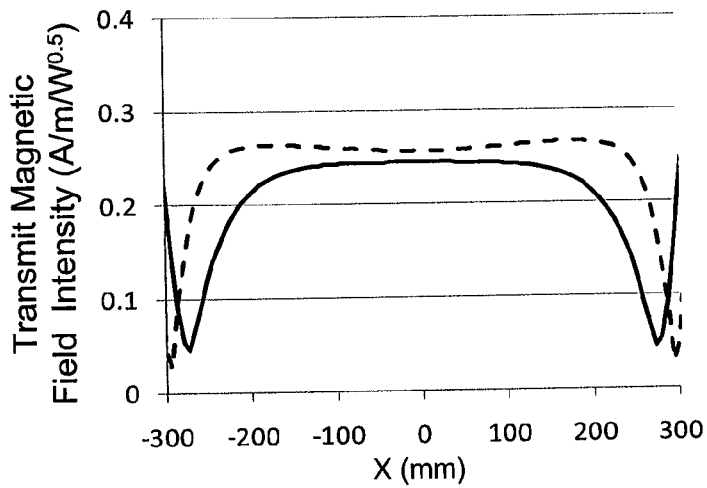
FIG. 13A is a graph showing one-dimensional profiles of the irradiation intensity of a transceive coil according to the first embodiment and a conventional birdcage coil for the x-axis direction.
Figure 13B:
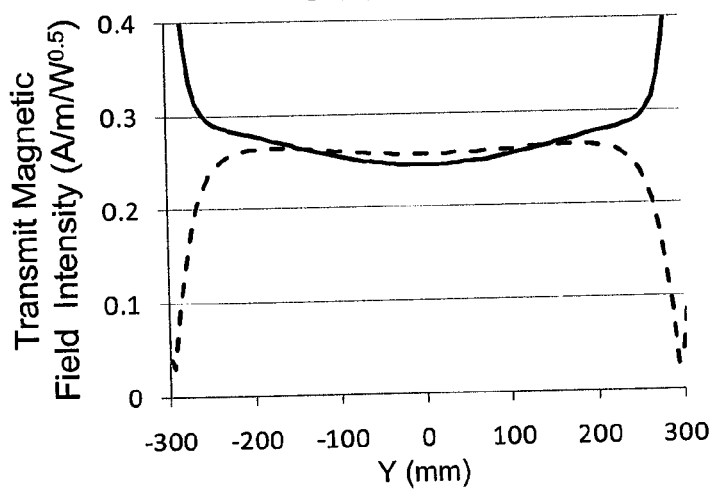
FIG. 13B is a graph showing one-dimensional profiles of the irradiation intensity of a transceive coil according to the first embodiment and a conventional birdcage coil for the y-axis direction.
Figure 13C:
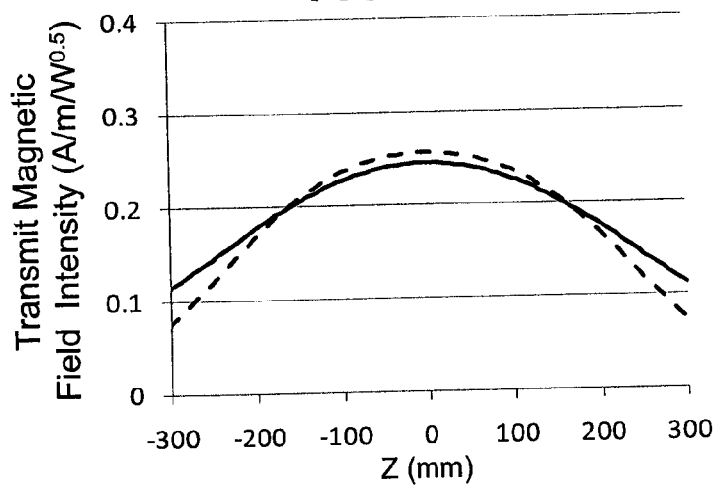
FIG. 13C is a graph showing one-dimensional profiles of the irradiation intensity of a transceive coil according to the first embodiment and a conventional birdcage coil for the z-axis direction.

The QD irradiation according to the method explained for this embodiment was performed with the transceive coil 301-1, and irradiation according to the usual QD method was performed with the birdcage coil. One-dimensional profiles of irradiation intensity of both coils along the lines of the x-axis, y-axis and z-axis directions passing the center of each coil are shown in FIGS. 13A, 13B and 13C, respectively. In the transceive coil 301-1, the intersection of the section passing the centers of the first conductors 311 for the longitudinal direction and the central axis 21 was defined as the point of origin, and in the birdcage coil, the intersection of the section passing the center for the longitudinal direction and the central axis was defined as the point of origin. In FIGS. 13A 13B and 13C, the horizontal axis indicates the distance [mm] from the point of origin for each axis direction, and the vertical axis indicates irradiation intensity $[A/m/\sqrt{W}]$. Further, the one-dimensional profiles for irradiation intensity of the transceive coil 301-1 according to this embodiment are indicated with solid lines, and the one-dimensional profiles for irradiation intensity of the birdcage coil are indicated with dashed lines.

As shown in FIGS. 13A 13B and 13C, in the transceive coil 301-1, average of irradiation intensity per 1 W in a region having a radius of 150 mm from the point of origin as the center in a plane passing the point of origin and perpendicular to the central axis 21 was 0.251 $[A/m/\sqrt{W}]$, and uniformity of irradiation intensity distribution in the same region was 6.5%. Further, the region of irradiation intensity corresponding to 70% of the irradiation intensity at the point of origin or higher in the one-dimensional profile of irradiation intensity for the z-axis direction was in the range of −196 mm to +196 mm. In contrast, in the 16-rung high pass birdcage coil, average of irradiation intensity per 1 W in a region having a radius of 150 mm from the point of origin as the center in a plane passing the point of origin and perpendicular to the central axis 21 was 0.261 $[A/m/\sqrt{W}]$, and uniformity of irradiation intensity distribution in the same region was 2.0%. The region of irradiation intensity corresponding to 70% of the irradiation intensity at the point of origin or higher in the one-dimensional profile of irradiation intensity for the z-axis direction was in the range of −182 mm to +182 mm. The uniformity of irradiation intensity distribution is a ratio of difference of the maximum and minimum values of irradiation intensity in the predetermined region to the sum of the maximum and minimum values represented in terms of percentage.

As described above, the irradiation intensity of the transceive coil 301-1 according to this embodiment was 95% of that obtained by the QD irradiation performed with the 16-rung high pass birdcage coil, and it was demonstrated that substantially the same irradiation intensity as that obtainable with the conventional birdcage coil was obtained. Further, if the uniformity is 17.6% or lower, irradiation intensity generally becomes 70% of the maximum value or higher in the whole region, and no problem arises in imaging. The uniformity to be provided by the transceive coil 301-1 of this embodiment obtained by the electromagnetic field simulation was 6.5% as described above. Further, as for the uniformity of the irradiation intensity for the z-axis direction, the region in which irradiation intensity was 70% of the irradiation intensity at the point of origin or higher was larger than that observed with the 16-rung high pass birdcage coil. With these results, it was demonstrated that the transceive coil 301-1 according to this embodiment had uniform irradiation intensity distribution of a satisfactory level for imaging.

As for the examination space, the spaces 34 can be obtained on both sides of the test subject 10, that is, additional spaces of 30 mm for the x-axis direction and ±75 mm for the y-axis direction can be obtained as shown in FIGS. 3A and 3B with the transceive coil 301-1 compared with the case of using the 16-rung birdcage coil.

Therefore, it can be seen that the examination space can be expanded with maintaining comparable irradiation intensity and uniformity of irradiation intensity distribution by using the transceive coil 301-1 of this embodiment instead of the 16-rung birdcage coil.

When two of coils are used, magnetic coupling may occur between both the coils, and an induced current may flow into the driving port of one coil due to a magnetic field generated by the other coil. Then, Q factor of the impedance peak may be halved or further reduced compared with the case of using a single coil, and thereby irradiation intensity of the coil may be reduced, or an impedance peak may be divided into two, and a desired high-frequency magnetic field may not be irradiated. It will be explained below that any electric current induced by magnetic coupling does not flow into a driving port in the first RF coil 310 and the second RF coil 320 constituting the transceive coil 301-1 of this embodiment.

First, since the magnetic coupling between the first RF coil 310 and the second RF coil 320 may dominantly occur in a region in which the coils are most adjacent to each other, it will be explained that magnetic coupling does not occur even in such a region in which both the RF coils are most adjacent to each other. As shown in FIG. 6A, the first RF coil 310 and the second RF coil 320 are adjacently disposed. In particular, as shown in FIG. 14A, the loop 316 constituted by two of the adjacent first conductors 311, parts of the second conductor 312 connecting them and the first capacitors 313, and the half-loop 327 of the second RF coil 320 disposed in the loop 316 and connected to the RF shield 390 at the connection point 326 are most closely disposed.

If an electric current flows in the loop 316, a magnetic field 823 is generated with the loop 316 as shown in FIG. 14B. Since each third conductor 321 of the half-loop 327 is disposed so that it is parallel to two of the first conductors of the loop 316 with the same intervals from them, the magnetic field 823 generated by the loop 316 is symmetrically distributed with respect to the plane 32 including the half-loop 327. Therefore, the magnetic field 823 generated with the loop 316 does not couple with the half-loop 327, and thus magnetic coupling is not induced.

On the other hand, if an electric current flows in the half-loop 327, a magnetic field 824 is generated with the loop 327 as shown in FIG. 14C. Since each third conductor 321 of the half-loop 327 is disposed so that it is parallel to two of the first conductors of the loop 316 with the same intervals from them, the magnetic field 824 generated with the loop 327 is symmetrically distributed with respect to the plane 32 including the half-loop 327. Although the magnetic field 824 generated with the half-loop 327 couples with the loop 316, the total of the magnetic field 824 coupling with the loop 316 becomes 0 because of the symmetricity of the magnetic field distribution, and thus magnetic coupling is not induced in the loop 316 by the magnetic field 824 generated with the half-loop 327. Therefore, it was demonstrated that magnetic coupling is not induced between the loop 316 constituting the first RF coil 310 and the half-loop 327 constituting the second RF coil 320 disposed at most closely adjacent positions.

Next, it will be explained that any electric current is not flown into the driving port in one of the first RF coil 310 and the second RF coil 320 by a magnetic field generated by the other coil. As shown in FIG. 12, directions of the first high-frequency magnetic field $B_y$ 830 generated by two of the first RF coils 310, and the second high-frequency magnetic field $B_x$ 840 generated by two of the second RF coils 320 are perpendicular to each other. Since the third driving port 325A and the fourth driving port 325B are connected to the second capacitors 323 on the half-loops 327 near the center for the circumferential direction of the curved plane 31, on which they are disposed, respectively, direction of the first high-frequency magnetic field $B_y$ 830 generated by the first RF coil 310 becomes parallel to the loop plane of the half-loop 327 in which the third driving port 325A and the fourth driving port 325B are disposed. Therefore, the first high-frequency magnetic field $B_y$ 830 does not couple with the half-loop 327, and any electric current is not flown into the third driving port 325A and the fourth driving port 325B by the first high-frequency magnetic field $B_y$ 830.

Further, since the first driving port 315A and the second driving port 315B are connected to the both ends of the first capacitor 313 nearest to the center for the circumferential direction of the curved plane 31, on which they are disposed, the direction of the second high-frequency magnetic field $B_x$ 840 generated by the second RF coil 320, and the loop plane of the loop 316 in which the first driving port 315A and the second driving port 315B are disposed become parallel to each other. Therefore, the second high-frequency magnetic field $B_x$ 840 does not couple with the loop 316, and thus any electric current is not flown into the first driving port 315A and the second driving port 315B by the second high-frequency magnetic field $B_x$ 840.

Therefore, it is demonstrated that magnetic coupling is not induced between the loop 316 and the half-loop 327, which are disposed at most closely adjacent positions among the elements of the first RF coil 310 and the second RF coil 320, and that any electric current is not flown into a driving port of one of the first RF coil 310 and the second RF coil 320 by a high-frequency magnetic field generated by the other.

In the case of the transceive coil 301-1 showing irradiation intensity distribution profiles shown in FIGS. 13A, 13B and 13C, the Q factor of the first RF coil 310 alone was 466. In contrast, when the first RF coil 310 and the second RF coil 320 are disposed, and an electric power is supplied only to the first RF coil 310, the Q factor of the first RF coil was 454. Therefore, the reduction of the Q factor of the first RF coil 310 induced by disposing the second RF coil 320 was 2.6%, which was so small that no problem arises in operation of the coil.

As explained above, according to this embodiment, irradiation according to the QD method is enabled, and the irradiation intensity and uniformity of irradiation intensity distribution comparable to those of the conventional cylindrical RF coil can be realized, even with removing a part of the cylindrical RF coil. Therefore, according to this embodiment, there can be provided a transceive coil for a tunnel type MRI device, with which a larger examination space can be secured for the space from which parts of cylindrical RF coils are removed, compared with a birdcage coil, without significantly reducing irradiation efficiency and uniformity of irradiation intensity distribution in a desired imaging region. Therefore, according to this embodiment, by using such a transceive coil, there can be constituted an MRI device that imparts spaciousness to a test subject, and an MRI device with which a space for installing various instruments can be secured in the examination space.

For this embodiment, the configuration shown in FIG. 7 was exemplified as the configuration of the RF signal divider/combiner 307 connecting the transceive coil 301-1, the transmitter 303, and the receiver 304 via the transmit/receive switching units 302. However, internal wiring of the RF signal divider/combiner 307 is not limited to the above one. It is sufficient that amplitudes and phases of the input signal and the output signal of the RF signal divider/combiner 307 are in the same relationship.

Further, in the explanation of this embodiment, both the phase difference of the high-frequency signals applied to the first driving port 315A and the second driving port 315B and the phase difference of the high-frequency signals applied to the third driving port 325A and the fourth driving port 325B are 180 degrees. However, they are not limited to such a difference. The phase differences may be in such a range that the irradiation efficiency is not halved or further reduced, and the uniformity of irradiation intensity distribution does not become the aforementioned value, 17.6%, or lower, and it may be, for example, a value near 180 degrees. In other words, the phase differences may be such a difference that the synthesized magnetic field of the first high-frequency magnetic field $B_y$ 830 irradiated from the first RF coil 310 and the second high-frequency magnetic field $B_x$ 840 irradiated from the second RF coil 320 becomes a magnetic field rotating in an x-y plane as seen in the z-axis direction of the coordinate system 20, i.e., a circularly polarized magnetic field.

Further, in the example shown in FIGS. 3A to 5B, the transceive coil 301-1 is disposed so that the plane of symmetry 22 thereof is parallel to the y-z plane of the coordinate system 20. However, disposition of two of the first RF coils 310A and 310B and two of the second RF coils 320A and 320B is not limited to such a disposition.

Figure 15:
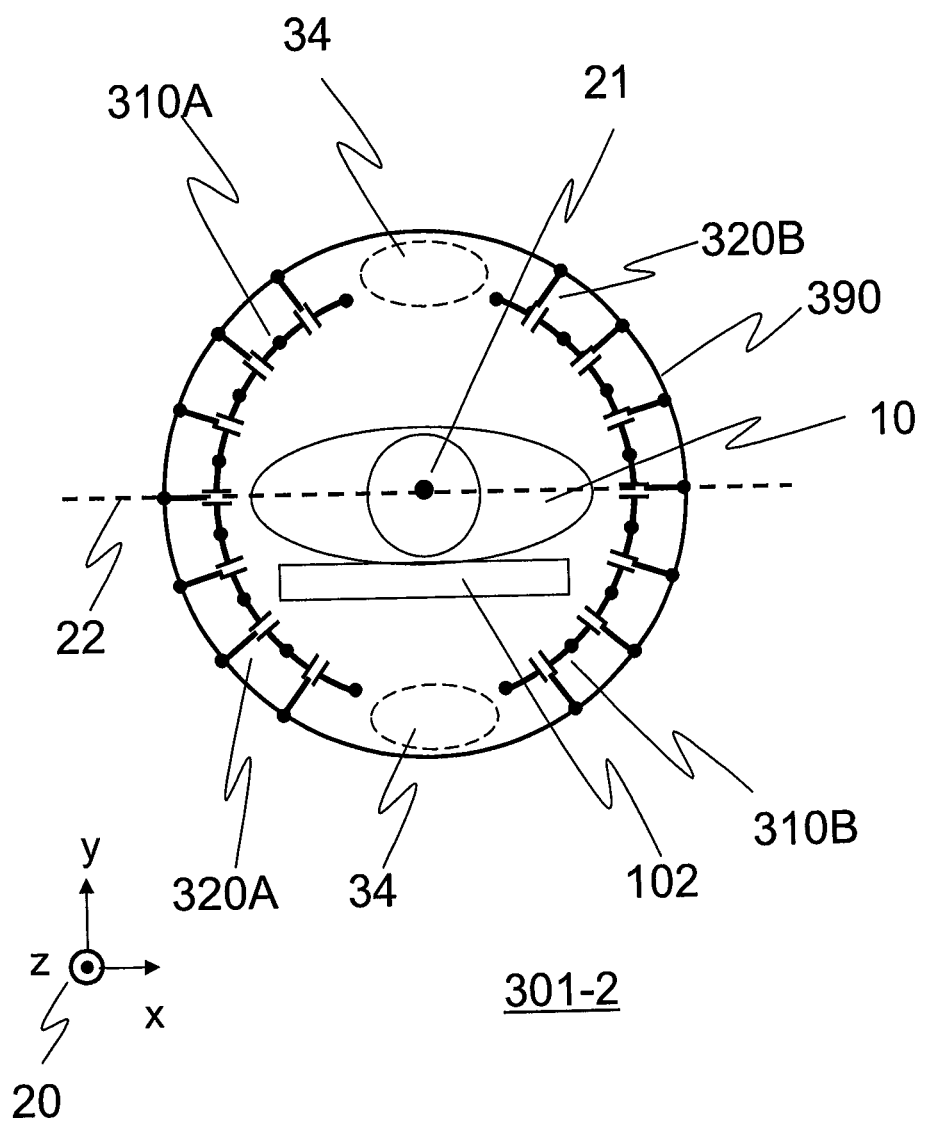
FIG. 15 is an explanatory view for explaining a modification of a transceive coil according to the first embodiment.

A transceive coil 301-2 corresponding to a modification of the disposition of the first RF coil 310 and the second RF coil 320 is shown in FIG. 15. In the transceive coil 301-2, they are disposed so that the plane of symmetry 22 is parallel to the x-z plane of the coordinate system 20. FIG. 15 shows the transceive coil 301-2 seen in the direction of the central axis 21. In addition, the driving ports are not shown in this drawing.

The transceive coil 301-2 corresponds to the transceive coil 301-1 shown in FIGS. 3A and 3B rotated by 90 degrees around the central axis 21, and the other configurations thereof are the same as those of the transceive coil 301-1 shown in FIGS. 3A and 3B. Therefore, the transceive coil 301-2 operates as the transceive coil 116 based on the QD method like the transceive coil 301-1. That is, if the transceive coil 301-2 is used as the transceive coil 301, the same effect as that obtained by using the transceive coil 301-1 can be obtained.

Further, in the transceive coil 301-2, the first RF coil 310 and the second RF coil 320 are disposed as shown in FIG. 15, and the spaces 34 where the coils do not exist are thereby secured at the both ends for the y-axis direction in the RF shield 390. For example, when the test subject 10 lays on the subject's back on the patient table 102 as shown in FIG. 15, the space looked up by the test subject 10 is expanded. Therefore, the transceive coil 301-2 shows more significant effect for suppressing visual oppression of the test subject 10. Furthermore, the space above the test subject 10 is suitable for disposition of an instrument such as a visual stimulus apparatus for cerebral function measurement, and so forth. Therefore, if the transceive coil 301-2 is used, an installation space suitable for such an instrument can be secured.

As explained above, according to the transceive coil 301-2, which is a modification of this embodiment, there can be provided a transceive coil for a tunnel type MRI device, with which a larger examination space can be secured for the space from which parts of cylindrical RF coils are removed compared with a birdcage coil, without significantly reducing irradiation efficiency and uniformity of irradiation intensity distribution in a desired imaging region. Furthermore, since the space looked up by the test subject is expanded, visual oppression imposed on the test subject can be reduced, and an installation space for various instruments such as visual stimulus apparatus for cerebral function measurement can be secured in the examination space.

Further, in the explanation of the aforementioned embodiment, in order to adjust the resonance frequency of the first RF coil 310, the first capacitors 313 were disposed in the second conductors 312. However, disposition scheme of the capacitors is not limited to the above one. Capacitors may also be disposed in the first conductors 311. A transceive coil 301-3 corresponding to this case is shown in FIG. 16. The driving ports are not shown in this drawing.

This transceive coil 301-3 is further provided with third capacitors 314 in the first conductors 311 of two of the first RF coils 310A and 310B. FIG. 16 shows the transceive coil 301-3 obliquely seen from the side.

With such a configuration, the resonance frequency can be adjusted by using the first capacitors 313 and the third capacitors 314. Therefore, in addition to the effect obtained by the transceive coil 301-1, degree of freedom for setting values of both the capacitors is increased, and the design of the coil becomes easier.

If the third capacitors 314 are disposed in the first conductors 311, the number of the resonant modes of the first RF coil 310 does not change, but distribution of the current flowing in the first RF coil 310 changes. With the change of the current distribution, magnetic field distribution also changes. Therefore, as in the case of the transceive coil 301-1, in order to obtain uniform magnetic field distribution in the resonant mode of the (N−1)th lowest frequency (seventh lowest frequency in the case of FIG. 16), the values of the first capacitors 313 and the third capacitors 314 are adjusted so that the following equation (1) is satisfied.

$$C_1/C_3 < M/L \qquad (1)$$

In the equation, $C_1$ is value of the first capacitors 313, $C_3$ is value of the third capacitors 314, L is inductance of the first conductors 311, and M is inductance of a part of the second conductor 312 between adjacent two of the first conductors 311.

<<Second Embodiment>>

Next, the second embodiment of the present invention will be explained. The MRI device of this embodiment is basically the same as that of the first embodiment. However, shapes of the RF shield, the first RF coil, and the second RF coil provided in the transceive coil are different. Hereafter, configurations different from those of the first embodiment will be explained. Also in this embodiment, it is supposed that the direction of the static magnetic field 900 generated by the magnet 101 of the horizontal magnetic field type is the same as the z-axis direction of the coordinate system 20.

Figure 17A:
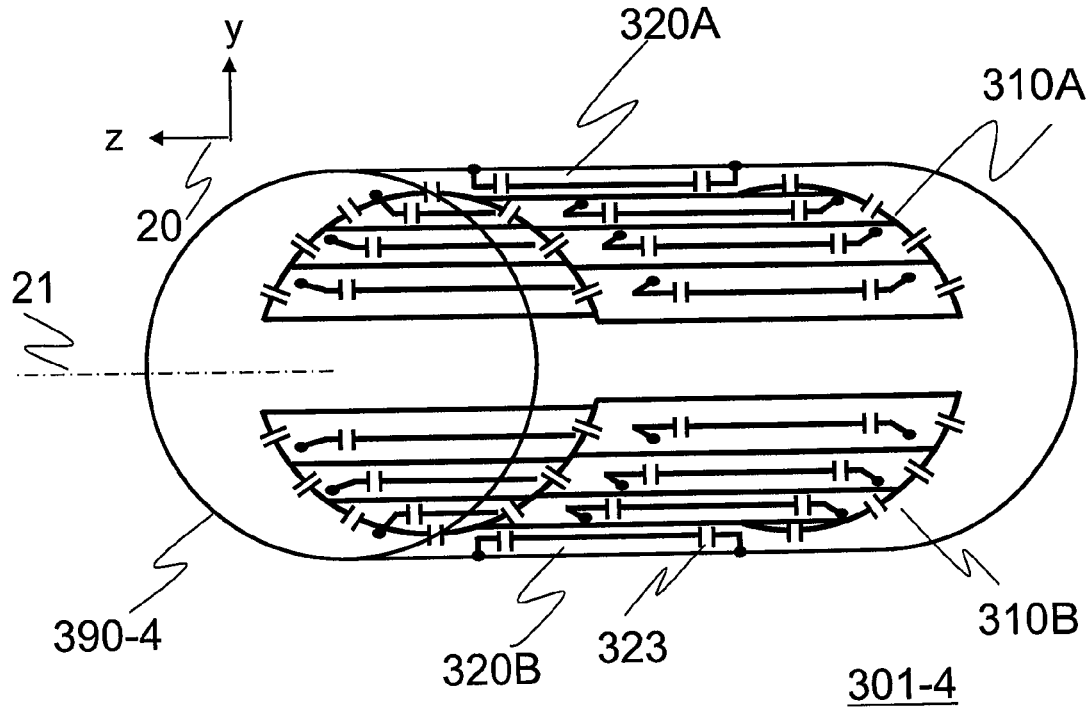
FIG. 17A is an explanatory view for explaining a transceive coil according to the second embodiment.
Figure 17B:
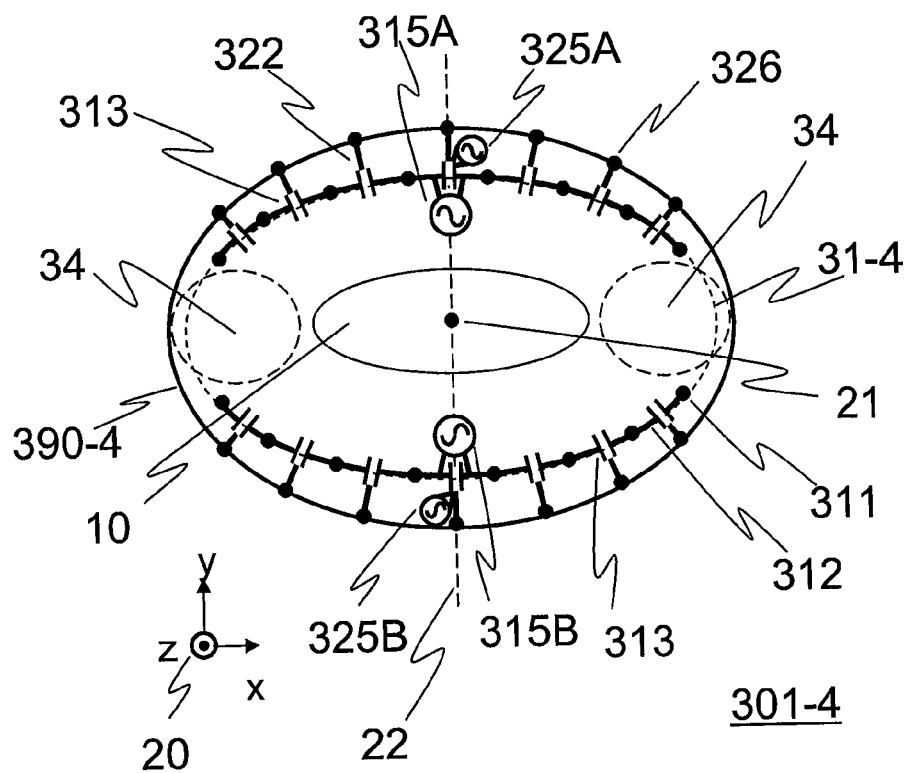
FIG. 17B is an explanatory view for explaining a transceive coil according to the second embodiment.

FIGS. 17A and 17B are drawings for explaining the configuration of a transceive coil 301-4 of this embodiment. FIG. 17A shows the transceive coil 301-4 obliquely seen from the side, and FIG. 17B shows the transceive coil 301-4 seen in the direction of the central axis 21. The first RF coils 310 (310A, 310B) and the second RF coils 320 (320A, 320B) are disposed so that the plane of symmetry 22 is parallel to the y-z plane of the coordinate system 20.

In the transceive coil 301-1, the RF shield 390 and the curved plane 31 in which the first conductors 311, the second conductors 312, and the third conductors 321 are disposed have cylindrical shapes. However, in the transceive coil 301-4 of this embodiment, an RF shield 390-4 and a curved plane 31-4 in which the first conductors 311, the second conductors 312, and the third conductors 321 are disposed have elliptic cylindrical shapes of which elliptic section has the major axis in the x-axis direction of the coordinate system 20. Further, the distance between the RF shield 390-4 and the curved plane 31-4 is the maximum at the position of the plane of symmetry 22, and becomes smaller as the position separates from the plane of symmetry.

Since the transceive coil 301-4 of this embodiment has such a shape as shown in these drawings, if the minor axis (diameter for the y-axis direction) of the RF shield 390-4 has the same length as the diameter of the RF shield 390 for the y-axis direction, the diameter for the x-axis direction becomes longer than the diameter of the RF shield 390. Therefore, the space 34 between the test subject 10 and the RF shield is expanded compared with that of the transceive coil 301-1.

Values of a plurality of the first capacitors 313 and the second capacitors 323 disposed in the transceive coil 301-4 are adjusted for every disposition position. The adjustment method will be explained below.

In the case of the first RF coil 310, the distance from the RF shield 390-4 is the maximum at the position of the plane of symmetry 22 and becomes narrower as the position separates from the plane of symmetry 22, and therefore, the remoter the location of the first conductor 311 from the plane of symmetry 22, the lower equivalent inductance thereof. Therefore, first, values of the first capacitors 313 are adjusted for each of a plurality of the loops 316 each constituted by adjacent two of the first conductors 311 and the second conductors 312 so that the resonance frequencies of the loops 316 for the operation as a single loop are the same frequencies. While such a state is maintained, in the case of using N of the first conductors 311 (8 in the example shown in FIGS. 17A and 17B), values of the first capacitors 313 are adjusted so that the (N−1)th lowest resonance frequency (7th lowest resonance frequency in the example shown in FIGS. 17A and 17B), among the plurality of the resonance frequencies of the first RF coil 310, is the same as the magnetic resonance frequency used in the transceive coil 301-4. As a result of such an adjustment as described above, the first RF coil 310 resonates in the optimal resonant mode.

On the other hand, in the second RF coil 320, values of the second capacitors 323 are adjusted for each of the half-loops 327 disposed in a plural number so that the resonance frequencies for the operation as a single half-loop 327 are the same frequencies. While such a state is maintained, values of the second capacitors 323 are adjusted so that the lowest resonance frequency among a plurality of resonance frequencies of the second RF coil 320 is the same as the magnetic resonance frequency used in the transceive coil 301-4.

Next, it will be explained that the transceive coil 301-4 adjusted as described above irradiates a high-frequency magnetic field on the test subject 10, detects magnetic resonance signals generated from the test subject 10, and outputs them as detected signals. The connection scheme between the transceive coil 301-4 and the transmitter 303 is the same as that of the first embodiment. That is, a high-frequency signal applied from the transmitter 303 is divided into four signals by the transmit/receive switching units 302, and they are applied to the first driving port 315A, the second driving port 315B, the third driving port 325A, and the fourth driving port 325B of the transceive coil 301-4, respectively. Both the phase difference of the signals applied to the first driving port 315A and the second driving port 315B, and the phase difference of the signals applied to the third driving port 325A and the fourth driving port 325B are 180 degrees, and the phase difference of the signals applied to the first driving port 315A and the third driving port 325A is 90 degrees.

Operation of two of the first RF coils 310A and 310B in the case where the high-frequency signals of which phase difference is 180 degrees are applied to the first driving port 315A and the second driving port 315B, respectively will be explained with reference to FIGS. 18A and 18B. For ease of the explanation, the second RF coil 320 is not shown in FIGS. 18A and 18B.

The first RF coil 310 is adjusted as described above so that it resonates in the optimal resonant mode. Therefore, as in the first embodiment, the RF current 810 flows in the conductors of the first RF coil 310 as shown in FIG. 18A. That is, on the first conductors 311, the RF current 810 flows in opposite directions on both sides of the first driving port 315A or the second driving port 315B, and the intensity thereof increases in proportion to the distance from the first driving port 315A or the second driving port 315B. Further, in each of the second conductors 312, the RF current 810 flows in one direction, and the intensity thereof decreases from the first driving port 315A or the second driving port 315B towards one of the both ends of the second conductor 312.

Figure 18A:
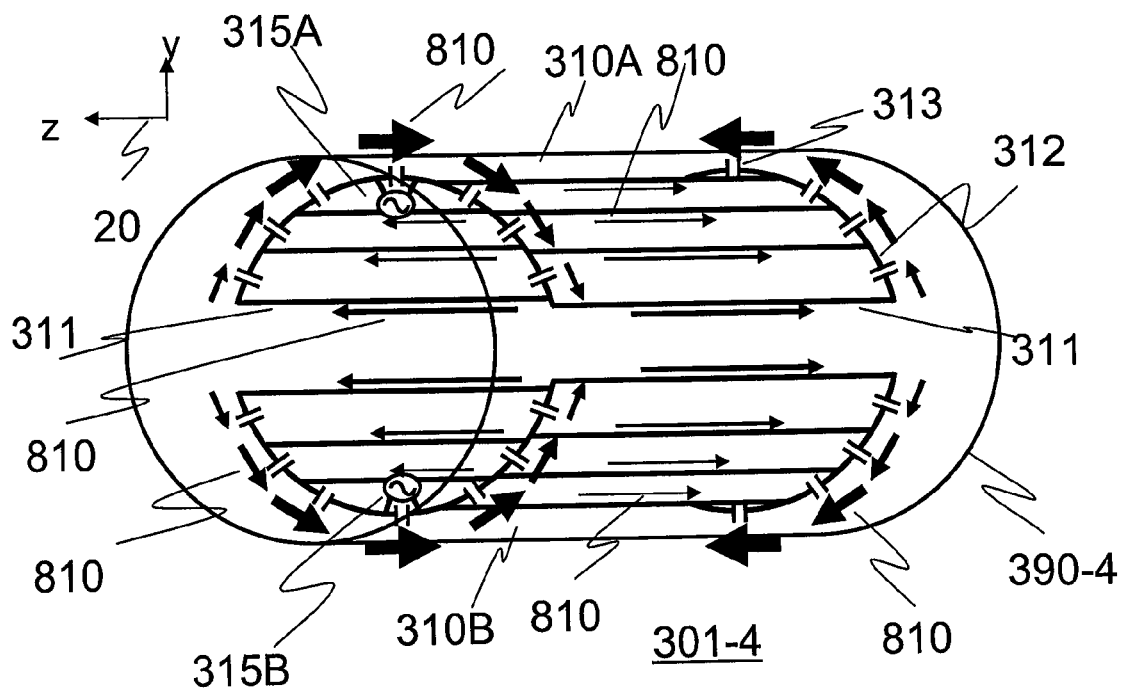
FIG. 18A is an explanatory view for explaining current distribution in a first RF coil according to the second embodiment.

In FIG. 18A, magnitude of the amplitude of the RF current 810 is indicated with the thickness of the arrows, and direction along which the electric current flows is indicated with the direction of the arrows. Further, since the phase difference of the high-frequency signals applied to the first driving port 315A and the second driving port 315B is 180 degrees, directions and intensities of the electric currents flowing in two of the first RF coils 310 are symmetric with respect to the y-axis direction of the coordinate system 20.

Figure 18B:
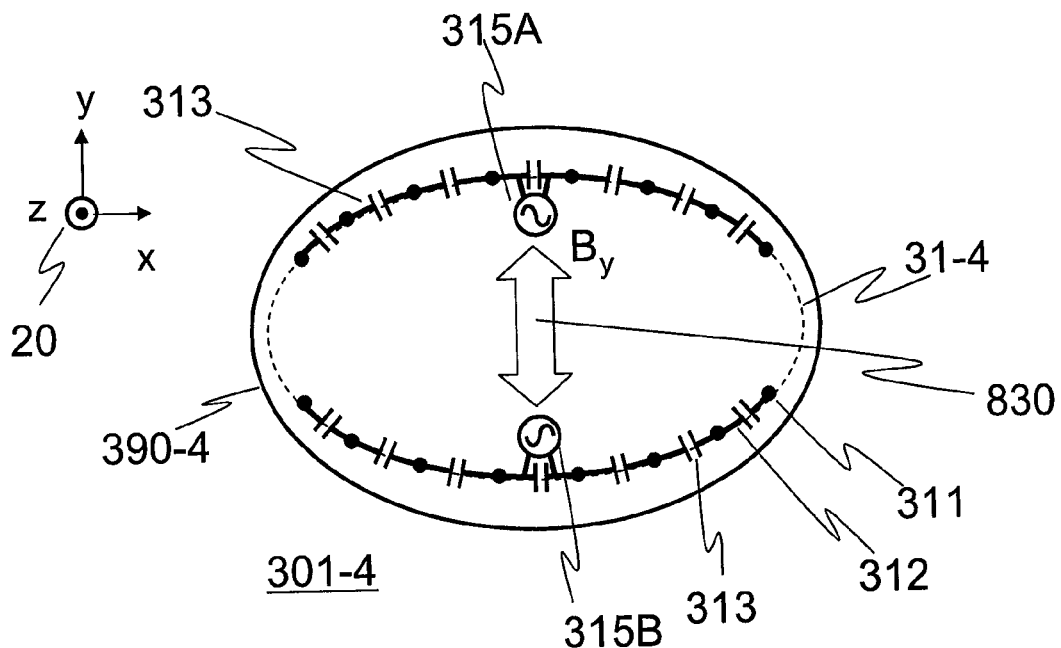
FIG. 18B is an explanatory view for explaining a magnetic field generated by a first RF coil according to the second embodiment.

With this RF current 810, a first high-frequency magnetic field $B_y$ 830 shown in FIG. 18B vibrating in a direction parallel to the y-axis of the coordinate system 20 is generated at the center of the transceive coil 301-4 according to the Biot-Savart law.

Next, operation of two of the second RF coils 320 in the case where high-frequency signals of which phase difference is 180 degrees are applied to the third driving port 325A and the fourth driving port 325B will be explained with reference to FIGS. 19 to 20C. For ease of explanation, the first RF coil 310 is not shown in FIGS. 19 to 20C.

Figure 19:
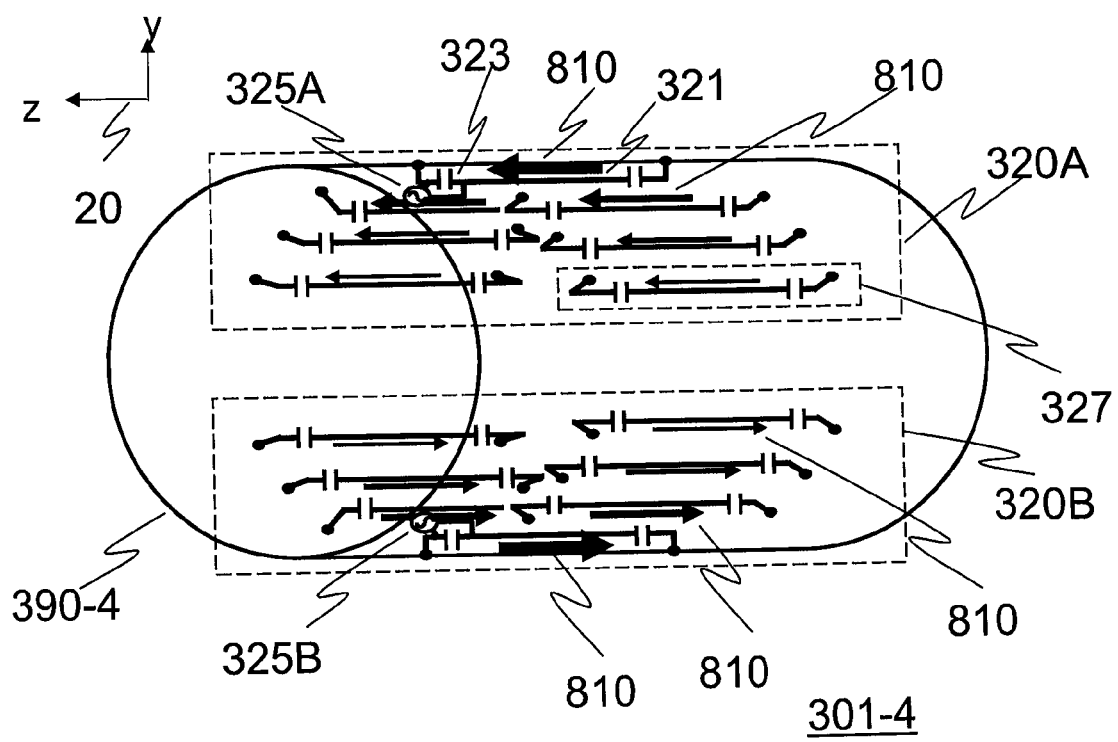
FIG. 19 is an explanatory view for explaining distribution of electric current flowing in a second RF coil according to the second embodiment.

As in the first embodiment, in the resonant mode of the lowest frequency, the RF current 810 flows in the half-loops 327 in the same direction, and intensity of the electric current becomes lower in a more outer half-loop 327 as shown in FIG. 19. The intensity of the RF current 810 flowing in the half-loops 327 is symmetric with respect to the plane of symmetry 22 shown in FIG. 17B. In FIG. 19, magnitude of the amplitude of the RF current 810 is indicated with the thickness of the arrows, and direction along which the electric current flows is indicated with the direction of the arrows. As for the direction and intensity of the electric currents flowing in two of the second RF coils 320, since the phase difference of the high-frequency signals applied to the third driving port 325A and the fourth driving port 325B is 180 degrees, directions of the electric currents flowing in the second RF coil 320A and the second RF coil 320B shown in FIG. 19 are opposite to each other.

Figure 20A:
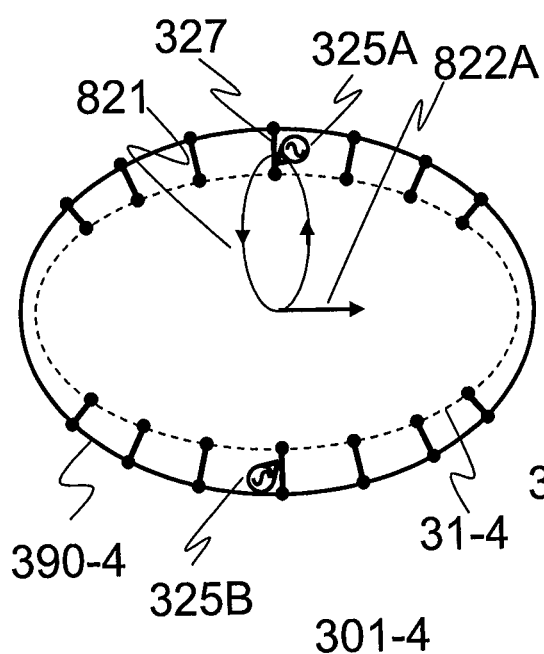
FIG. 20A is an explanatory view for explaining the principle of generation of magnetic field by a second RF coil according to the second embodiment.
Figure 20B:
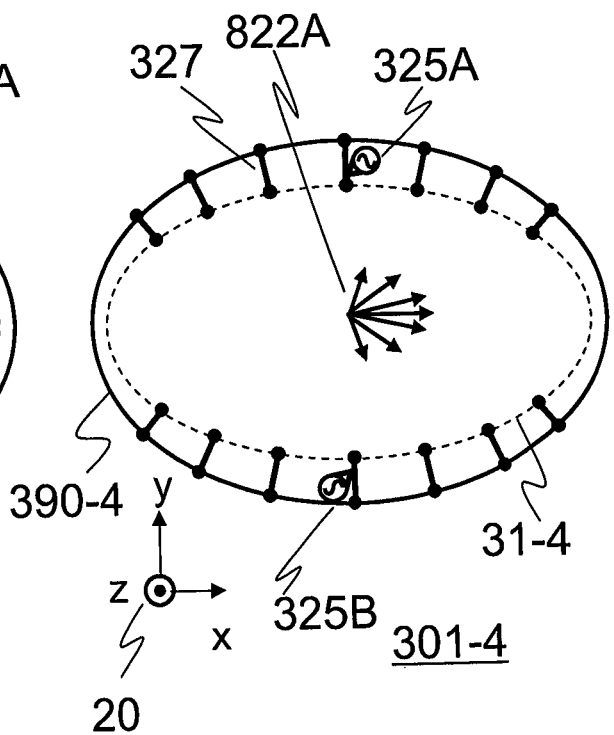
FIG. 20B is an explanatory view for explaining the principle of generation of magnetic field by a second RF coil according to the second embodiment.
Figure 20C:
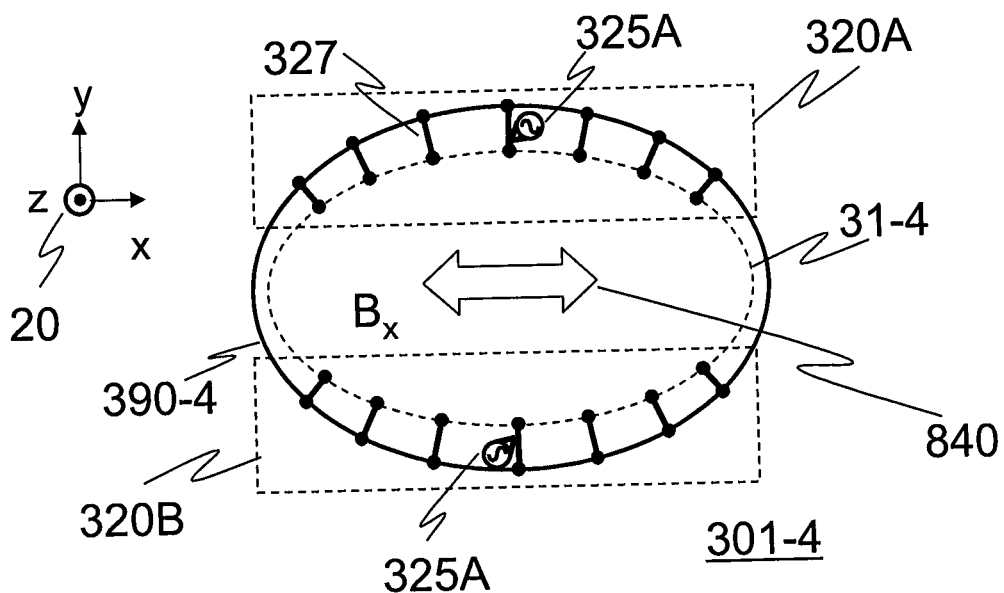
FIG. 20C is an explanatory view for explaining a magnetic field generated by a second RF coil according to the second embodiment.

As shown in FIG. 20A, the RF current 810 flowing in the half-loop 327 in which the third driving port 325A is disposed generates a magnetic flux 821, and direction of the magnetic field vector 822A at the center of the transceive coil 301-4 is a direction perpendicular to the plane defined by this half-loop 327. In this example, it is the same direction as that of the x-axis of the coordinate system 20. Directions of high-frequency magnetic fields generated by the other half-loops 327 of the second RF coil 320A are similarly directions perpendicular to the planes defined by the'half-loops 327. Therefore, the high-frequency magnetic field generated by all of the half-loops 327 constituting the second RF coil 320A is represented by a synthesis of seven magnetic field vectors 822A shown in FIG. 20B. Since seven of the half-loops 327 are symmetrically disposed with respect to the plane of symmetry 22, the magnetic field vectors 822A generated by the half-loops 327 are symmetric with respect to the y-axis direction of the coordinate system 20. Therefore, if seven of the magnetic field vectors 822A are synthesized, components for the y-axis direction of the coordinate system 20 are canceled, and a high-frequency magnetic field is generated in a direction parallel to the x-axis of the coordinate system 20.

Further, the same shall apply to the high-frequency magnetic field generated by all of the half-loops 327 of the second RF coil 320B. That is, components of the y-axis direction of the magnetic field vectors at the center of the transceive coil 301-4 are canceled, and a high-frequency magnetic field is generated in the direction parallel to the x-axis of the coordinate system 20.

In such a case, the direction of the electric current flowing in the second RF coil 320A, and the direction of the electric current flowing in the second RF coil 320B are opposite to each other as shown in FIG. 19, and therefore the direction of the magnetic field generated by the second RF coil 320A and the direction of the magnetic field generated by the second RF coil 320B are the same. Since the flowing direction of the RF current 810 is reversed on a certain cycle, two of the second RF coils 320 generate a second high-frequency magnetic field $B_x$ 840 vibrating in the direction parallel to the x-axis of the coordinate system 20 at the center of the transceive coil 301-4, as shown in FIG. 20C.

Figure 21:
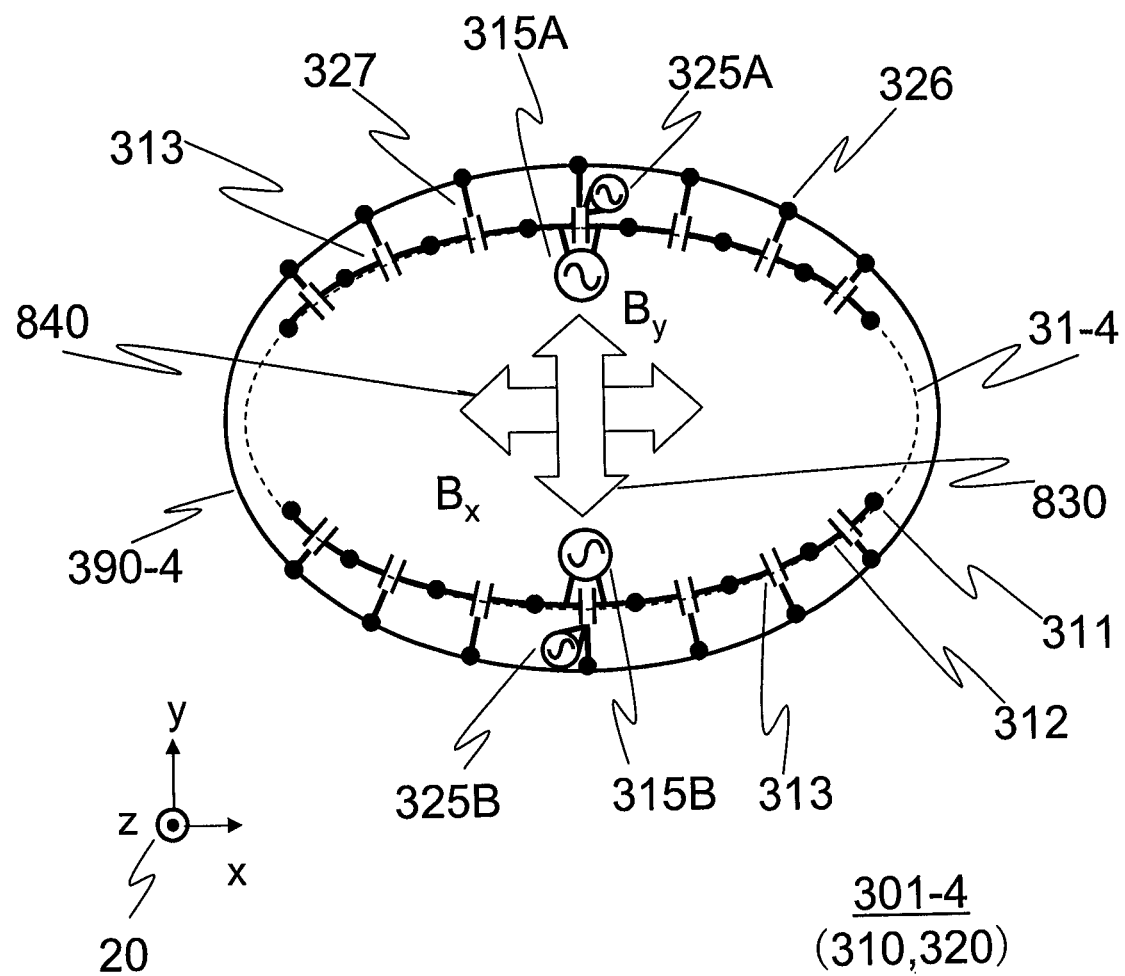
FIG. 21 is an explanatory view for explaining magnetic fields generated by a transceive coil according to the second embodiment.

The directions of the first high-frequency magnetic field $B_y$ 830 generated by two of the first RF coil 310, and the second high-frequency magnetic field $B_x$ 840 generated by two of the second RF coils 320 are perpendicular to each other as shown in FIG. 21. Further, both the phase difference of the high-frequency signals applied to the first driving port 315A and the third driving port 325A and the phase difference of the high-frequency signals applied to the second driving port 315B and the fourth driving port 325B are 90 degrees. This is because the high-frequency signals sent from the transmitter 303 are divided by the QD hybrid 341 into signals of a phase difference of 90 degrees. Therefore, the phase difference of the first high-frequency magnetic field $B_y$ 830 and the second high-frequency magnetic field $B_x$ 840 is 90 degrees, and the synthesized magnetic field of the first high-frequency magnetic field $B_y$ 830 and the second high-frequency magnetic field $B_x$ 840 is a magnetic field rotating in an x-y plane seen in the direction of the z-axis of the coordinate system 20. Therefore, the transceive coil 301-4 irradiates high-frequency magnetic fields of two directions perpendicular to each other with shifting the phase of one of the high-frequency magnetic fields by 90 degrees as in the QD irradiation method.

As described above, the synthesized magnetic field of the first high-frequency magnetic field $B_y$ 830 and the second high-frequency magnetic field $B_x$ 840 is a magnetic field rotating in an x-y plane as seen in the direction of the z-axis of the coordinate system 20. By applying such a high-frequency magnetic field, a magnetic resonance signal is emitted from the test subject 10 as a magnetic field rotating in an x-y plane as seen in the direction of the z-axis of the coordinate system 20. The transceive coil 301-4 detects the magnetic field rotating in an x-y plane by the QD method as in the case where a high-frequency magnetic field is irradiated, according to the reciprocity law.

As described above, the transceive coil 301-4 shown in FIG. 17 operates in the same manner as that of a transceive coil based on the QD method.

Next, degree of improvement in efficiency of the irradiation based on the QD method provided by the transceive coil 301-4 of this embodiment will be shown, which was obtained by electromagnetic field simulation.

The specification of the used transceive coil 301-4 was as follows. The diameter of the RF shield 390-4 of an elliptic cylindrical shape in the major axis direction was 720 mm, the diameter of the same in the minor axis direction was 640 mm, and the length of the same was 1000 mm. The length of the first conductors 311 of the first RF coil 310 was 520 mm, and the number of the same was 12. The length of the third conductors 321 of the second RF coil 320 was 520 mm, and the number of the half-loops was 9. The first RF coil 310 and the second RF coil 320 were disposed in the elliptic cylindrical curved plane 31 having a diameter in the major axis direction of 700 mm, and a diameter in the minor axis direction of 600 mm, so that the coils did not exist in a region of ±75 mm from the central axis 21 for the y-axis direction of the coordinate system 20. Further, the values of the capacitors were adjusted so that the resonance frequency of the transceive coil 301-4 should be 128 MHz.

In the transceive coil 301-4 of the above example, irradiation intensity per 1 W at the center of the coil obtained by irradiation only with the first RF coil 310 was 0.099 [A/m/$\sqrt{W}$], and irradiation intensity per 1 W at the center of the coil obtained by irradiation with the first RF coil 310 and the second RF coil 320 was 0.14 [A/m/$\sqrt{W}$]. The ratio of irradiation intensities obtained by irradiation only with the first RF coil and irradiation with the first RF coil and the second RF coil 320 was 1:1.41, and thus $\sqrt{2}$ times of improvement was obtained, which was comparable to improvement in irradiation intensity obtainable by the QD method. If it is taken into consideration that, in general, in order to obtain K times of irradiation intensity, $K^2$ times of irradiation electric power is required, the transceive coil 301-4 of this embodiment provided irradiation intensity comparable to that obtainable with twice of irradiation electric power, and it was demonstrated that it doubled the irradiation efficiency like the QD method.

Next, degree of expansion of the examination space provided by the transceive coil 301-4 of this embodiment and the result of the comparison of irradiation intensity and uniformity of irradiation intensity distribution thereof with those of a conventionally used birdcage coil will be shown. The irradiation intensity distributions of both the coils were obtained by electromagnetic field simulation.

The specification of the used transceive coil 301-4 was the same as that used for confirming the improvement in irradiation efficiency described above. The birdcage coil used as the object of the comparison was a 16-rung high pass birdcage coil of a length of 500 mm using an RF shield having an elliptic cylindrical shape of the same size as that of RF shield 390-4 and disposed in an elliptic cylindrical curved plane of the same size as that of the curved plane 31-4.

In both the coils, values of the capacitors were adjusted so that the resonance frequency should be 128 MHz. As for the irradiation method, the QD irradiation according to the method explained for this embodiment was performed with the transceive coil 301-4, and irradiation according to the usual QD method was performed with the elliptic cylindrical birdcage coil.

In the transceive coil 301-4, the intersection of the section passing the centers of the first conductors for the longitudinal direction and the central axis 21 was defined as the point of origin, and in the birdcage coil, the intersection of the section passing the center of the birdcage coil for the longitudinal direction and the central axis was defined as the point of origin. In the transceive coil 301-4, average of irradiation intensity per 1 W in a region having a radius of 150 mm from the point of origin as the center in a plane passing the point of origin and perpendicular to the central axis 21 was 0.14 [A/m/$\sqrt{W}$], and uniformity of irradiation intensity distribution in the same region was 15.0%. In contrast, in the 16-rung high pass elliptic cylindrical birdcage coil, average of irradiation intensity per 1 W in a region having a radius of 150 mm from the point of origin as the center in a plane passing the point of origin and perpendicular to the central axis 21 was 0.15 [A/m/$\sqrt{W}$], and uniformity of irradiation intensity distribution in the same region was 3.6%. The uniformity of irradiation intensity distribution is a ratio of difference of the maximum and minimum values of irradiation intensity in a predetermined region to the sum of the maximum and minimum values represented in terms of percentage.

As described above, the irradiation intensity of the transceive coil 301-4 according to this embodiment was 93% of that of the 16-rung elliptic cylindrical high pass birdcage coil, with which the QD irradiation was performed, and it was demonstrated that substantially the same irradiation intensity as that of the conventional elliptic cylindrical birdcage coil was obtained. The uniformity of irradiation intensity distribution of the transceive coil 301-1 of this embodiment obtained by the electromagnetic field simulation was 15.0% as described above, and therefore it was demonstrated that the transceive coil 301-4 according to this embodiment had uniform irradiation intensity distribution of a satisfactory level for imaging.

On the other hand, as for the examination space, on the basis of the sizes of the transceive coil 301-4 and the elliptic cylindrical birdcage coil, the spaces 34 can be obtained on both sides of the test subject 10 for the x-axis direction, that is, additional spaces of 30 mm for the x-axis direction of the coordinate system 20 and ±75 mm for the y-axis direction of the coordinate system 20 can be obtained with the transceive coil 301-4 compared with the case of using the elliptic cylindrical birdcage coil.

As explained above, according to this embodiment, a transceive coil of which examination space for placing a test subject is expanded can be provided without significantly reducing irradiation efficiency and uniformity of irradiation intensity distribution in a desired imaging region. Further, since the RF shield and the RF coil have an elliptic cylindrical shape, the examination space can be further expanded for one direction. Therefore, with the transceive coil of this embodiment, an MRI device that gives spaciousness to a test subject, and an MRI device that can secure an installation space for various instruments in the examination space can be constituted.

In addition, also in this embodiment, the coils may be disposed so that the plane of symmetry 22 is parallel to the x-axis as in the first embodiment. Further, the third capacitors 314 may be disposed in the first conductors 311 as in the first embodiment. Furthermore, the distance between the RF shield 390-4 and the curved plane 31-4 may be made constant.

<<Third Embodiment>>

Next, the third embodiment of the present invention will be explained. The MRI device of this embodiment is basically the same as that of the first embodiment. However, in the MRI device of this embodiment, a transmit coil and a receive coil are separately disposed. Hereafter, configurations different from those of the first embodiment will be mainly explained. Also in this embodiment, it is supposed that the direction of the static magnetic field 900 generated by the magnet 101 of the horizontal magnetic field type is the same as the z-axis direction of the coordinate system 20.

Figure 22:
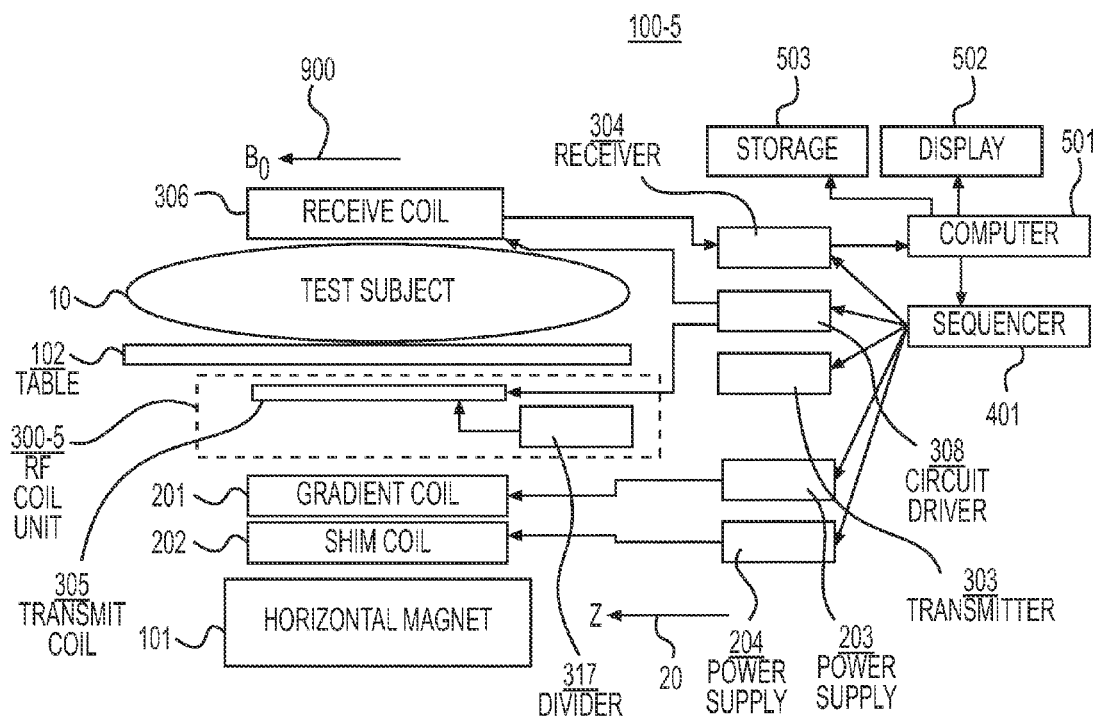
FIG. 22 is a functional block diagram showing a schematic configuration of an MRI device according to the third embodiment.

FIG. 22 is a block diagram showing a schematic configuration of an MRI device 100-5 according to this embodiment. The MRI device 100-5 according to this embodiment basically has the same configurations as those of the MRI device 100 according to the first embodiment. However, since it is separately provided with a transmit coil 305 and a receive coil 306, it is not provided with the RF signal divider/combiner 307, and the transmit/receive switching unit 302. As substitute for them, it is provided with a RF signal divider 317. The part constituted with the transmit coil 305 and the RF signal divider 317 is called an RF coil unit 300-5. Further, the transmit coil 305 is connected to the transmitter 303 via the RF signal divider 317, and the receive coil 306 is connected to the receiver 304.

The MRI device 100-5 according to this embodiment is further provided with a detuning circuit driver 308 for preventing magnetic coupling of the transmit coil 305 and the receive coil 306. The transmit coil 305 and the receive coil 306 are connected to the detuning circuit driver 308, and ON/OFF of the coils is switched according to a magnetic decoupling signal sent from the detuning circuit driver 308.

When a high-frequency magnetic field is applied to the test subject 10 from the transmit coil 305, a magnetic decoupling signal is sent to the receive coil 306 from the detuning circuit driver 308 according to a command sent from the sequencer 401. With this magnetic decoupling signal, the receive coil 306 is opened, and made to be in a non-operating state, and magnetic coupling thereof with the transmit coil 305 is prevented. On the other hand, when an RF signal generated from the test subject 10 is received with the receive coil 306, a magnetic decoupling signal is sent to the transmit coil 305 from the detuning circuit driver 308 according to a command sent from the sequencer 401. With this magnetic decoupling signal, the transmit coil 305 is opened, and made to be in a non-operating state, and magnetic coupling thereof with the receive coil 306 is prevented.

Next, the transmit coil 305 and the receive coil 306 according to this embodiment will be explained. The transmit coil 305 of this embodiment is shown in FIGS. 23A, 23B and 23C. FIG. 23A shows the transmit coil 305 seen from the side obliquely with respect to the direction of the z-axis of the coordinate system 20, and FIG. 23B is a drawing for explaining the details of the magnetic decoupling circuit 331 inserted into the transmit coil 305.

The transmit coil 305 shown in FIG. 23A has approximately the same configurations as those of the transceive coil 301-1 shown in FIGS. 3A and 3B. However, it has the magnetic decoupling circuits 331 on the first conductors 311 and the third conductors 321, respectively. The magnetic decoupling circuit 331 is provided with a PIN diode 332 and control lines 333 connected to the both ends of the PIN diode 332 as shown in FIG. 23B. The PIN diode 332 shows characteristics that it become substantially conductive for a direct current flowing along the forward direction of the diode and larger than a certain level, and ON/OFF is controlled with a direct current.

Further, the control lines 333 are connected to the both ends of the PIN diode 332. The PIN diode 332 is connected to an output terminal of the detuning circuit driver 308 via the control line 333 and a choke coil 334 that electrically insulates high-frequency signals. ON/OFF of the PIN diode 332 in the magnetic decoupling circuit 331 is controlled with a control current 335 sent from the detuning circuit driver 308. By this ON/OFF control, the magnetic decoupling circuit 331 makes the transmit coil 305 be in an operable state, when a high-frequency magnetic field is irradiated, and makes the transmit coil 305 have high impedance and thereby be in a non-operable state to prevent interference with the receive coil 306, when high-frequency signals are received. The details of this operation will be explained later.

Figure 24A:
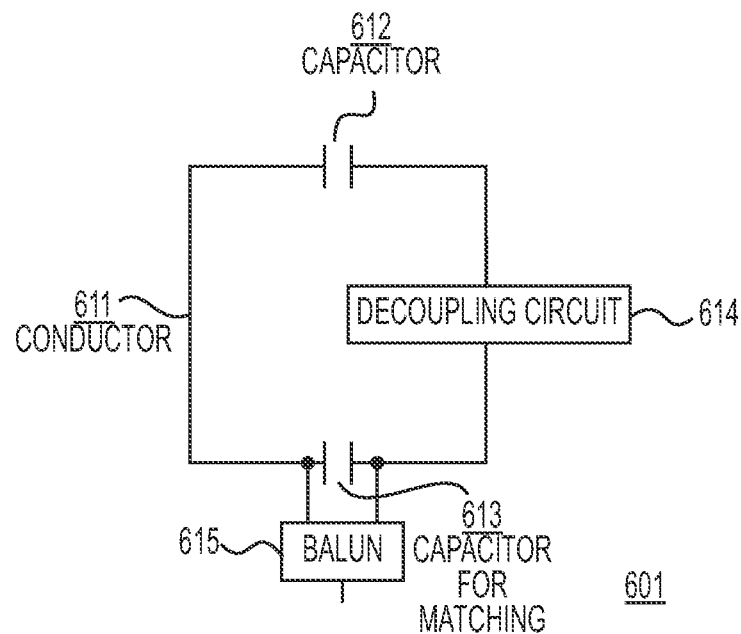
FIG. 24A is an explanatory view for explaining a configuration of a surface coil according to the third embodiment.
Figure 24B:
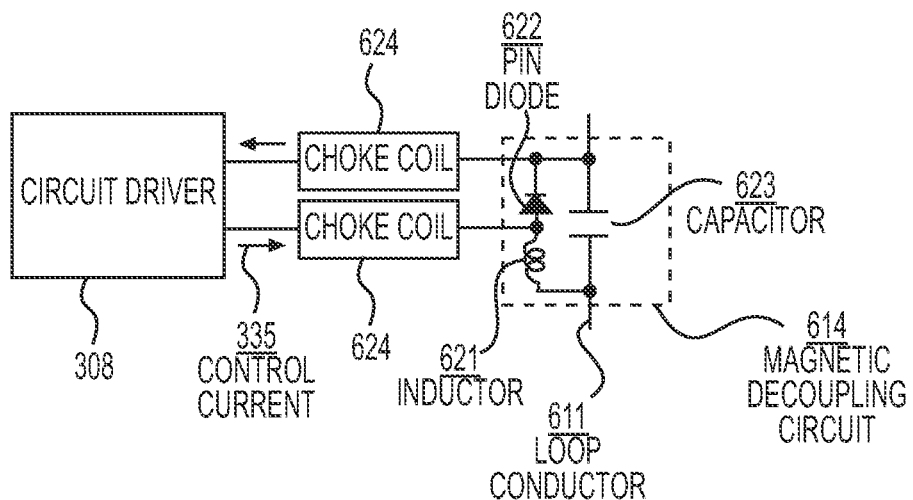
FIG. 24B is an explanatory view for explaining a magnetic decoupling circuit of a surface coil according to the third embodiment.

Next, a surface coil 601 used as the receive coil 306 of this embodiment is shown in FIGS. 24A and 24B. FIG. 24A is a drawing for explaining the configuration of the surface coil 601, and FIG. 24B is a drawing for explaining the details of a magnetic decoupling circuit 614 inserted into the surface coil 601 and the connection scheme with the detuning circuit driver 308.

The surface coil 601 is provided with a loop conductor 611, a capacitor 612, a capacitor 613 for matching, a magnetic decoupling circuit 614, and a balun 615 for canceling common mode noises. The capacitor 612, the capacitor 613 for matching, and the magnetic decoupling circuit 614 are inserted into the loop conductor 611, wirings are provided at the both ends of the capacitor 613 for matching and connected to the balun 615. The output of the balun 615 is connected to a preamplifier 402 shown in FIG. 25 explained later.

As shown in FIG. 24B, the magnetic decoupling circuit 614 is provided with a circuit consisting of an inductor 621 and a PIN diode 622, which are serially connected, and a capacitor 623 connected in parallel to the circuit. The PIN diode 622 has characteristics that it becomes substantially conductive for a direct current flowing along the forward direction of the diode and larger than a certain level, and ON/OFF is controlled with a direct current. Further, the both ends of the PIN diode 622 are connected to output terminals of the detuning circuit driver 308 via choke coils 624.

ON/OFF of the PIN diode 622 is controlled with the control current 335 sent from the detuning circuit driver 308. By this ON/OFF control, the magnetic decoupling circuit 614 makes the surface coil 601 function as the receive coil 601, when high-frequency signals are received, and makes the surface coil 601 have high impedance to prevent interference with the transmit coil 305, when a high-frequency magnetic field is transmitted. The details of this operation will be explained later.

Values of the capacitor 612, the capacitor 623, and the capacitor 613 for matching are adjusted so that the surface coil 601 resonates at a magnetic resonance frequency set in the MRI device 100-5 according to this embodiment, and impedance of the coil for the both ends of the capacitor 613 for matching becomes a predetermined value. Further, the magnetic decoupling circuit 614 is adjusted so that, when the PIN diode 622 is in the ON state, the inductor 621 and the capacitor 623 resonate at a magnetic resonance frequency set in the MRI device 100-5.

Next, positional relationship of the aforementioned transmit coil 305 and the receive coil 306 as well as connection scheme of the RF signal divider 317, the transmitter 303, and the receiver 304 will be explained with reference to FIG. 25. Explanation will be made here for an example using the surface coil 601 shown in FIG. 24A as the receive coil 306.

Figure 25:
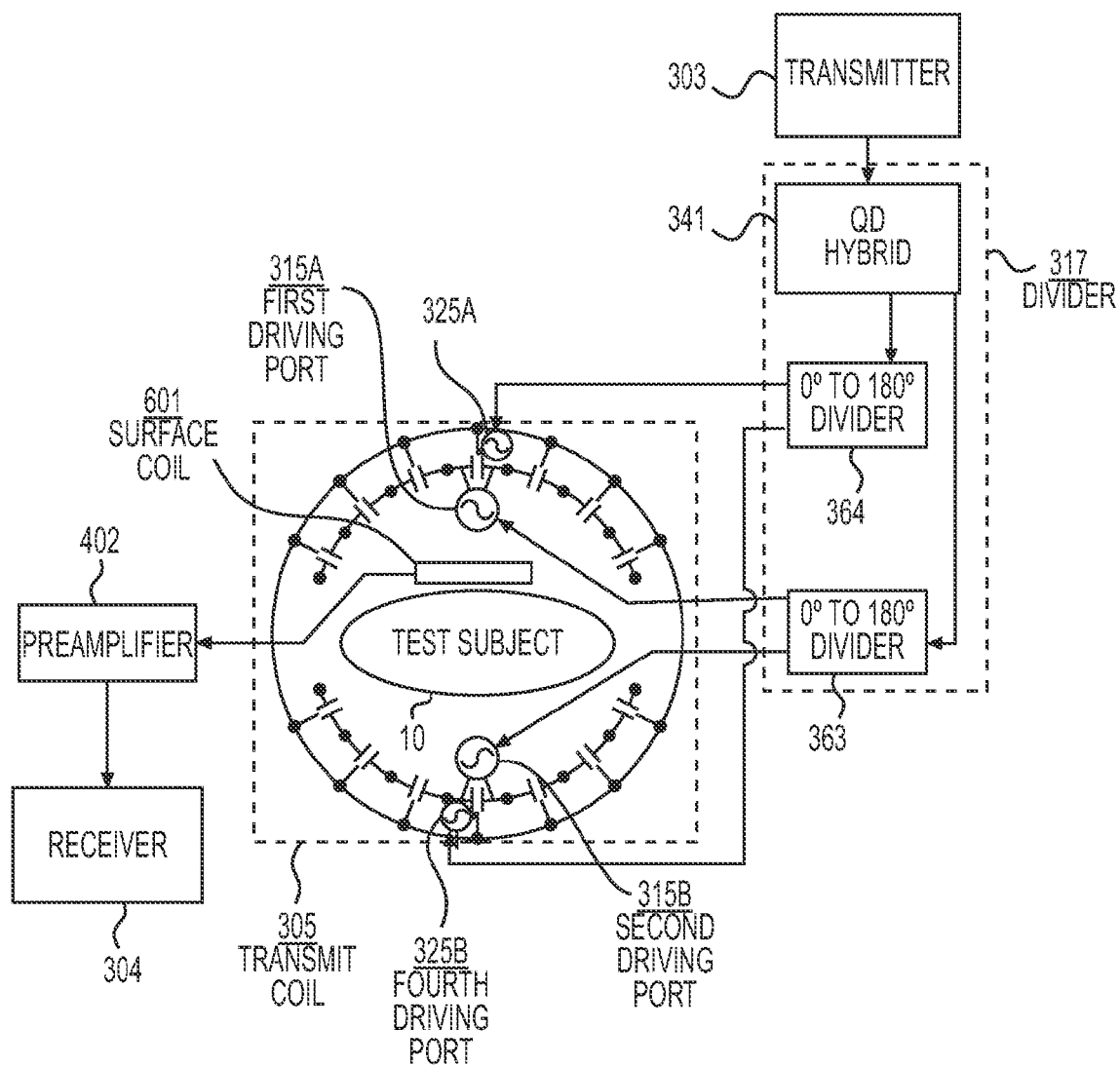
FIG. 25 is an explanatory view for explaining connection scheme of a transmit coil according to the third embodiment, an RF signal divider, a transmitter, and a receiver.

As shown in FIG. 25, output of the transmitter 303 is connected to the RF signal divider 317. The RF signal divider 317 is provided with the QD hybrid 341, and a 0°-180° divider (first 0°-180° divider 363 and second 0°-180° divider 364), which divides one high-frequency signal into two high-frequency signals of which phase difference of signal waveform is 180 degrees.

Also in this embodiment, the balun 345 for canceling common mode noises is provided between the first 0°-180° divider 363 and the corresponding driving port and between the second 0°-180° divider 364 and the corresponding driving port. However, for simplification of the drawing, the balun 345, the balun 615, the magnetic decoupling circuit 331 and the magnetic decoupling circuit 614 disposed in the transmit coil 305 and the surface coil 601, and the connection of the magnetic decoupling circuit 331, the magnetic decoupling circuit 614, and the detuning circuit driver 308 are not shown in FIG. 25.

The transmitter 303 is connected to the QD hybrid 341, and two outputs of the QD hybrid 341 are connected to the inputs of the first 0°-180° divider 363 and the second 0°-180° divider 364, respectively. Two of the outputs of the first 0°-180° divider 363 are connected to the first driving port 315A and the second driving port 315B of the transmit coil 305, respectively, and two of the outputs of the second 0°-180° divider 364 are connected to the third driving port 325A and the fourth driving port 325B, respectively.

The surface coil 601 is disposed near the test subject 10 placed in the inside of the transmit coil 305. The output of the surface coil 601 is connected to the preamplifier 402, and the output of the preamplifier is connected to the receiver 304.

Next, it will be explained that when the transmitter 303 applies a high-frequency signal, and the magnetic decoupling circuit 308 controls application of a magnetic decoupling signal according to directions sent from the sequencer 401, the transmit coil 305 operates as a coil that irradiates a high-frequency magnetic field on the test subject 10, and the surface coil 601 operates as a receive coil 306 with reference to FIGS. 22 to 25.

Immediately before a high-frequency signal is applied from the transmitter 303, the detuning circuit driver 308 applies a magnetic decoupling signal to the transmit coil 305 and the surface coil 601. For example, such a direct current as the control current 335 that the PIN diodes 332 and 622 are made to be in the ON state is applied as the magnetic decoupling signal. In the transmit coil 305, all the PIN diodes 332 are made to be in the ON state with the control current 335 flowing in the PIN diodes 332. When all of the PIN diodes 332 of the transmit coil 305 are in the ON state, the PIN diodes 332 are conductive, and therefore the transmit coil 305 shows the same electrical characteristics as those of the transceive coil 301-1 shown in FIGS. 3A and 3B.

On the other hand, in the surface coil 601, the PIN diode 622 is made to be in the ON state with the control current 335, and the magnetic decoupling circuit 614 becomes a parallel resonance circuit constituted with the inductor 621 and the capacitor 623. This parallel resonance circuit has high impedance at the magnetic resonance frequency set in the MRI device 100-5, and the loop conductor 611 of the surface coil 601 is substantially in an open state. As a result, the surface coil 601 does not resonate at a magnetic resonance frequency set in the MRI device 100-5, and electric current hardly flows in the loop conductor 611.

Therefore, the magnetic decoupling signal provides a state that magnetic coupling of the transmit coil 305 and the surface coil 601 does not occur. In this state, the transmit coil 305 can irradiate a high-frequency magnetic field on the test subject 10 without shift of the resonance frequency or reduction of the Q factor of the coil resulting from magnetic coupling.

After the control current 335 is applied by the detuning circuit driver 308, a high-frequency signal is applied by the transmitter 303. As shown in FIG. 25, this high-frequency signal is sent to the QD hybrid 341, and divided into two signals of which phase difference is 90 degrees. The divided high-frequency signals are inputted into the first 0°-180° divider 363 and the second 0°-180° divider 364, respectively. The first 0°-180° divider 363 divides the inputted high-frequency signal into two signals of which phase difference is 180 degrees. The divided signals are inputted to the first driving port 315A and the second driving port 315B, respectively. Similarly, the second 0°-180° divider 364 also divides the inputted high-frequency signal into two signals of which phase difference is 180 degrees. The divided signals are inputted to the third driving port 325A and the fourth driving port 325B, respectively.

As described above, when all the PIN diodes 332 are in the ON state, the transmit coil 305 operates in the same manner as the transceive coil 301-1. Therefore, as in the first embodiment, the transmit coil 305 that received the aforementioned signal irradiates a high-frequency magnetic field on the test subject 10 in the same manner as that of the QD method.

After the irradiation of the high-frequency magnetic field, in order to receive magnetic resonance signals emitted from the test subject 10, the detuning circuit driver 308 terminates the application of the magnetic decoupling signal to the transmit coil 305 and the surface coil 601. That is, the value of the control current 335 is made to be 0 so that the PIN diodes 332 and the diode 622 of the transmit coil 305 and the surface coil 601 are made to be in the OFF state. If the PIN diodes 332 of the transmit coil 305 are made to be in the OFF state, the first conductors 311 and the third conductors 321 are made to be in a substantially open state. As a result, electric current hardly flows in the conductors of the transmit coil 305. Therefore, the transmit coil 305 does not resonate at a magnetic resonance frequency set in the MRI device 100-5, and hardly generates magnetic field, either. On the other hand, in the surface coil 601, the diode 622 is made to be in the OFF state, and the magnetic decoupling circuit 614 operates as the capacitor 623. As a result, the surface coil 601 resonates at the magnetic resonance frequency set in the MRI device 100-5.

Therefore, when the magnetic resonance signals emitted from the test subject 10 are received, magnetic coupling of the surface coil 601 and the transmit coil 305 is not induced, and the surface coil 601 can receive the magnetic resonance signals with high sensitivity without shift of the resonance frequency or reduction of the Q factor of the coil due to magnetic coupling. The signals received by the surface coil 601 are amplified by the preamplifier 402, and sent to the receiver 304.

As explained above, the transmit coil 305 shown in FIG. 23A operates as a coil that irradiates a high-frequency magnetic field in the same manner as that of the QD method, and the surface coil 601 shown in FIG. 24A operates as the receive coil 306.

As described above, according to this embodiment, the surface coil 601 (receive coil 306) is made to have high impedance at the time of applying a high-frequency magnetic field, the transmit coil 305 is made to have high impedance at the time of receiving magnetic resonance signals, and thereby magnetic coupling of the transmit coil 305 and the receive coil 306, which resonate at a magnetic resonance frequency, can be prevented. And the transmit coil 305 can perform the irradiation in the same manner as that of the transceive coil 301-1 according to the first embodiment.

Therefore, according to this embodiment, even when the transmit coil 305 and the receive coil 306 are separately provided, the same effect as that of the first embodiment can be obtained. Further, as described above, even if the shape of the transmit coil 305 differs from the shape of the receive coil 306, the same effect as those of the aforementioned embodiments can be obtained.

Furthermore, according to this embodiment, it becomes possible to independently choose the shape of the transmit coil 305 and the shape of the receive coil 306. For example, as explained for the aforementioned embodiments, the transmit coil 305 that secures expanded examination space in which the test subject 10 is placed, and can irradiate a uniform high-frequency magnetic field can be used, and the surface coil 601 that can be disposed near the test subject 10 and receive magnetic resonance signals with high sensitivity can be used as the receive coil 306. Therefore, according to this embodiment, spaciousness can be given to the test subject 10, and a magnetic resonance image optimized for each test subject 10 can be obtained at the same time.

In addition, the shape of the transmit coil 305 is not limited to that explained for the aforementioned embodiment. It may be a coil that allows disposition of the magnetic decoupling circuit 331 and can be controlled so as not to cause interference with the receive coil 306. For example, it may be one in which the third capacitors 314 are provided in the first conductors 311, like the transceive coil 301-3. Further, the RF shield 390 and the curved plane 31 in which the first conductors 311, the second conductors 312, and the third conductors 321 are disposed may have other shapes such as an elliptic cylindrical shape having the major axis along the x-axis direction of the coordinate system 20, like the transceive coil 301-4. Furthermore, the coil may be disposed so that the plane of symmetry 22 is parallel with the x-axis.

Further, the shape of the receive coil 306 is not limited to that explained for the aforementioned embodiment, either. It may be a coil that allows disposition of the magnetic decoupling circuit 614 in the receive coil 306, and can be controlled so as not to cause interference with the transmit coil 305. For example, it may be an array coil in which the surface coils 601 are disposed in an array or a birdcage coil.

Furthermore, in the transmit coil 305, the PIN diode 332 is used for the magnetic decoupling circuit 331, but it is not indispensable configuration. For example, instead of the PIN diode 332, a cross diode 336 shown in FIG. 23C may also be used. The cross diode 336 is made to be in the ON state and thereby made conductive with the high-frequency signal applied to the transmit coil 305, and when the application of the high-frequency signal is terminated, it is made to be in the OFF state and a highly resistive state. This operation is the same as the operation of the PIN diode 332. If the cross diode 336 is used, the transmit coil 305 operates as the transmit coil 305 without causing magnetic coupling with the surface coil 601 even without control by the detuning circuit driver 308.

Figure 26A:
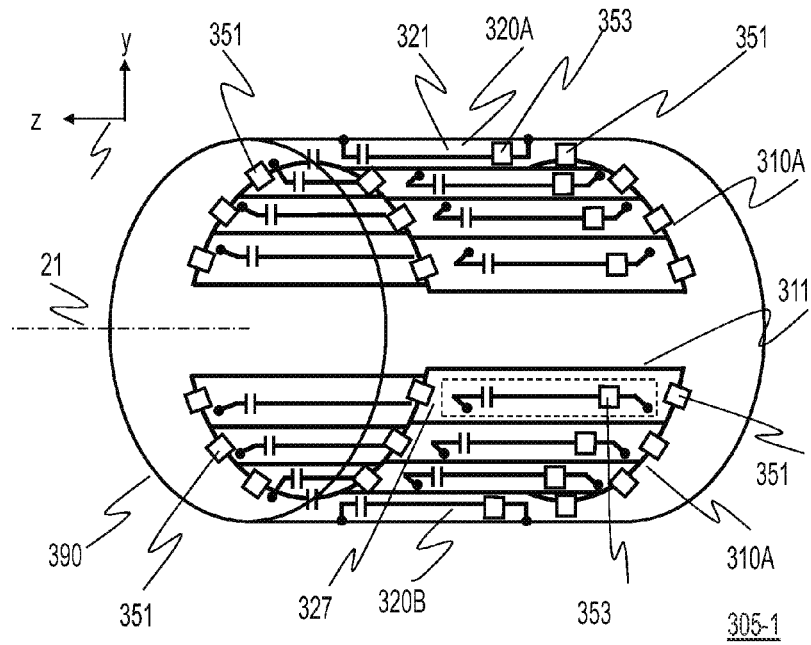
FIG. 26A is an explanatory view for explaining a configuration of a modification of a transmit coil according to the third embodiment.
Figure 26B:
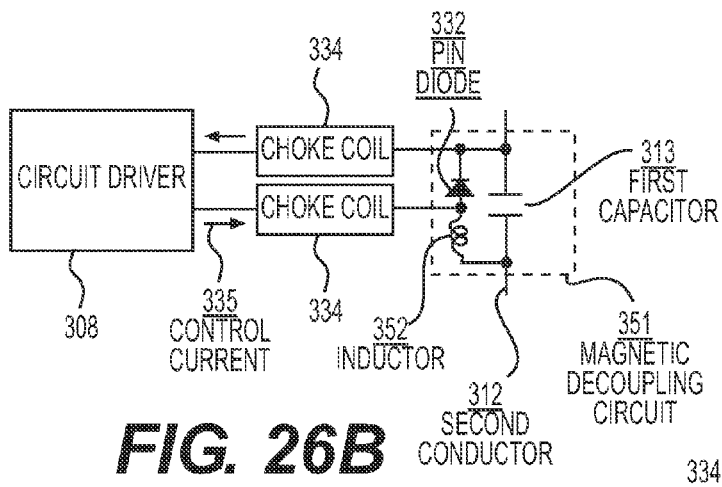
FIG. 26B is an explanatory view for explaining a magnetic decoupling circuit of a modification of a transmit coil according to the third embodiment.

Further, instead of either one of the first capacitors 313 and the second capacitors 323, a magnetic decoupling circuit may be provided. In this case, the magnetic decoupling circuit 331 is not provided in the first conductors 311 and the third conductors 321. The transmit coil 305-1 in this case is shown in FIGS. 26A and 26B. FIG. 26A shows the transmit coil 305-1 seen from the side obliquely with respect to the z-axis of the coordinate system 20, and FIGS. 26B and 26C show examples of a magnetic decoupling circuit 351 inserted instead of the first capacitor 313 and a magnetic decoupling circuit 353 inserted instead of the second capacitor 323.

As shown in FIG. 26B, the magnetic decoupling circuit 351 is provided with a circuit consisting of an inductor 352 and the PIN diode 332, which are serially connected, and the first capacitor 313 connected in parallel with the circuit. The PIN diode 332 has characteristics that it become substantially conductive for a direct current flowing along the forward direction of the diode and larger than a certain level, and ON/OFF is controlled with a direct current. Further, the both ends of the PIN diode 332 are connected to output terminals of the detuning circuit driver 308 via the choke coils 334.

Figure 26C:
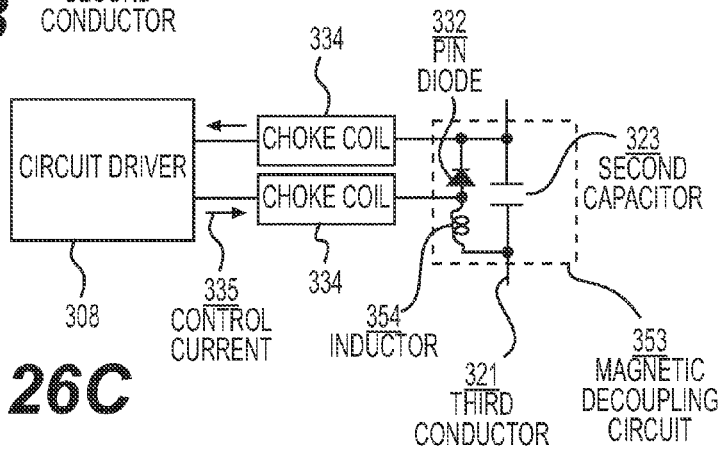
FIG. 26C is an explanatory view for explaining a magnetic decoupling circuit of a modification of a transmit coil according to the third embodiment.

Further, as shown in FIG. 26C, the magnetic decoupling circuit 353 is provided with a circuit consisting of an inductor 354 and the PIN diode 332, which are serially connected, and the second capacitor 323 connected in parallel with the circuit. The PIN diode 332 has characteristics that it become substantially conductive for a direct current flowing along the forward direction of the diode and larger than a certain level, and ON/OFF is controlled with a direct current. Further, the both ends of the PIN diode 332 are connected to output terminals of the detuning circuit driver 308 via the choke coils 334.

The magnetic decoupling circuit 351 is in an open state, when the PIN diode 332 is in the ON state, and operates as the first capacitor 313 when the PIN diode 332 is in the OFF state. Further, the magnetic decoupling circuit 353 is in an open state, when the PIN diode 332 is in the ON state, and operates as the second capacitor 323, when the PIN diode 332 is in the OFF state. Accordingly, the transmit coil 305-1 shows the same electrical characteristics as those of the transmit coil 305, when the PIN diode 332 is in the OFF state.

Therefore, immediately before applying a high-frequency signal for irradiating a high-frequency magnetic field from the transmitter 303, the detuning circuit driver 308 makes the value of the control current 335 to be 0 so that the PIN diodes 332 of the magnetic decoupling circuit 351 and the magnetic decoupling circuit 353 are in the OFF state. As a result, the transmit coil 305-1 operates as the transmit coil 305 when the high-frequency magnetic field is irradiated.

Further, after the high-frequency magnetic field is irradiated, the control current 335 is flown from the detuning circuit driver 308 into the magnetic decoupling circuit 351 and the magnetic decoupling circuit 353, so that the PIN diode 332 is in the ON state. The second conductor 312 and the third conductor 321 are thereby made to be in a substantially open state, and the transmit coil 305-1 no longer resonates at the magnetic resonance frequency set in the MRI device 100-5. Therefore, magnetic coupling of the surface coil 601 and the transmit coil 305-1 is eliminated, and the surface coil 601 can receive magnetic resonance signals with high sensitivity without shift of the resonance frequency and reduction of the Q factor of the coil due to magnetic coupling.

The explanation was made with reference to FIGS. 26A, 26B and 26C for a case where the magnetic decoupling circuits 331 disposed in the first RF coil 310 and the second RF coil 320 are both changed to the magnetic decoupling circuit 351 and the magnetic decoupling circuit 353, respectively. However, scheme of the change is not limited to the scheme mentioned above. Only the magnetic decoupling circuit 331 of the first RF coil 310 may be changed to the magnetic decoupling circuit 351, and whether the control current 335 is flown into the magnetic decoupling circuit 351 or not may be made opposite to whether it is flown into the magnetic decoupling circuit 331 or not. Further, only the magnetic decoupling circuit 331 of the second RF coil 320 may be changed to the magnetic decoupling circuit 353, and whether the control current 335 is flown into the magnetic decoupling circuit 353 or not may be made opposite to whether it is flown into the magnetic decoupling circuit 331 or not. In this case, the transmit coil 305-1 operates as the transmit coil 305, and whether the control current 335 is flown or not is appropriately determined before and after the irradiation of the high-frequency magnetic field, so that magnetic coupling with the surface coil 601 does not occur.

As explained above, two kinds of magnetic decoupling circuits are used for the transmit coil 305-1. Therefore, by appropriately using these magnetic decoupling circuits in the transmit coil 305-1, the degree of freedom for design can be increased.

<<Fourth Embodiment>>

Next, the fourth embodiment of the present invention will be explained. The MRI device of this embodiment is basically the same as that of the third embodiment. However, the MRI device of this embodiment is provided with two of transmitters, and high-frequency magnetic fields are separately supplied to the first RF coil and the second RF coil. In connection with this characteristic, a different configuration of the RF distributor is used. The configurations different from those of the third embodiment will be mainly explained below. Also in this embodiment, it is supposed that the direction of the static magnetic field 900 generated by the magnet 101 of the horizontal magnetic field type is the same as the z-axis direction of the coordinate system 20.

Figure 27:
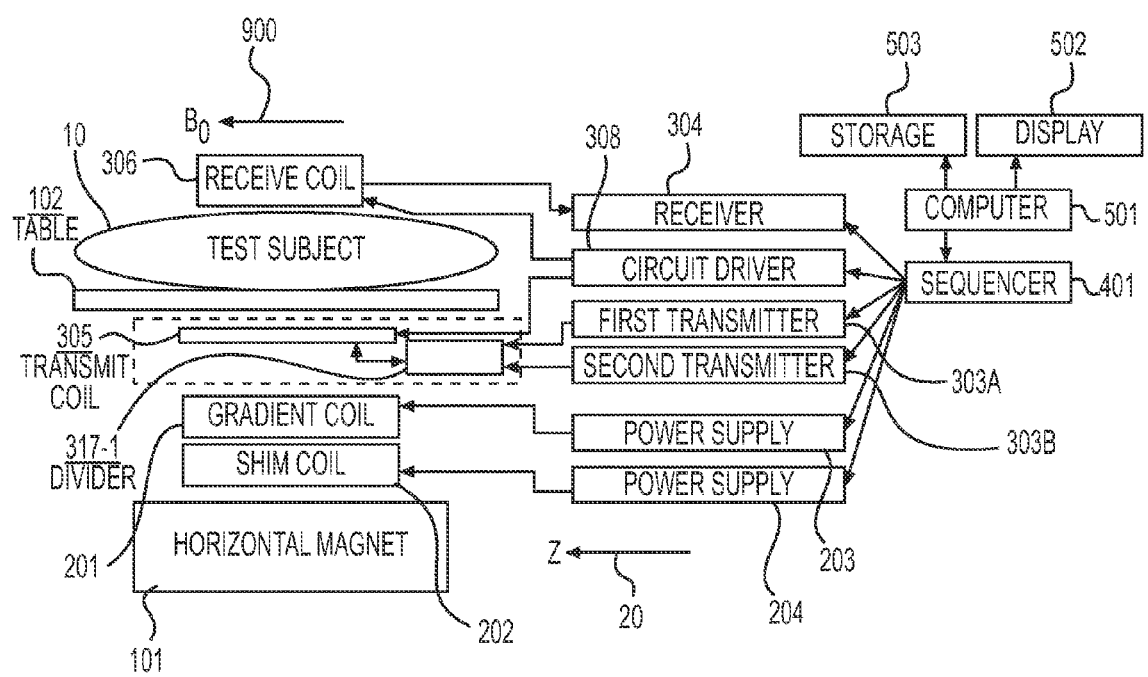
FIG. 27 is a functional block diagram showing a schematic configuration of an MRI device according to the fourth embodiment.

FIG. 27 is a block diagram showing a schematic configuration of an MRI device 100-7 according to this embodiment. The MRI device 100-7 according to this embodiment basically has the same configurations as those of the MRI device 100-5 according to the third embodiment. However, according to this embodiment, two of transmitters (first transmitter 303A and second transmitter 303B) are provided. A RF signal divider 317-1 is connected to the first and second transmitters 303A and 303B. The first and second transmitters 303A and 303B are connected to the sequencer 401. The first and second transmitters 303A and 303B independently send high-frequency signals of a predetermined phase and amplitude to the transmit coil 305 via the RF signal divider 317-1 according to commands sent from the sequencer 401. The part constituted with the transmit coil 305 and the RF signal divider 317-1 is called an RF coil unit 300-7.

Figure 28A:
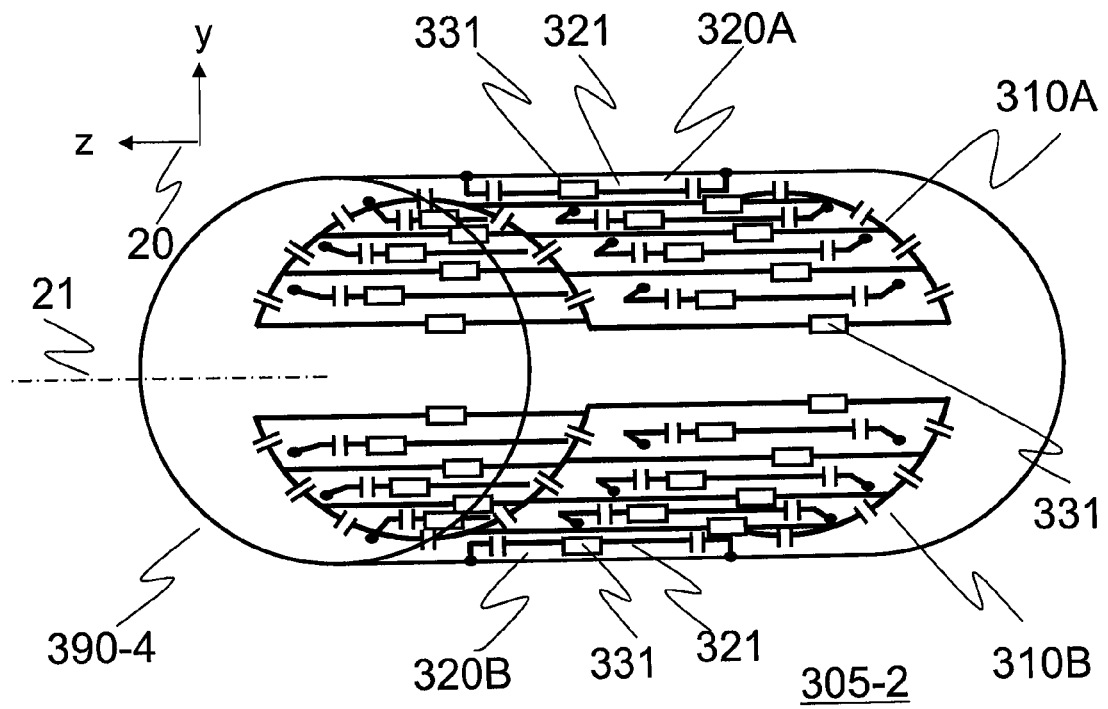
FIG. 28A is an explanatory view for explaining a configuration of a transmit coil according to the fourth embodiment.
Figure 28B:
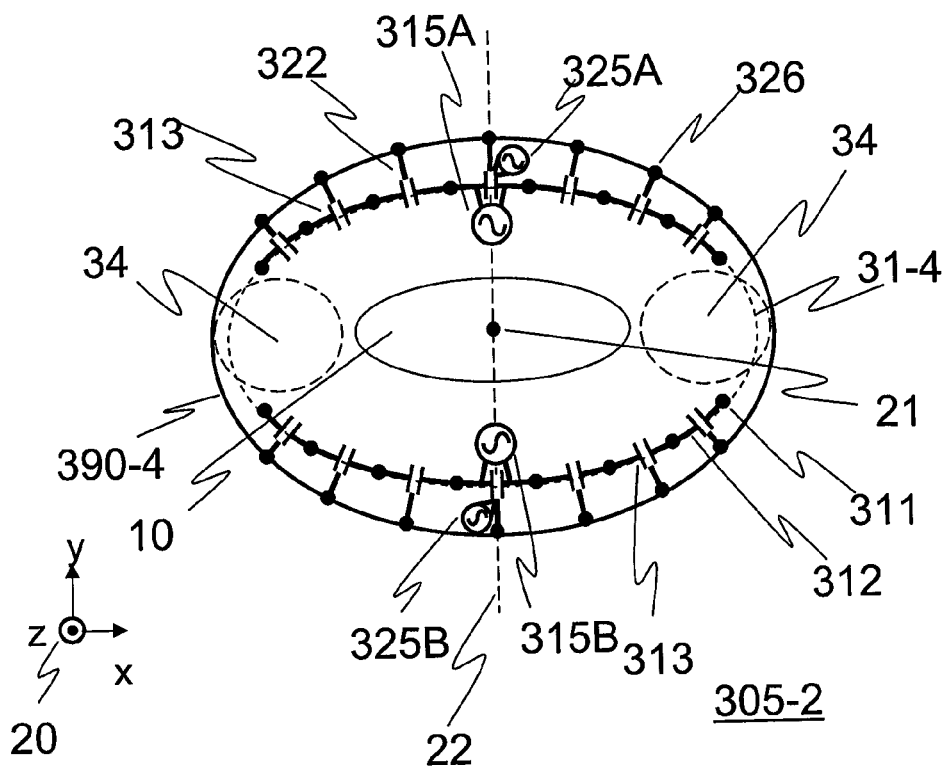
FIG. 28B is an explanatory view for explaining a configuration of a transmit coil according to the fourth embodiment.

A transmit coil 305-2 used as the transmit coil 305 in this embodiment is shown in FIGS. 28A and 28B. FIG. 28A shows the transmit coil 305-2 seen from the side obliquely with respect to the z-axis direction of the coordinate system 20, and FIG. 28B shows the transmit coil 305-2 seen in the z-axis direction of the coordinate system 20.

Explanation will be made here for an example in which the RF shield has an elliptic cylindrical shape, like the transceive coil 301-4. The transmit coil 305-2 basically has the same configurations as those of the transceive coil 301-4. However, it has the magnetic decoupling circuits 331 in the first conductors 311 and the third conductors 321, like the transmit coil 305. As the magnetic decoupling circuit 331, that shown in FIG. 23B is used. The operation thereof is as explained for the third embodiment. That is, ON/OFF of the PIN diode 332 of the magnetic decoupling circuit 331 is controlled with the control current 335 sent from the detuning circuit driver 308. By this ON/OFF control, the transmit coil 305-2 is made to be in an operable state, when a high-frequency magnetic field is irradiated, and the transmit coil 305-2 is made to have high impedance and thereby be in a non-operable state to prevent interference with the receive coil 306, when high-frequency signals are received.

Next, the configuration of the RF signal divider 317-1 of this embodiment and connection scheme of the transmit coil 305-2, the first transmitter 303A, the second transmitter 303B, the receive coil 306, and the receiver 304 will be explained with reference to FIG. 29. Explanation will be made here for an example where the surface coil 601 is used as the receive coil 306.

Figure 29:
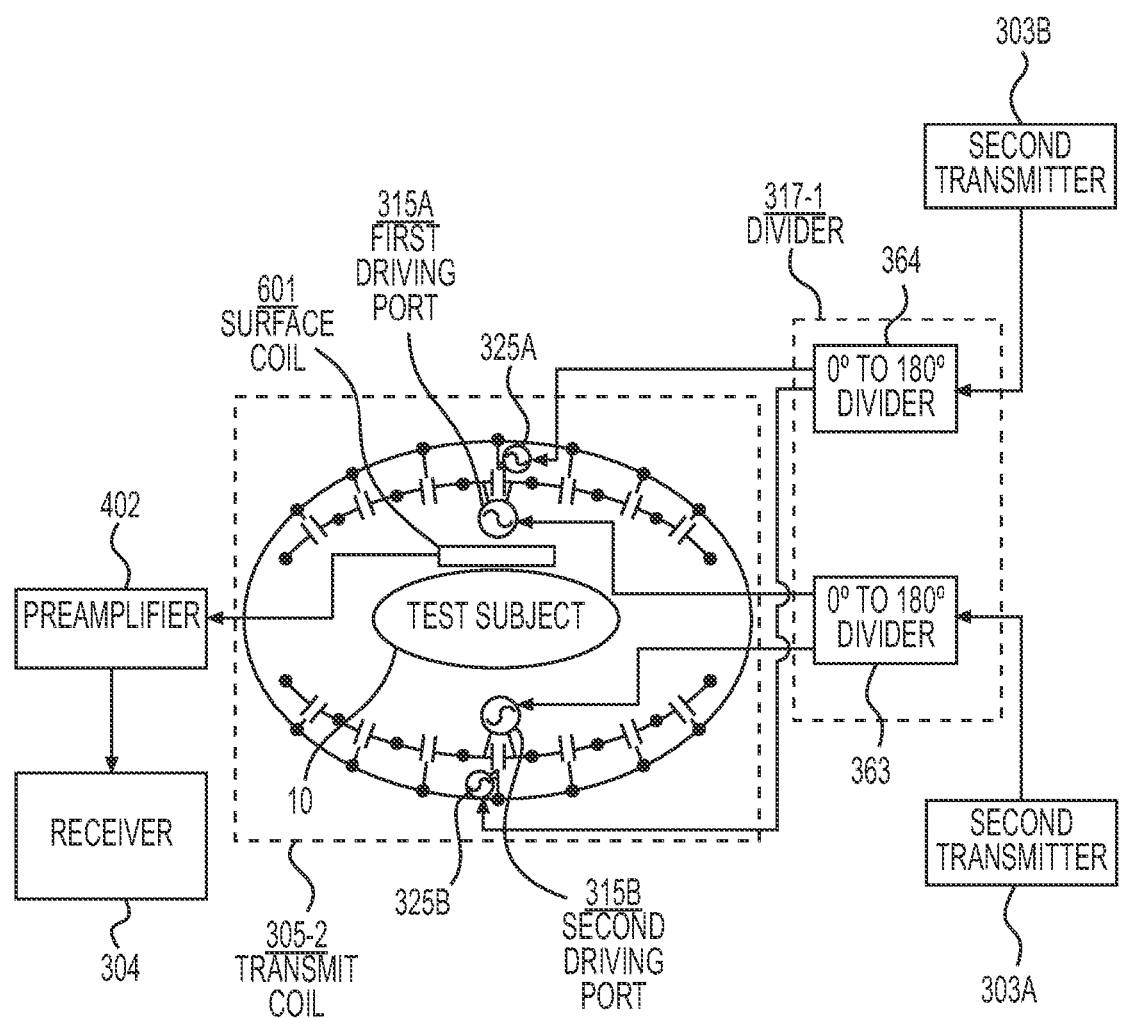
FIG. 29 is an explanatory view for explaining connection scheme of a transmit coil according to the fourth embodiment, an RF signal divider, a transmitter, and a receiver.

As shown in FIG. 29, the outputs of the transmitter 303A and the transmitter 303B are connected to the RF signal divider 317-1. The RF signal divider 317-1 is provided with the first 0°-180° divider 363 and the second 0°-180° divider 364.

Also in this embodiment, the balun 345 for rejecting common mode noises is provided between the first 0°-180° divider 363 and the corresponding driving port, and between the second 0°-180° divider 364 and the corresponding driving port. Further, between the surface coil 601 and the preamplifier, the balun 615 is provided. However, in order to make the drawing readily understandable, the balun 345, the balun 615, the magnetic decoupling circuits 331 and the magnetic decoupling circuits 614 disposed in the transmit coil 305-2 and the surface coil 601, and connection of the magnetic decoupling circuits 331, magnetic decoupling circuits 614, and the detuning circuit driver 308 are not shown in FIG. 29.

The first transmitter 303A is connected to the first 0°-180° divider 363, and two of the outputs of the first 0°-180° divider 363 are connected to the first driving port 315A and the second driving port 315B of the transmit coil 305-2, respectively. Further, the second transmitter 303B is connected to the second 0°-180° divider 364, and two of the outputs of the second 0°-180° divider 364 are connected to the third driving port 325A and the fourth driving port 325B, respectively.

The surface coil 601 is disposed near the test subject 10 placed in the inside of the transmit coil 305-2. The output of the surface coil 601 is connected to the preamplifier 402, and the output of the preamplifier is connected to the receiver 304.

As the reference frequencies of the first high-frequency signal sent from the first transmitter 303A and the second high-frequency signal sent from the second transmitter 303B, the same reference frequency is used. However, phases and amplitudes of both signals are independently determined by the sequencer 401.

The amplitude ratio and phase difference of the first high-frequency signal and the second high-frequency signal correspond to intensity ratio and phase difference of the first high-frequency magnetic field $B_y$ 830 generated at the center of the transmit coil 305-2 by the first RF coil 310 mentioned later, and the second high-frequency magnetic field $B_x$ 840 generated by the second RF coil 320, respectively. Therefore, depending on the high-frequency magnetic field desired to be generated at the center of the transmit coil 305-2, the amplitude ratio and phase difference of the first high-frequency signal and the second high-frequency signal are determined beforehand.

For example, when a circularly polarized high-frequency magnetic field is irradiated on the test subject 10 as in the QD irradiation method, the first high-frequency signal and the second high-frequency signal of the same amplitude and a phase difference of 90 degrees can be used. Further, if the amplitude ratio and phase difference of the first high-frequency signal and the second high-frequency signal are changed from the above state, the high-frequency magnetic field irradiated on the test subject 10 by the transmit coil 305-2 is elliptically polarized.

Next, it will be explained that, according to directions sent from the sequencer 401, the transmitter 303A and the transmitter 303B apply high-frequency signals, the magnetic decoupling circuit 308 controls application of a magnetic decoupling signal, thereby the transmit coil 305-2 operates as a coil that irradiates a high-frequency magnetic field on the test subject 10, and the surface coil 601 operates as the receive coil 306.

Immediately before high-frequency signals are applied from the first and second transmitters 303A and 303B, the detuning circuit driver 308 applies a magnetic decoupling signal to the transmit coil 305-2 and the surface coil 601, and applies the control current 335 of a direct current so that the PIN diodes 332 and 622 are made to be in the ON state.

As a result, in the transmit coil 305-2, all the PIN diodes 332 are made to be in the ON state with the control current 335 flowing in the PIN diodes 332. When all of the PIN diodes 332 of the transmit coil 305-2 are in the ON state, the PIN diodes 332 are conductive, and therefore the transmit coil 305-2 shows the same electrical characteristics as those of the transmit coil 301-4.

On the other hand, in the surface coil 601, the PIN diode 622 is made to be in the ON state with the control current 335, and the magnetic decoupling circuit 614 becomes a parallel resonance circuit constituted by the inductor 621 and the capacitor 623. This parallel resonance circuit has high impedance at the magnetic resonance frequency set in the MRI device 100-7, and therefore the loop conductor 611 of the surface coil 601 is made to be in a substantially open state. As a result, the surface coil 601 does not resonate at a magnetic resonance frequency set in the MRI device 100-7, and electric current hardly flows in the loop conductor 611.

Therefore, the magnetic decoupling signal provides a state that magnetic coupling of the transmit coil 305-2 and the surface coil 601 does not occur. In this state, the transmit coil 305-2 can irradiate a high-frequency magnetic field on the test subject 10 without shift of the resonance frequency and reduction of the Q factor of the coil due to magnetic coupling.

After the control current 335 is applied by the detuning circuit driver 308, high-frequency signals of the same reference frequency are applied by the first transmitter 303A and the second transmitter 303B. The first high-frequency signal is inputted into the first 0°-180° divider 363, and divided into two signals of the same amplitudes and a phase difference of 180 degrees, and they are inputted into the first driving port 315A and the second driving port 315B, respectively. The second high-frequency signal is inputted into the second 0°-180° divider 364, and divided into two signals of the same amplitudes and a phase difference of 180 degrees, and they are inputted into the third driving port 325A and the fourth driving port 325B, respectively.

When all the PIN diodes 332 are in the ON state, the transmit coil 305-2 operates in the same manner as that of the transceive coil 301-4. Therefore, in this case, as shown in FIG. 21, the first high-frequency magnetic field $B_y$ 830 vibrating in the direction parallel to the y-axis of the coordinate system 20 is generated by two of the first RF coil 310 at the center of the transmit coil 305-2, and the second high-frequency magnetic field $B_x$ 840 vibrating in the direction parallel to the x-axis of the coordinate system 20 is generated by two of the second RF coils 320. When the first high-frequency magnetic field $B_y$ 830 and the second high-frequency magnetic field $B_x$ 840 have the same amplitude and a phase difference of 90 degrees, the synthesized magnetic field of the both is circularly polarized, or otherwise, it is elliptically polarized or linearly polarized. Therefore, when all the PIN diodes 332 and 622 are in the ON state, the transmit coil 305-2 irradiates elliptically polarized and linearly polarized high-frequency magnetic fields on the test subject 10, in addition to the circularly polarized high-frequency magnetic field applied in the same manner as that of the QD irradiation method.

After the high-frequency magnetic fields are irradiated, in order to receive magnetic resonance signals emitted from the test subject 10, the detuning circuit driver 308 makes the value of the control current 335 to be 0 so that the diodes 622 of the transmit coil 305-2 and the surface coil 601 are made to be in the OFF state. If the PIN diodes 332 of the transmit coil 305-2 are made to be in the OFF state, the first conductors 311 and the third conductors 321 are made to be in a substantially open state. As a result, electric current hardly flows in the conductors of the transmit coil 305-2. Therefore, the transmit coil 305-2 does not resonate at a magnetic resonance frequency set in the MRI device 100-7, and hardly generates magnetic field, either. On the other hand, in the surface coil 601, the diode 622 is made to be in the OFF state, and the magnetic decoupling circuit 614 operates as the capacitor 623. As a result, the surface coil 601 resonates at the magnetic resonance frequency set in the MRI device 100-7.

Therefore, when the magnetic resonance signals emitted from the test subject 10 are received, magnetic coupling of the surface coil 601 and the transmit coil 305-2 is eliminated, and the surface coil 601 can receive the magnetic resonance signals with high sensitivity without shift of the resonance frequency and reduction of the Q factor of the coil due to magnetic coupling. The signals received by the surface coil 601 are amplified by the preamplifier 402, and sent to the receiver 304.

Because of the above, by adjusting amplitude ratio and phase difference of two of the high-frequency magnetic fields to be supplied to the transmit coil 305-2, the transmit coil 305-2 can operate as the transmit coil 305 that irradiates a circularly polarized high-frequency magnetic field similar to that obtainable by the QD irradiation method as well as elliptically polarized and linearly polarized high-frequency magnetic fields, and the surface coil 601 can operate as the receive coil 306.

As described above, according to this embodiment, the transmit coil 305 can irradiate a circularly polarized high-frequency magnetic field similar to that obtainable by the QD irradiation method as well as elliptically polarized and linearly polarized high-frequency magnetic fields. Further, amplitudes and phases of high-frequency magnetic fields generated in the transmitter 303A and transmitter 303B can be independently controlled according to directions sent from the sequencer 401. Therefore, according to this embodiment, axis ratio (ratio of the major axis and the minor axis of the elliptically polarized wave) of the elliptically polarized high-frequency magnetic field irradiated from the transmit coil 305 can be controlled.

For example, it is known that, when the test subject 10 has a sectional shape having significantly different lengths for the x-axis direction and the and y-axis direction of the coordinate system 20 as shown in FIG. 28B, uniformity of irradiation intensity distribution is more improved by irradiating an elliptically polarized high-frequency magnetic field of which axis ratio is adjusted according to the shape of the test subject 10 rather than irradiating a circularly polarized high-frequency magnetic field by the QD method. Therefore, according to this embodiment, when the sectional shape of the test subject 10 is such a shape as mentioned above, higher uniformity of the magnetic field intensity distribution can be obtained by controlling the transmit coil to irradiate an elliptically polarized high-frequency magnetic field of which axis ratio is adjusted.

That is, according to this embodiment, high uniformity of magnetic field intensity distribution can be obtained regardless of the imaging conditions including the shape of the test subject 10.

Although this embodiment has been explained for an example in which the transmit coil 305-2 has an elliptic cylindrical shape, the shape of the transmit coil 305-2 is not limited to such a shape. It may have any of various kinds of shapes exemplified for the other embodiments mentioned above. Further, the same shall apply to the disposition scheme of the capacitors, the configuration of the magnetic decoupling circuits, and so forth.

<<Fifth Embodiment>>

Next, the fifth embodiment of the present invention will be explained. According to this embodiment, a switch is provided in the RF signal divider to enable switching between a state that all of the transmit coils in the RF coil unit are used, and a state that the only one of the transmit coils opposedly disposed with a space is used. Although the MRI device of this embodiment is basically the same as that of the fourth embodiment, different configurations of the RF signal divider 317 are used. Hereafter, the configurations different from those of the fourth embodiment will be mainly explained. Also in this embodiment, it is supposed that the direction of the static magnetic field 900 generated by the magnet 101 of the horizontal magnetic field type is the same as the z-axis direction of the coordinate system 20.

The configuration of the RF signal divider 317-2 and connection scheme of the transmit coil 305, the first transmitter 303A, the second transmitter 303B, the receive coil 306, and the receiver 304 according to this embodiment will be explained with reference to FIG. 30. The following explanation is for an example in which the transmit coil 305-2 shown in FIGS. 28A and 28B is used as the transmit coil 305, and the surface coil 601 shown in FIG. 24A is used as the receive coil 306.

Figure 30:
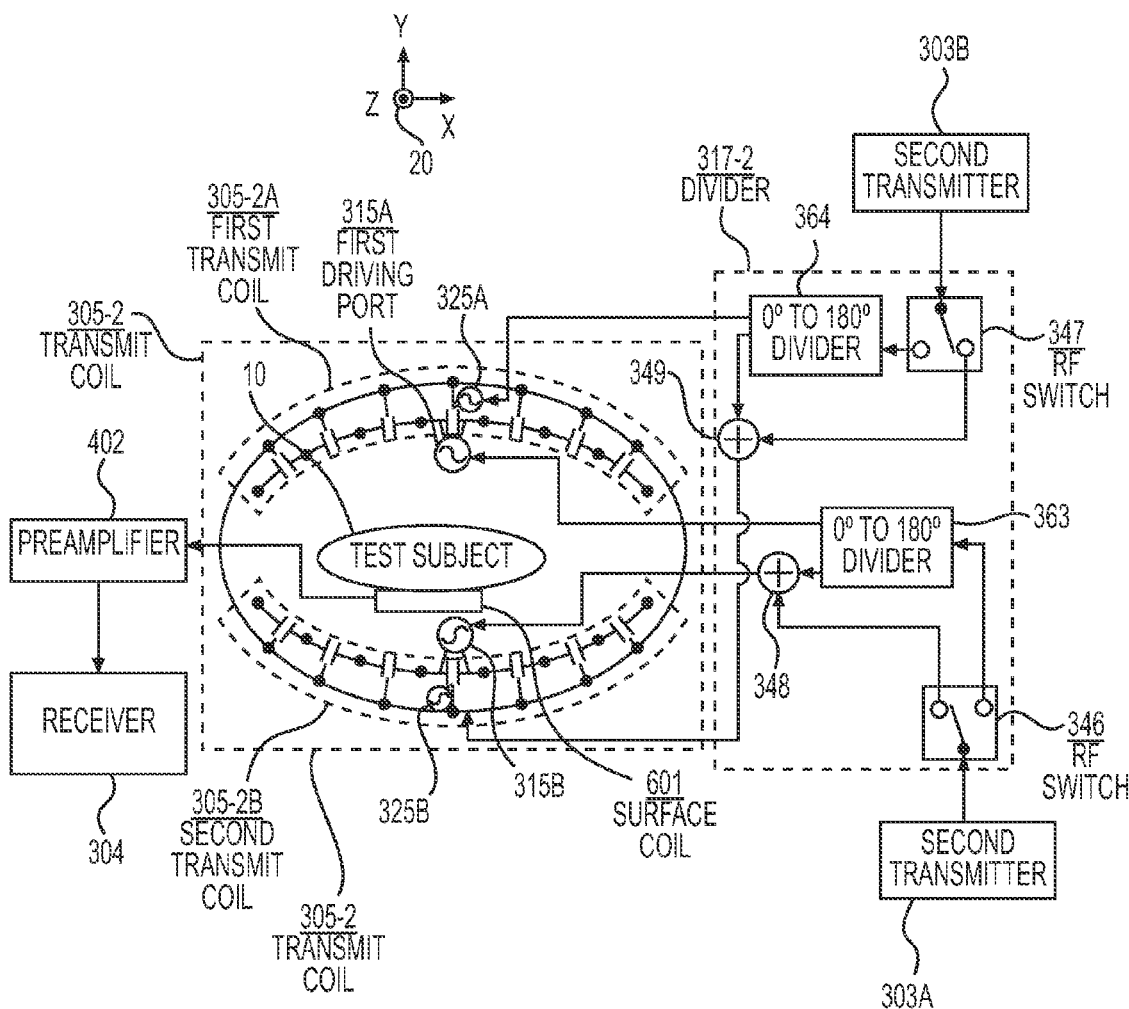
FIG. 30 is an explanatory view for explaining connection scheme of a transmit coil according to the fifth embodiment, an RF signal divider, a transmitter, and a receiver.

As shown in FIG. 30, the RF signal divider 317-2 is provided with RF switches (first RF switch 346 and second RF switch 347) for switching the destination of the output of the high-frequency signals, 0°-180° dividers (first 0°-180° divider 363 and second 0°-180° divider 364), and RF combiners (first RF combiner 348 and second RF combiner 349) for adding two of high-frequency signals.

Also in this embodiment, the balun 345 for rejecting common mode noises is provided between the first 0°-180° divider 363 and the corresponding driving port and between the second 0°-180° divider 364 and the corresponding driving port. Further, between the surface coil 601 and the preamplifier, the balun 615 is provided. However, in order to make the drawing readily understandable, the balun 345, the balun 615, the magnetic decoupling circuits 331 and the magnetic decoupling circuits 614 disposed in the transmit coil 305-2 and the surface coil 601, and connection of the magnetic decoupling circuits 331, magnetic decoupling circuits 614, and the detuning circuit driver 308 are not shown in FIG. 30.

Further, in the transmit coil 305-2, a part consisting of the first RF coil 310A and the second RF coil 320A is henceforth called a first transmit coil 305-2A, and a part consisting of the first RF coil 310B and the second RF coil 320B is henceforth called a second transmit coil 305-2B. Hereafter, this embodiment will be explained by exemplifying a configuration enabling switching between a state that only the second transmit coil 305-2B is used as the transmit coil 305, and a state that the whole transmit coil 305-2 is used as the transmit coil 305.

The first transmitter 303A is connected to the first RF switch 346. One of outputs of the first RF switch 346 is connected to the first 0°-180° divider 363, and the other output is connected to the first RF combiner 348. One of the outputs of the first 0 to 180 degrees distribution circuit 363 is connected to the first driving port 315A of the first transmit coil 305-2A, and the other output is connected to the first RF combiner 348. The output of the first RF combiner 348 is connected to the second driving port 315B of the second transmit coil 305-2B.

Further, the second transmitter 303B is connected to the second RF switch 347. One of the outputs of the second RF switch 347 is connected to the second 0°-180° divider 364, and the other output is connected to the second RF combiner 349. One of the outputs of the second 0°-180° divider 364 is connected to the third driving port 325A of the first transmit coil 305-2A, and the other output is connected to the second RF combiner 349. The output of the second RF combiner 349 is connected to the fourth driving port 325B of the second transmit coil 305-2B.

The surface coil 601 is disposed near the test subject 10 placed in the inside of the transmit coil 305-2. The output of the surface coil 601 is connected to the preamplifier 402, and the output of the preamplifier is connected to the receiver 304.

The first RF switch 346 and the second RF switch 347 switches the destination of the output according to a control signal sent from the sequencer 401. According to this embodiment, when the whole transmit coil 305-2 is used as the transmit coil 305, a control signal is outputted so that the output of the first RF switch 346 is connected to the first 0°-180° divider 363, and the output of the second RF switch 347 is connected to the second 0°-180° divider 364. On the other hand, when only the second transmit coil 305-2B is used as the transmit coil 305, a control signal is outputted so that the output of the first RF switch 346 is connected to the first RF combiner 348, and the output of the second RF switch 347 is connected to the second RF combiner 349. The sequencer 401 receives directions for the switching from the computer 501 according to a program defined beforehand or directions of a user.

Next, it will be explained that when a control signal is outputted so that the output of the first RF switch 346 is connected to the first RF combiner 348, and the output of the second RF coil switch 347 is connected to the second RF combiner 349, only the second transmit coil 305-2B operates as the transmit coil 305, and the surface coil 601 operates as the receive coil 306.

First, immediately before high-frequency signals are applied from the first and second transmitters 303A and 303B, the detuning circuit driver 308 applies the control current 335 of a direct current so that the PIN diodes 332 and 622 of the second transmit coil 305-2B and the surface coil 601 are made to be in the ON state, and makes the value of the control current 335 to be 0 so that PIN diodes 332 of the first transmit coil 305-2A are made to be in the OFF state, according to directions sent from the sequencer 401.

As a result, in the second transmit coil 305-2B, all the diodes 332 are made to be in the ON state with the control current 335 flowing in the diodes 332. When all the PIN diodes 332 of the second transmit coil 305-2B are in the ON state, the PIN diodes 332 are conductive. On the other hand, in the first transmit coil 305-2A, all the diodes 332 are in the OFF state, and therefore the first conductors 311 and the third conductors 321 are in a highly resistive state, electric current does not flow in them, and they do not operate as a coil.

In the surface coil 601, the PIN diode 622 is made to be in the ON state with the control current 335, and the magnetic decoupling circuit 614 becomes a parallel resonance circuit consisting of the inductor 621 and the capacitor 623. This parallel resonance circuit shows high impedance at a magnetic resonance frequency set in the MRI device 100-7, and the loop conductor 611 of the surface coil 601 is made to be in a substantially open state. As a result, the surface coil 601 does not resonate at the magnetic resonance frequency set in the MRI device 100-7, and electric current hardly flows in the loop conductor 611.

Since electric current hardly flows in the surface coil 601, magnetic coupling of the second transmit coil 305-2B and the surface coil 601 does not occur. Therefore, the second transmit coil 305-2B can irradiate a high-frequency magnetic field on the test subject 10 without shift of the resonance frequency and reduction of the Q factor of the coil due to magnetic coupling.

Further, immediately before applying the high-frequency signals, the sequencer 401 applies control signals to the first RF switch 346 and the second RF switch 347 so that the outputs thereof are connected to the first RF combiner 348 and the second RF combiner 349, respectively.

Then, high-frequency signals are applied by the first transmitter 303A and the second transmitter 303B. It is supposed that the same reference frequency is used for the first high-frequency signal sent from the first transmitter 303A, and the second high-frequency signal sent from the second transmitter 303B. On the other hand, phases and amplitudes of both the high-frequency signals are independently determined according command sent from the sequencer 401 as in the fourth embodiment.

The first high-frequency signal is sent to the first RF combiner 348 via the first RF switch 346. The second high-frequency signal is sent to the second RF combiner 349 via the second RF switch 347. Since the intensity of the high-frequency signal inputted into the first RF combiner 348 from the first 0°-180° divider 363 is 0, the first high-frequency signal inputted into the first RF combiner 348 is applied to the second driving port 315B as it is. Further, since the intensity of the high-frequency signal inputted into the second RF combiner 349 from the second 0°-180° divider 364 is 0, the second high-frequency signal inputted into the second RF combiner 349 is applied to the fourth driving port 325B as it is. In addition, high-frequency signal is not applied to the first driving port 315A and the third driving port 325A.

Figure 31A:
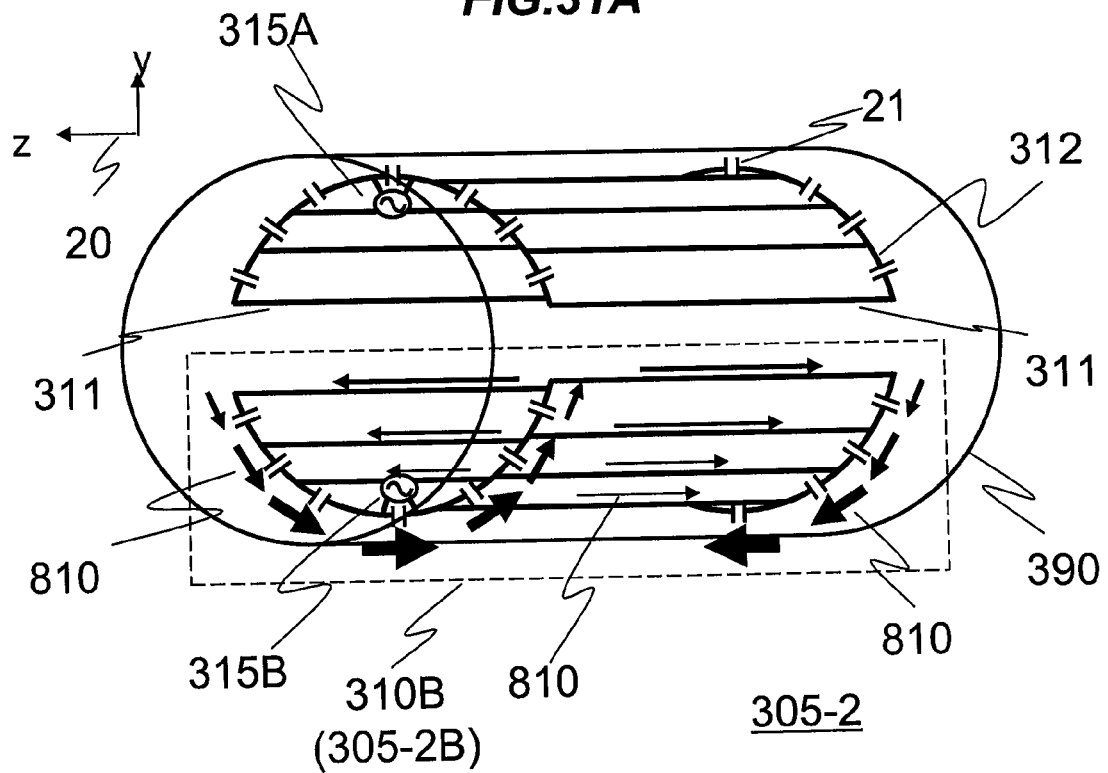
FIG. 31A is an explanatory view for explaining current distribution in a first RF coil of a second transmit coil according to the fifth embodiment.
Figure 31B:
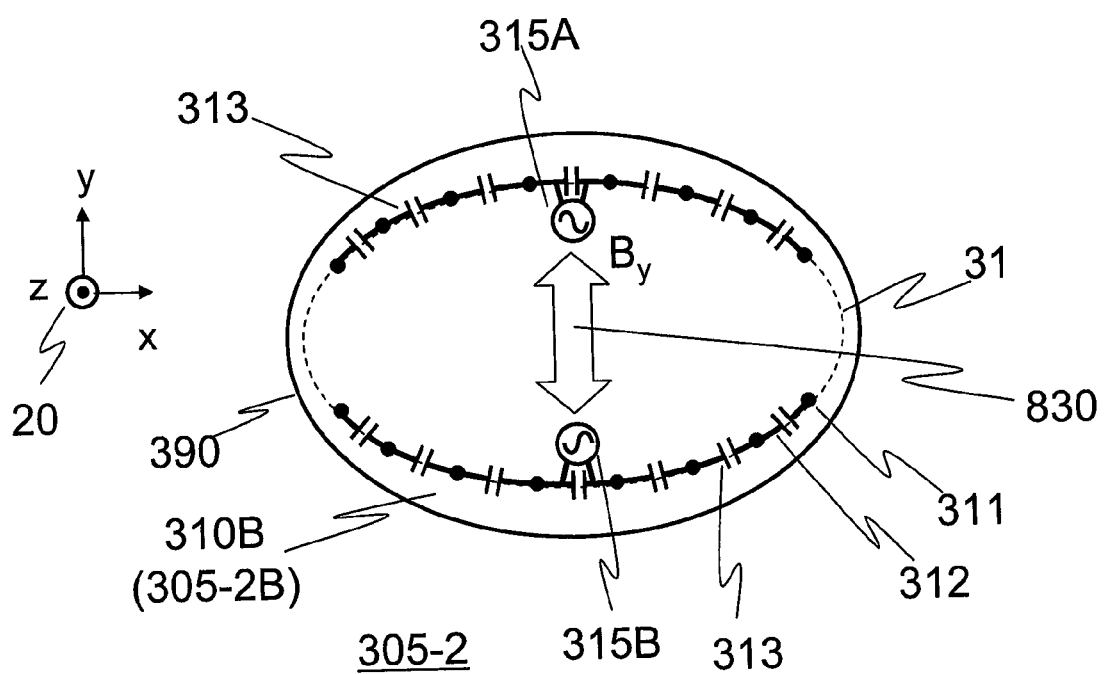
FIG. 31B is an explanatory view for explaining a magnetic field generated by a first RF coil of a second transmit coil according to the fifth embodiment.
Figure 32A:
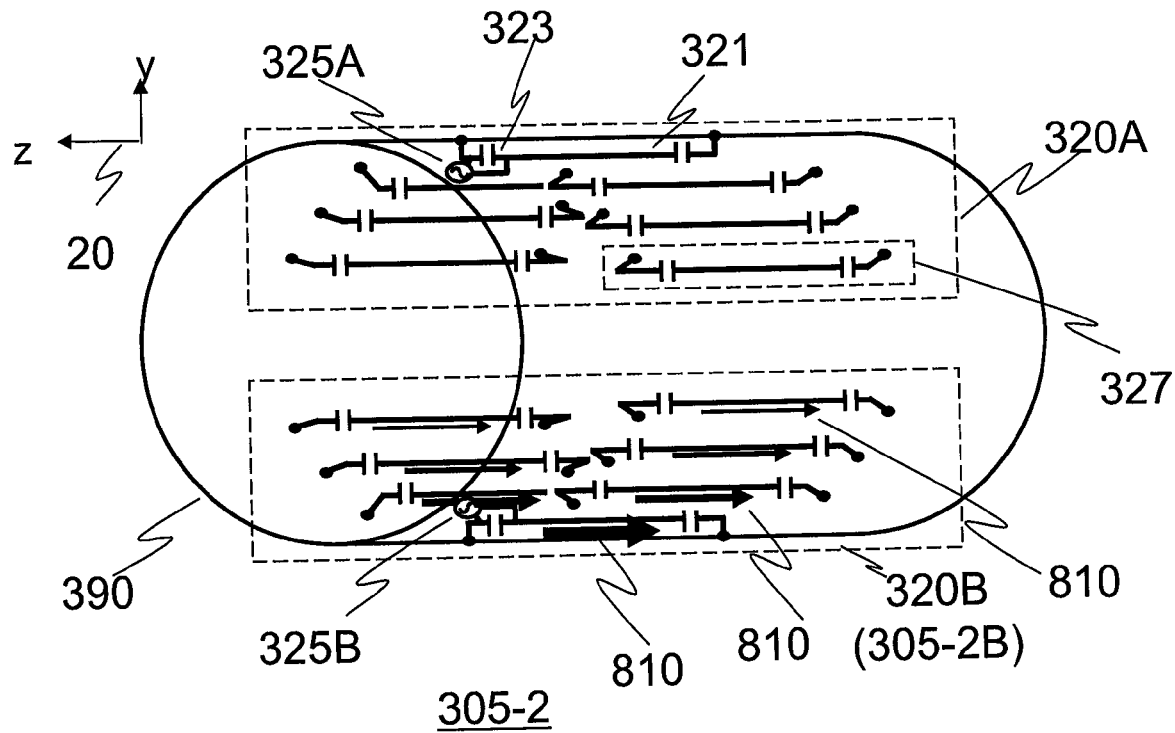
FIG. 32A is an explanatory view for explaining current distribution in a second RF coil of a second transmit coil according to the fifth embodiment.
Figure 32B:
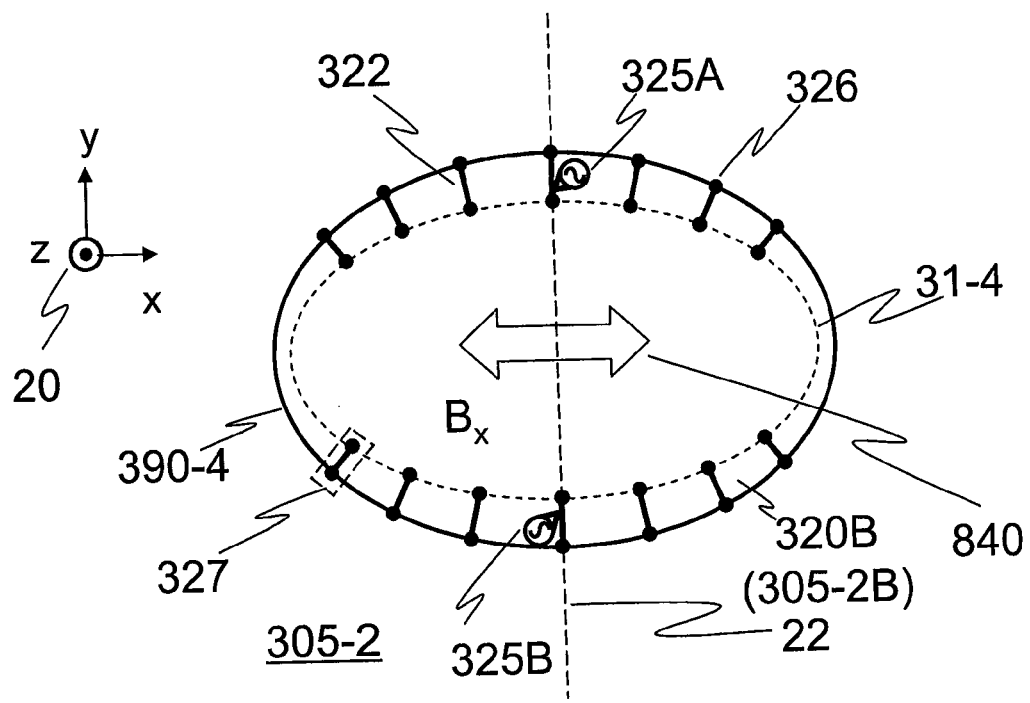
FIG. 32B is an explanatory view for explaining a magnetic field generated by a second RF coil of a second transmit coil according to the fifth embodiment.

Operation of the second transmit coil 305-2B at the time of applying high-frequency signals to the second driving port 315B and the fourth driving port 325B will be explained with reference to FIGS. 31A, 31B, 32A and 32B. FIG. 31A schematically shows electric current flowing in the first RF coil 310B of the second transmit coil 305-2B, and FIG. 31B shows direction of the magnetic field generated by the first RF coil 310B of the second transmit coil 305-2B. Further, FIG. 32A schematically shows electric current flowing in the second RF coil 320B of the second transmit coil 305-2B, and FIG. 32B shows direction of the magnetic field generated by the second RF coil 320B of the second transmit coil 305-2B. In order to make the drawings easily understandable, the second RF coil 320 is not shown in FIGS. 31A and 31B, and the first RF coil 310 is not shown in FIGS. 32A and 32B.

If a high-frequency signal is applied to the second driving port 315B, the RF current 810 shown in FIG. 31A flows in the first RF coil 310B of the second transmit coil 305-2B. That is, in the first conductors 311, the electric current flows in opposite directions on both sides of the second driving port 315B, and the intensity thereof increases in proportion to the distance from the second driving port 315B. Further, in the second conductors 312, the electric current flows in one direction, and the intensity thereof decreases from the second driving port 315B towards both ends of the second conductor 312.

In FIG. 31A, magnitude of the amplitude of the RF current 810 is indicated with the thickness of the arrows, and direction along which the electric current flows is indicated with the direction of the arrows. At the center of the transmit coil 305-2, the first high-frequency magnetic field $B_y$ 830 vibrating in the direction parallel to the y-axis of the coordinate system 20 is generated as shown in FIG. 31B by the RF current 810 shown in FIG. 31A in accordance with the Biot-Savart law.

On the other hand, if a high-frequency signal is applied to the fourth driving port 325B, the RF current 810 flows in each half-loop 327 in the same direction in the second RF coil 320B of the second transmit coil 305-2B as shown in FIG. 32A, and the intensity of the electric current becomes smaller in a half-loop 327 at a more outer position. In FIG. 32A, magnitude of the amplitude of the RF current 810 is indicated with the thickness of the arrows, and direction along which the electric current flows is indicated with the direction of the arrows. Since the half-loops 327 of the second RF coil 320B are symmetrically disposed with respect to the plane of symmetry 22 shown in FIG. 32B, the magnetic field vectors produced by the half-loops 327 are symmetric with respect to the y-axis direction of the coordinate system 20. Therefore, when the magnetic field vectors produced by all the half-loops 327 are synthesized, components for the y-direction of the coordinate system 20 are canceled, and the second high-frequency magnetic field $B_x$ 840 is generated in the direction parallel to the x-axis of the coordinate system 20.

The directions of the first high-frequency magnetic field $B_y$ 830 generated by the first RF coil 310B of the second transmit coil 305-2B, and the second high-frequency magnetic field $B_x$ 840 generated by the second RF coil 320 are perpendicular to each other. Therefore, if the amplitudes of the first high-frequency signal and the second high-frequency signal are the same, and phase difference of them is 90 degrees, the second transmit coil 305-2B irradiates a high-frequency magnetic field on the test subject 10 in the same manner as that of the QD irradiation method like the fourth embodiment. Further, if the amplitude ratio and phase difference of the first high-frequency signal and the second high-frequency signal are changed, the second transmit coil 305-2B irradiates an elliptically polarized high-frequency magnetic field on the test subject 10.

After the high-frequency magnetic field is irradiated, in order to receive magnetic resonance signals emitted from the test subject 10, the detuning circuit driver 308 makes the value of the control current 335 to be 0 so that the PIN diodes 332 and 622 of the second transmit coil 305-2B and the surface coil 601 are made to be in the OFF state. The value of the control current 335 flowing in the PIN diodes 332 of the first transmit coil 305-2A is still maintained to be 0.

If the PIN diodes 332 of the second transmit coil 305-2B are made to be in the OFF state, the first conductors 311 and the third conductors 321 are made to be in a substantially open state. As a result, electric current hardly flows in the conductors of the second transmit coil 305-2B. As a result, the second transmit coil 305-2B does not resonate at a magnetic resonance frequency set in the MRI device 100-7, and hardly generates magnetic field, either. On the other hand, in the surface coil 601, the diode 622 is made to be in the OFF state, and the magnetic decoupling circuit 614 operates as the capacitor 623. As a result, the surface coil 601 resonates at the magnetic resonance frequency set in the MRI device 100-7.

Therefore, when the magnetic resonance signals emitted from the test subject 10 are received, magnetic coupling of the surface coil 601 and the transmit coil 305-2 is eliminated, and the surface coil 601 can receive the magnetic resonance signals with high sensitivity without shift of the resonance frequency and reduction of the Q factor of the coil due to magnetic coupling. The signals received by the surface coil 601 are amplified by the preamplifier 402, and sent to the receiver 304.

As explained above, when a control signal is outputted so that the output of the first RF switch 346 is connected to the first RF combiner 348, and the output of the second RF switch 347 is connected to the second RF combiner 349, only the second transmit coil 305-2B operates as the transmit coil 305 that irradiates a high-frequency magnetic field similar to that obtainable by the QD irradiation method and an elliptically polarized high-frequency magnetic field. The surface coil 601 operates as the receive coil 114.

In addition, if the output of the first RF switch 346 is connected to the first 0°-180° divider 363, and the output of the second RF switch 347 is connected to the second 0°-180° divider 364, the configuration becomes the same as that of the fourth embodiment, and therefore the whole transmit coil 305-2 can be used as the transmit coil 305.

As described above, according to this embodiment, by controlling the outputs with the switches in the RF signal divider 317-2, the transmit coil can be controlled so that only the second transmit coil 305-2B of the transmit coil 305 irradiates a high-frequency magnetic field similar to that obtainable by the QD method and an elliptically polarized high-frequency magnetic field. For example, when the spine of the test subject 10 (patient) is imaged in the MRI device 100 of the horizontal magnetic field type shown in FIG. 1, the test subject 10 is imaged in a state that the test subject is laid on the subject's back in many cases. In such a case, according to this embodiment, a high-frequency magnetic field can be irradiated by using only the second transmit coil 305-2B near the spine as the imaging area, and irradiation of the high-frequency magnetic field to the test subject 10 other than the imaging area can be reduced. Generation of image artifacts due to inclusion of signals from regions other than the imaging region can be thereby suppressed, and electric power for the irradiation can be reduced to suppress heat generation in the test subject 10.

Although this embodiment has been explained for an example in which a state that only the second transmit coil 305-2B of the transmit coil 305-2 is operated as the transmit coil 305, and a state that the whole transmit coil 305-2 is operated as the transmit coil 305 can be mutually switched, the configuration is not limited to this.

As for the wirings in the RF signal divider 317-2, by exchanging connection destinations for the connection of the first driving port 315A and the first 0°-180° divider 363, and the connection of the second driving port 315B and the first RF combiner 348, alternately, and by exchanging connection destinations for the connection of the third driving port 325A and the second 0°-180° divider 364, and the connection of the fourth driving port 325B and the second RF combiner 349, alternately, there may be attained such a configuration that a state that only the second transmit coil 305-2A is operated as the transmit coil 305, and a state that the whole transmit coil is operated as the transmit coil 305 can be mutually switched.

Furthermore, as for the wirings in the RF signal divider 317-2, by inserting a third RF switch between the first transmitter 303A and the first RF switch 346, and a third RF combiner between the first 0°-180° divider 363 and the first driving port 315A, connecting output of the third RF switch to input of the third RF combiner, inserting a fourth RF switch between the second transmitter 303B and the second RF switch 347, and a fourth RF combiner between the second 0°-180° divider 364 and the third driving port 325A, and connecting output of the fourth RF switch to input of the fourth RF combiner, there may be attained a configuration that the whole transmit coil 305-2, the first transmit coil 305-2A, and the second transmit coil 305-2B can be switched as a part operated as the transmit coil 305.

Also in this embodiment, the transmit coil may have any of the various kinds of shapes exemplified for the aforementioned embodiments. Further, the same shall apply to the disposition of capacitors, the configuration of the magnetic decoupling circuit, and so forth.

DENOTATION OF REFERENCE NUMERALS

10: Test subject, 20: coordinate system, 21: central axis, 22: plane of symmetry, 23: plane, 24: plane, 31: curved plane, 31-4: curved plane, 34: space, 100: MRI device, 100-5: MRI device, 100-7: MRI device, 101: horizontal magnetic field magnet, 102: patient table, 201: gradient magnetic field coil, 202: shim coil, 203: power supply for gradient magnetic field, 204: power supply for shim coil, 300: RF coil unit, 300-5: RF coil unit, 300-7: RF coil unit, 301: transceive coil, 301-1: transceive coil, 301-2: transceive coil, 301-3: transceive coil, 301-4: transceive coil, 302: transmit/receive switching unit, 303: transmitter, 303A: transmitter, 303B: transmitter, 304: receiver, 305: transmit coil, 305-1: transmit coil, 305-2: transmit coil, 305-2A: first transmit coil, 305-2B: second transmit coil, 306: receive coil, 307: RF signal divider/combiner, 308: detuning circuit driver, 310: first RF coil, 310A: first RF coil, 310B: first RF coil, 311: first conductor, 312: second conductor, 313: first capacitor, 314: third capacitor, 315A: first driving port, 315B: second driving port, 325A: third driving port, 325B: fourth driving port, 316: loop, 317: RF signal divider, 317-1: RF signal divider, 317-2: RF signal divider, 320: second RF coil, 320A: second RF coil, 320B: second RF coil, 321: third conductor, 322: fourth conductor, 323: second capacitor, 326: connection point, 327: half loop, 330: part of first RF coil and second RF coil, 331: magnetic decoupling circuit, 332: PIN diode, 333: control line, 334: choke coil, 335: control current, 336: cross diode, 341: QD hybrid, 343: 0°-180° divider/combiner, 344: second 0 to 180 distribution/synthesis circuit, 345: balun, 346: first RF switch, 347: second RF switch, 348: first RF combiner, 349: second RF combiner, 351: magnetic decoupling circuit, 352: inductor, 353: magnetic decoupling circuit, 354: inductor, 363: first 0°-180° divider, 364: second 0 to 180 distribution circuit, 390: RF shield, 390-4: RF shield, 401: sequencer, 402: preamplifier, 501: computer, 502: display, 503: storage device, 601: surface coil, 611: loop conductor, 612: capacitor, 613: capacitor for matching, 614: magnetic decoupling circuit, 615: balun, 621: inductor, 622: PIN diode, 623: capacitor, 624: choke coil, 810: RF current, 821: magnetic flux, 822: magnetic field vector, 823: magnetic field generated by loop 316, 824: magnetic field generated by half loop 327, 830: first high-frequency magnetic field, 840: second high-frequency magnetic field, 900: static magnetic field

The invention claimed is:

1. The high-frequency coil unit comprising:
a shield having a cylindrical shape;
a first partial coil and a second partial coil facing each other and disposed in the inside of the shield with a predetermined interval for a circumferential direction of the shield; and
a high-frequency signal control unit for controlling high-frequency signals inputted into the first partial coil and the second partial coil,
wherein the first partial coil and the second partial coil each have a first high-frequency coil and a second high-frequency coil,
wherein the first high-frequency coil and the second high-frequency coil have shapes for generating linearly polarized high-frequency magnetic fields of which directions are perpendicular to each other,
wherein the high-frequency signal control unit supplies the high-frequency signals to the first high-frequency coil and the second high-frequency coil so that a circularly polarized or elliptically polarized high-frequency magnetic field is irradiated in the inside of the shield,
wherein the first high-frequency coil of the first partial coil and the first high-frequency coil of the second partial coil each comprise:

N of linear first conductors, wherein N is a natural number,
two of arc-shaped second conductors,
at least (N−1) of first capacitors, and
a first driving port that receives supply of high-frequency signals from the high-frequency signal control unit,
wherein N of the first conductors are disposed in a predetermined curved plane so as to be substantially parallel to the central axis of the shield,
wherein two of the second conductors are disposed in planes perpendicular to the central axis, and each connect the ends of N of the first conductors,
wherein the first capacitors are disposed in the second conductor so that at least one of the first capacitor is disposed in each of parts of the second conductor between connection points with the first conductors, and values of the first capacitors are adjusted so that the first high-frequency coil resonates at frequency of the high-frequency magnetic field to be irradiated,
wherein the first driving port is connected to both ends of one of the first capacitors disposed at a position nearest to the center of the second conductor,
wherein the second high-frequency coil of the first partial coil and the second high-frequency coil of the second partial coil each comprise:
N−1 of linear third conductors,
2(N−1) of fourth conductors,
at least N of second capacitors, and
a second driving port that receives supply of high-frequency signals from the high-frequency signal control unit,
wherein the third conductors are disposed in the predetermined curved plane between the first conductors so as to be substantially parallel to the first conductors,
wherein the fourth conductors are disposed in planes perpendicular to the central axis, and connect the ends of (N−1) of the third conductors to the shield, respectively,
wherein the second driving port is connected to one of the third conductors disposed at a position nearest to the first capacitor, to both ends of which the first driving port is connected,
wherein the second capacitors are disposed in a number of at least two in the third conductor to which the second driving port is connected, and in a number of at least one in the other third conductors, values of the second capacitors are adjusted so that the second high-frequency coil resonates at frequency of the high-frequency magnetic field to be irradiated, and
wherein in the third conductor to which the second driving port is connected, the second driving port is connected to both ends of one of the second capacitors.

2. The high-frequency coil unit according to claim 1, wherein values of the first capacitors are adjusted so that the (N−1) the lowest resonance frequency among resonance frequencies of the first high-frequency coil is the frequency of the high-frequency magnetic field to be irradiated, and
wherein values of the second capacitors are adjusted so that the lowest resonance frequency among resonance frequencies of the second high-frequency coil is the frequency of the high-frequency magnetic field to be irradiated.

3. A high-frequency coil unit comprising:
a shield having a transversely-cylindrical shape,
a first partial coil and a second partial coil facing each other and disposed separately, the first partial coil being disposed along an inner surface of an upper half of the shield and the second partial coil being disposed along an inner surface of a lower half of the shield; and
a high-frequency signal control unit for controlling high-frequency signals inputted into the first partial coil and the second partial coil,
wherein the first partial coil and the second partial coil each have a first high-frequency coil and a second high-frequency coil,
wherein the first high-frequency coil and the second high-frequency coil have shapes for generating linearly polarized high-frequency magnetic fields of which directions are perpendicular to each other, and
wherein the high-frequency signal control unit supplies the high-frequency signals to the first high-frequency coil and the second high-frequency coil so that a circularly polarized or elliptically polarized high-frequency magnetic field is irradiated in the inside of the shield,
wherein the first high-frequency coil of the first partial coil and the first high-frequency coil of the second partial coil each comprise:
N of linear first conductors, wherein N is a natural number,
two of arc-shaped second conductors,
at least (N−1) of first capacitors, and
a first driving port that receives supply of high-frequency signals from the high-frequency signal control unit,
wherein N of the first conductors are disposed in a predetermined curved plane so as to be substantially parallel to the central axis of the shield,
wherein two of the second conductors are disposed in planes perpendicular to the central axis, and each connect the ends of N of the first conductors,
wherein the first capacitors are disposed in the second conductor so that at least one of the first capacitor is disposed in each of parts of the second conductor between connection points with the first conductors, and values of the first capacitors are adjusted so that the first high-frequency coil resonates at frequency of the high-frequency magnetic field to be irradiated,
wherein the first driving port is connected to both ends of one of the first capacitors disposed at a position nearest to the center of the second conductor,
wherein the second high-frequency coil of the first partial coil and the second high-frequency coil of the second partial coil each comprise:
N−1 of linear third conductors,
2(N−1) of fourth conductors,
at least N of second capacitors, and
a second driving port that receives supply of high-frequency signals from the high-frequency signal control unit,
wherein the third conductors are disposed in the predetermined curved plane between the first conductors so as to be substantially parallel to the first conductors,
wherein the fourth conductors are disposed in planes perpendicular to the central axis, and connect the ends of (N−1) of the third conductors to the shield, respectively,
wherein the second driving port is connected to one of the third conductors disposed at a position nearest to the first capacitor, to both ends of which the first driving port is connected,
wherein the second capacitors are disposed in a number of at least two in the third conductor to which the second driving port is connected, and in a number of at least one in the other third conductors, values of the second capacitors are adjusted so that the second high-frequency coil resonates at frequency of the high-frequency magnetic field to be irradiated, and wherein in the third conductor to which the second driving port is connected, the second driving port is connected to both ends of one of the second capacitors.

4. The high-frequency coil unit according to claim 3,
wherein values of the first capacitors are adjusted so that the (N−1) the lowest resonance frequency among resonance frequencies of the first high-frequency coil is the frequency of the high-frequency magnetic field to be irradiated, and
wherein values of the second capacitors are adjusted so that the lowest resonance frequency among resonance frequencies of the second high-frequency coil is the frequency of the high-frequency magnetic field to be irradiated.

* * * * *